(12) United States Patent
Masunaga et al.

(10) Patent No.: US 8,632,939 B2
(45) Date of Patent: Jan. 21, 2014

(54) POLYMER, CHEMICALLY AMPLIFIED POSITIVE RESIST COMPOSITION AND PATTERN FORMING PROCESS

(75) Inventors: Keiichi Masunaga, Joetsu (JP); Satoshi Watanabe, Joetsu (JP); Jun Hatakeyama, Joetsu (JP); Youichi Ohsawa, Joetsu (JP); Daisuke Domon, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 170 days.

(21) Appl. No.: 13/035,066

(22) Filed: Feb. 25, 2011

(65) Prior Publication Data

US 2011/0212391 A1 Sep. 1, 2011

(30) Foreign Application Priority Data

Feb. 26, 2010 (JP) ................. 2010-041480

(51) Int. Cl.
```
G03F 7/004      (2006.01)
G03F 7/30       (2006.01)
C08F 220/22     (2006.01)
G03F 7/039      (2006.01)
```

(52) U.S. Cl.
CPC .............. *G03F 7/0045* (2013.01); *G03F 7/039* (2013.01); *G03F 7/0397* (2013.01); *C08F 230/22* (2013.01); *Y10S 430/106* (2013.01); *Y10S 430/111* (2013.01); *Y10S 430/122* (2013.01); *Y10S 430/123* (2013.01)
USPC ........ 430/270.1; 430/326; 430/905; 430/910; 430/921; 430/922

(58) Field of Classification Search
CPC ...... G03F 7/039; G03F 7/0397; C08F 220/22
USPC ................ 430/270.1, 905, 907, 910; 526/245
See application file for complete search history.

(56) References Cited

U.S. PATENT DOCUMENTS

| | | | |
|---|---|---|---|
| 5,415,749 A | 5/1995 | Hamilton | |
| 5,879,851 A | 3/1999 | Takahashi et al. | |
| 5,989,776 A | 11/1999 | Felter et al. | |
| 6,312,867 B1 | 11/2001 | Kinsho et al. | |
| 6,448,420 B1 | 9/2002 | Kinsho et al. | |
| 6,485,883 B2 | 11/2002 | Kodama et al. | |
| 6,746,817 B2 | 6/2004 | Takeda et al. | |
| 7,449,277 B2 | 11/2008 | Hatakeyama et al. | |
| 7,482,108 B2 | 1/2009 | Matsumaru et al. | |
| 7,501,223 B2 | 3/2009 | Takeda et al. | |
| 7,537,880 B2 | 5/2009 | Harada et al. | |
| 7,569,326 B2 | 8/2009 | Ohsawa et al. | |
| 7,598,016 B2 | 10/2009 | Kobayashi et al. | |
| 7,771,914 B2 | 8/2010 | Hatakeyama et al. | |
| 8,288,076 B2 | 10/2012 | Masunaga et al. | |
| 2004/0137369 A1* | 7/2004 | Shimada .................... | 430/281.1 |
| 2004/0260031 A1 | 12/2004 | Takeda et al. | |
| 2007/0231738 A1 | 10/2007 | Kaneko et al. | |
| 2008/0090172 A1 | 4/2008 | Hatakeyama et al. | |
| 2008/0096128 A1 | 4/2008 | Takeda et al. | |
| 2008/0096131 A1 | 4/2008 | Hatakeyama et al. | |
| 2008/0214011 A1 | 9/2008 | Colburn et al. | |
| 2008/0241736 A1 | 10/2008 | Kobayashi et al. | |
| 2008/0311507 A1 | 12/2008 | Isono et al. | |
| 2009/0233223 A1 | 9/2009 | Tachibana et al. | |
| 2009/0269696 A1 | 10/2009 | Ohsawa et al. | |
| 2009/0274978 A1 | 11/2009 | Ohashi et al. | |
| 2009/0317742 A1 | 12/2009 | Toriumi et al. | |
| 2010/0035185 A1 | 2/2010 | Hagiwara et al. | |
| 2010/0159392 A1 | 6/2010 | Hatakeyama et al. | |
| 2010/0304302 A1 | 12/2010 | Masunaga et al. | |
| 2010/0316955 A1 | 12/2010 | Masunaga et al. | |
| 2011/0212390 A1* | 9/2011 | Masunaga et al. ................. | 430/5 |
| 2011/0294070 A1 | 12/2011 | Hatakeyama et al. | |
| 2012/0108043 A1 | 5/2012 | Hatakeyama et al. | |
| 2012/0135349 A1 | 5/2012 | Hatakeyama et al. | |
| 2012/0202153 A1 | 8/2012 | Hatakeyama | |
| 2013/0029270 A1 | 1/2013 | Hatakeyama | |

FOREIGN PATENT DOCUMENTS

| | | |
|---|---|---|
| EP | 0473547 A1 | 3/1992 |
| EP | 2090931 A1 | 8/2009 |
| EP | 2112554 A2 | 10/2009 |
| JP | 4-230645 A | 8/1992 |
| JP | 9-309874 A | 12/1997 |
| JP | 2000-327633 A | 11/2000 |
| JP | 2000-336121 A | 12/2000 |
| JP | 2001-281849 A | 10/2001 |
| JP | 2001329228 A | 11/2001 |
| JP | 3429592 B2 | 7/2003 |

(Continued)

OTHER PUBLICATIONS

European Search Report dated May 30, 2011, issued in corresponding European Patent Application No. 11001592.2 (7 pages).
Guerrero, Douglas et al., "A New Generation of Bottom Anti-Reflective Coatings (BARCs): Photodefinable BARCs", Proceedings of SPIE, 2003, p. 129-135, vol. 5039.
Meador, Jim et al., "Development of 193-nm wet BARCs for implant applications", Proceedings of SPIE, 2006, p. 61532P, vol. 6153.
Brainard, Robert et al., "Shot Noise, LER and Quantam Efficiency of EUV Photoresists", Proc. of SPIE, 2004, pp. 74-85, vol. 5374.

(Continued)

*Primary Examiner* — John Chu
(74) *Attorney, Agent, or Firm* — Westerman, Hattori, Daniels & Adrian, LLP

(57) ABSTRACT

A polymer comprising recurring units having a fluorinated carboxylic acid onium salt structure on a side chain is used to formulate a chemically amplified positive resist composition. When the composition is processed by lithography to form a positive pattern, the diffusion of acid in the resist film is uniform and slow, and the pattern is improved in LER.

12 Claims, No Drawings

(56) References Cited

FOREIGN PATENT DOCUMENTS

| | | |
|---|---|---|
| JP | 2004-115630 A | 4/2004 |
| JP | 2004-175755 A | 6/2004 |
| JP | 2005-008766 A | 1/2005 |
| JP | 2005-084365 A | 3/2005 |
| JP | 2006-045311 A | 2/2006 |
| JP | 2006-169302 A | 6/2006 |
| JP | 2006-178317 A | 7/2006 |
| JP | 3865048 B2 | 1/2007 |
| JP | 2007-114728 A | 5/2007 |
| JP | 2007-297590 A | 11/2007 |
| JP | 2008-095009 A | 4/2008 |
| JP | 2008-102383 A | 5/2008 |
| JP | 2008-111103 A | 5/2008 |
| JP | 2008-122932 A | 5/2008 |
| JP | 2008-133448 A | 6/2008 |
| JP | 2008-239918 A | 10/2008 |
| JP | 2009-007327 A | 1/2009 |
| JP | 2009-019199 A | 1/2009 |
| JP | 2009237150 A | 10/2009 |
| JP | 2009-269953 A | 11/2009 |
| JP | 2010-152136 A | 7/2010 |
| WO | 2010-026973 A | 3/2010 |
| WO | 2010-119910 A1 | 10/2010 |
| WO | 2010-150917 A | 12/2010 |

OTHER PUBLICATIONS

Kishikawa, Yasuhiro et al., "Assessment of trade-off between resist resolution and sensitivity for optimization of hyper-NA immersion lithography", Proc. of SPIE, 2007, pp. 65203L1-L9, vol. 6520.

Kozawa, Takahiro et al., "Basic aspects of acid generation processes in chemically amplified resists for electron beam lithography", Proc. of SPIE, 2005, pp. 361-367, vol. 5753.

Nakano, Atsuro et al., "Deprotonation mechanism of poly(4-hydroxystyrene) and its derivative", Proc. of SPIE, 2005, pp. 1034-1039, vol. 5753.

Hutchinson, John M., "The Shot Noise Impact on Resist Roughness in EUV Lithography", Proc. of SPIE, 1998, pp. 531-536, vol. 3331.

Wang, Mingxing et al., "Novel Anionic Photoacid Generator (PAGs) and Photoresist for sub-50 nm Patterning by EUVL and EBL", Proc. of SPIE, 2007, pp. 6519F1-F6, vol. 6519.

Chae et al., "Preparation of Chemically Amplified Photoresists with N-hydroxyphthalimide Styrenesulfonate groups and Their Properties," Journal of Photopolymer Science and Technology, vol. 7, No. 1, p. 183-186, 1994.

Hinsberg et al., "Extendibility of Chemically Amplified Resists : Another Brick wall?", Proc. of SPIE, 2003, pp. 1-14, vol. 5039.

\* cited by examiner

POLYMER, CHEMICALLY AMPLIFIED POSITIVE RESIST COMPOSITION AND PATTERN FORMING PROCESS

CROSS-REFERENCE TO RELATED APPLICATION

This non-provisional application claims priority under 35 U.S.C. §119(a) on Patent Application No. 2010-041480 filed in Japan on Feb. 26, 2010, the entire contents of which are hereby incorporated by reference.

TECHNICAL FIELD

This invention generally relates to a chemically amplified positive resist composition which is sensitive to high-energy radiation such as UV, DUV, EUV, X-ray, γ-ray, synchrotron radiation, and electron beam (EB), and adapted for the microfabrication of semiconductor devices and photomasks, and a pattern forming process. More particularly, the invention relates to a novel polymer comprising recurring units having photo-reaction capability for use in the resist composition.

BACKGROUND ART

In the recent drive for higher integration of ICs, it is desired to form a finer size pattern. When resist patterns with a feature size of 0.2 µm or less are formed by lithography, chemically amplified resist compositions utilizing the catalysis of acid are most often used in order to attain a high sensitivity and resolution. Since materials used in chemically amplified resist compositions must have a certain level of transmittance to energy radiation for use in pattern exposure, a suitable one is selected from numerous materials in accordance with the wavelength of energy radiation.

As is well known in the art, chemically amplified resist compositions which are commercially implemented at the present are generally composed of two main functional components: a polymer having acidic functional groups to render the polymer soluble in alkaline developer wherein some or all acidic functional groups are protected with acid labile protective groups so that the polymer is insoluble in alkaline developer, and an acid generator capable of generating an acid upon exposure to high-energy radiation. However, in order to attain a high resolution, the activity of the acid generated by the acid generator must be controlled, and a basic compound must be added as an additional component.

Base resins comprising an aromatic skeleton are used as a main component in KrF excimer laser and EB lithography, since the aromatic skeleton has high etch resistance and a phenolic hydroxyl group serves as the adhesive group to the substrate to provide good physical properties. For the EUV on which development works are concentrated as the next generation light source, there is a strong possibility of a resin comprising an aromatic skeleton being used as the matrix material.

Of the polymers comprising an aromatic skeleton, a polymer comprising recurring units of 4-hydroxystyrene is most commonly used so far. This polymer has a phenolic hydroxyl group of weak acidity within the recurring unit while this functional group exhibits good adhesion to the substrate as well as solubility in alkaline developer. If the polymer is combined with protection of the phenolic hydroxyl group with an acid labile protective group, or with (meth)acrylic recurring units protected with an acid labile protective group, then a switch of solubility in alkaline developer can be triggered by an acid catalyst. Based on this concept, a number of polymers have been proposed. In Patent Document 1, for example, a rectangular pattern having a line width of 70 nm is formed.

On the ArF lithography using ArF excimer laser light of shorter wavelength than KrF excimer laser, development efforts were made in order to form a resist pattern of a finer size than in the KrF lithography. The eventual technology is the immersion lithography which interposes a liquid having a higher refractive index than air (e.g., water, ethylene glycol or glycerol) between the projection lens and the wafer and provides the projection lens with a numerical aperture (NA) of 1.0 or greater. Since the base resin in the resist composition used in the ArF immersion lithography must be highly transparent at the wavelength 193 nm, polymers having an alicyclic structure rather than aromatic compounds are employed as the base resin. Suitable polymers having an alicyclic structure include, for example, polyacrylic acid and derivatives thereof, norbornene-maleic anhydride alternating polymers, polynorbornene, ring-opening metathesis polymerization (ROMP) polymers, and hydrogenated ROMP polymers. These polymers are more or less effective in that resins themselves are increased in transparency (see Patent Document 2).

On the other hand, the photoacid generators have also been studied. As described in Patent Documents 1 and 2, acid generators capable of generating a low-molecular-weight sulfonic acid are generally used. Patent Document 3 discloses an acid generator capable of generating carboxylic acid having fluorinated hydrocarbon substituent. Patent Document 4 describes an acid generator capable of generating a polymer-bound sulfonic acid.

CITATION LIST

Patent Document 1: JP-A 2008-95009 (U.S. Pat. No. 7,501,223)
Patent Document 2: JP-A 2009-269953
Patent Document 3: JP-A 2001-281849
Patent Document 4: JP-A 2008-133448 (U.S. Pat. No. 7,569,326)
Patent Document 5: JP-A 2009-007327
Patent Document 6: JP-A 2008-102383 (US 2008096128)
Patent Document 7: JP-A 2004-115630
Patent Document 8: JP-A 2005-008766 (US 2004260031)

DISCLOSURE OF INVENTION

While the EB lithography is utilized in ultrafine size patterning, it is also essential in processing a photomask blank into a photomask for use in the microfabrication of semiconductor devices. Pattern writing with electron ray in the processing of photomask blanks is generally performed using an electron beam (EB) without a need for mask. In writing of positive tone resist, a portion of a resist film other than the region to be left is successively irradiated with an EB that defines a ultrafine area spot. The operation of scanning across the entire finely divided regions of the work surface takes a long time as compared with the block exposure using a photomask. The resist film is needed to have a high sensitivity in order to perform the writing step without detracting from the throughput. Since the writing time is long, there is a propensity to introduce a difference between an early written portion and a later written portion. The stability in vacuum of exposed portion with the lapse of time and a reduction of the line edge roughness (LER) associated with pattern size reduction are the critical performance requirements. Furthermore, if baking (PEB) following pattern writing entails a substantial variation of line width which largely depends on the baking temperature, such a variation is detrimental to mask processing for forming a fine size pattern. It would be desirable to have a chemically amplified resist composition featuring less temperature dependence.

It is also desired in the ArF lithography process to improve the resolution, line density dependence or optical proximity effect, and mask fidelity at fine pattern size.

Meanwhile, for the control of resist sensitivity and pattern profile as described above, a variety of improvements have been made in the selection and combination of materials used in the resist compositions and processing conditions. One of such improvements pertains to the diffusion of acid that has a significant impact on the resolution of a chemically amplified resist composition. While it is required in the lithography process that the resulting resist pattern do not change its profile depending on the duration between exposure and post-exposure bake as discussed above, the most cause of time-dependent profile change is the diffusion of acid generated upon exposure. Results largely vary depending on not only the mobility of acid, but also the strength of acid and a matching thereof with protective group. Apart from the photomask processing, this acid diffusion problem may have a significant impact on the sensitivity and resolution of general resist films.

An object of the invention is to provide a novel polymer (or polymeric acid generator) having a lower acid strength than the fluorinated alkylene-substituted sulfonic acid and sufficient shelf stability; a chemically amplified positive resist composition comprising the polymer and having the advantages of a high resolution, reduced LER, and a minimized variation of line width with changing temperature; and a patterning process using the same.

The inventors have found that when a polymer comprising recurring units of the general formula (1) shown below is used in a chemically amplified positive resist composition, it contributes to reductions of LER and temperature dependence as well as an improvement in resolution.

In one aspect, the invention provides a polymer comprising recurring units of a fluorinated carboxylic acid onium salt having the general formula (1).

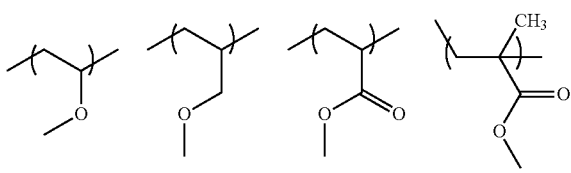

(1)

Herein $R^1$ is a structure derived from a basis skeleton capable of providing the polymerization activity of a polymerizable monomer, represented by any one of the formulae:

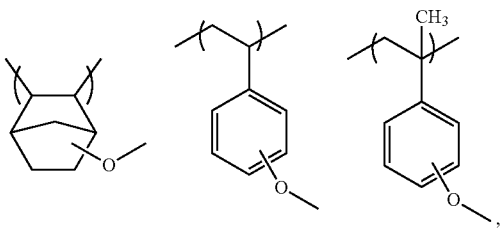

wherein the valence bond extending from the oxygen atom in the structure designates a bond to $W^1$; $R^2$ is fluorine or a fluoroalkyl group; $W^1$ is a divalent organic group; and $Q^+$ is a sulfonium cation of the general formula (a) or (b) or a iodonium cation of the general formula (c).

(a)

Herein $R^3$, $R^4$ and $R^5$ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^3$, $R^4$ and $R^5$ may bond together to form a ring with the sulfur atom.

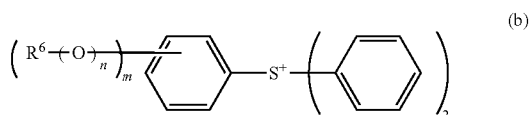

(b)

Herein $R^6$ is a substituted or unsubstituted, straight, branched or cyclic $C_1$-$C_{20}$ alkyl or alkenyl group or a substituted or unsubstituted $C_6$-$C_{14}$ aryl group, m is an integer of 1 to 5, n is 0 or 1, $R^6$ may have a carbonyl group, hydroxyl group, ester structure, lactone structure, amino group, amide group or ether-bonding oxygen atom substituted thereon.

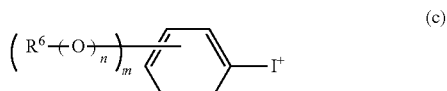

(c)

Herein $R^6$ is a substituted or unsubstituted, straight, branched or cyclic $C_1$-$C_{20}$ alkyl or alkenyl group or a substituted or unsubstituted $C_6$-$C_{14}$ aryl group, m is an integer of 1 to 5, n is 0 or 1, $R^6$ may have a carbonyl group, hydroxyl group, ester structure, lactone structure, amino group, amide group or ether-bonding oxygen atom substituted thereon.

In one preferred embodiment, the recurring units of a fluorinated carboxylic acid onium salt having the general formula (1) are recurring units of a fluorinated carboxylic acid onium salt having the general formula (2).

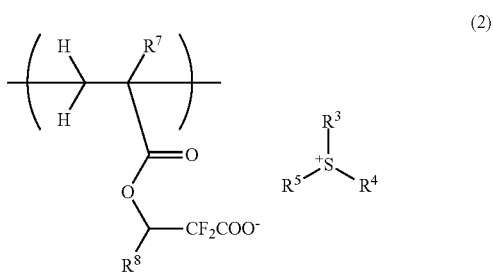

(2)

Herein $R^7$ is hydrogen or methyl, $R^8$ is hydrogen or $C_1$-$C_6$ alkyl, $R^3$, $R^4$ and $R^5$ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^3$, $R^4$ and $R^5$ may bond together to form a ring with the sulfur atom. The polymer has a weight average molecular weight of 1,000 to 50,000.

More preferably, the fluorinated carboxylic acid onium salt having the general formula (2) is triphenylsulfonium 2,2-difluoro-3-methacryloyloxypentanoate having the following formula:

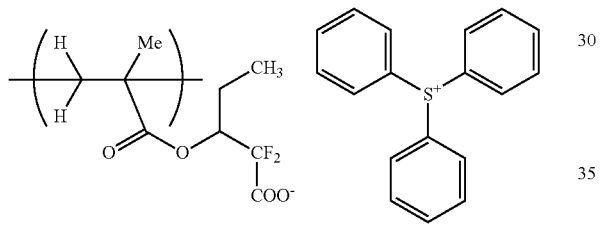

wherein Me stands for methyl.

In another preferred embodiment, the polymer may further comprise units of at least one type having a sufficient polarity to impart adhesive property to the polymer, selected from the general formulae (3) to (7).

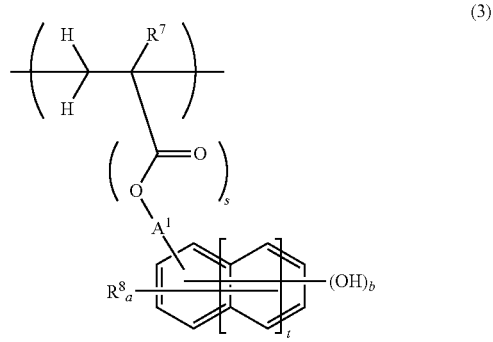

(3)

Herein $R^7$ is hydrogen or methyl, $A^1$ is a single bond or a $C_1$-$C_{10}$ alkylene group which may be separated by an ether bond, $R^8$ is each independently hydrogen or $C_1$-$C_6$ alkyl, a is an integer of 0 to 4, b is an integer of 1 to 5, s is 0 or 1, and t is an integer of 0 to 2.

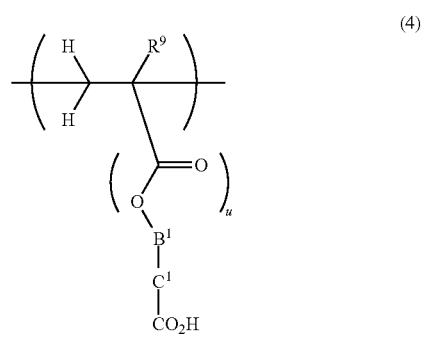

(4)

Herein $R^9$ is hydrogen, methyl or carboxymethyl, $B^1$ is a single bond or an alkylene group which may be separated by an ether bond, $C^1$ is a single bond or a $C_1$-$C_{14}$ divalent aromatic ring or divalent alicyclic structure, u is 0 or 1, with the proviso that $B^1$ and $C^1$ are not single bonds at the same time when u is 1 and that $C^1$ is a single bond or a divalent aromatic ring when u is 0 and $B^1$ is a single bond.

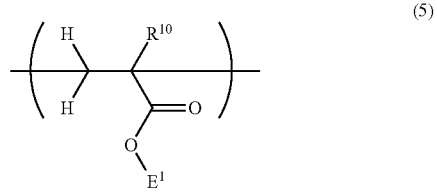

(5)

Herein $R^{10}$ is hydrogen or methyl, and $E^1$ is a $C_1$-$C_{15}$ fluoro-alcohol-containing substituent group.

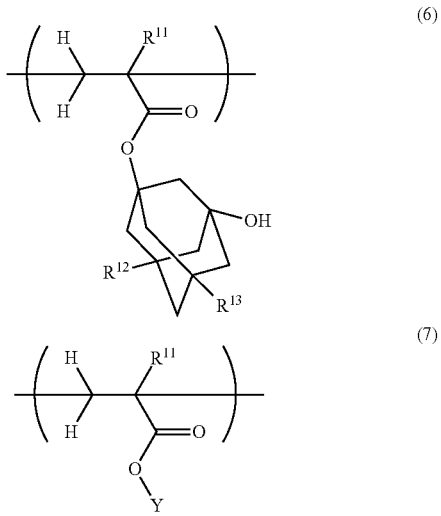

Herein $R^{11}$ is hydrogen or methyl, $R^{12}$ and $R^{13}$ are hydrogen or hydroxyl, and Y is a lactone-containing substituent group.

In a further preferred embodiment, the polymer may further comprise recurring units having an acidic functional group so that the polymer may be soluble in an aqueous alkaline developer.

In a still further preferred embodiment, the polymer may further comprise recurring units having an acidic functional group protected with a protective group which may be deprotected with an acid catalyst, the polymer being insoluble in an aqueous alkaline developer, but turning soluble therein when the protective group is deprotected with an acid catalyst. More preferably the recurring units having an acidic functional group protected with a protective group which may be deprotected with an acid catalyst have the general formula (8).

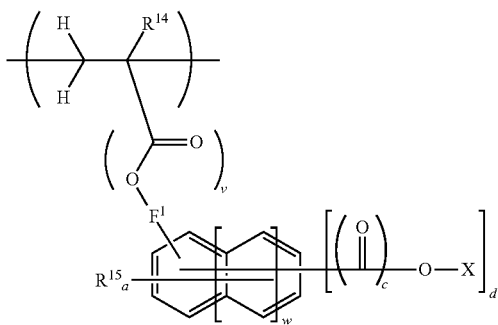

(8)

Herein $F^1$ is a single bond or a $C_1$-$C_{10}$ alkylene group which may contain an ethereal oxygen atom, $R^{14}$ is hydrogen or methyl, $R^{15}$ is each independently hydrogen or $C_1$-$C_6$ alkyl, X is an acid labile group when d is 1, X is hydrogen or an acid labile group, at least one X being an acid labile group, when d is 2 or 3, a is an integer of 0 to 4, c is 0 or 1, d is an integer of 1 to 3, v is 0 or 1, and w is an integer of 0 to 2.

Also preferably the recurring units having an acidic functional group protected with a protective group which may be deprotected with an acid catalyst have the general formula (12).

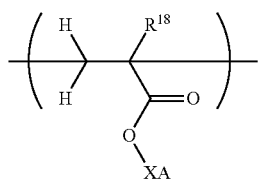

(12)

Herein $R^{18}$ is hydrogen, fluorine, methyl or trifluoromethyl, and XA is an acid labile group.

In another aspect, the invention provides a chemically amplified positive resist composition comprising the polymer defined above, and optionally an acid generator capable of generating a sulfonic acid compound upon exposure to high-energy radiation.

In a further aspect, the invention provides a process for forming a pattern, comprising the steps of applying the chemically amplified positive resist composition defined above onto a processable substrate to form a resist film, exposing the resist film to a pattern of high-energy radiation, and developing the exposed resist film with an alkaline developer to form a resist pattern. Typically the processable substrate is a photomask blank.

Advantageous Effects of Invention

A polymer comprising recurring units of a fluorinated carboxylic acid onium salt having formula (1) is used to formulate a chemically amplified positive resist composition. The composition remains stable during shelf storage. When the composition is used in a lithography process of forming a positive resist pattern which is required to have a ultrafine size, the diffusion of acid in the resist film is more uniform and lower, whereby the pattern is improved in LER and minimized in temperature dependence and substrate poisoning.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The terminology "($C_x$-$C_y$)", as applied to a particular unit, such as, for example, a chemical compound or a chemical substituent group, means having a carbon atom content of from "x" carbon atoms to "y" carbon atoms per such unit.

The acronym UV stands for ultraviolet, DUV for deep ultraviolet, EUV for extreme ultraviolet, EB for electron beam, PEB for post-exposure bake, PAG for photoacid generator, and LER for line edge roughness.

A polymer is defined as comprising recurring units having on a side chain a fluorinated carboxylic acid onium salt structure of the general formula (1).

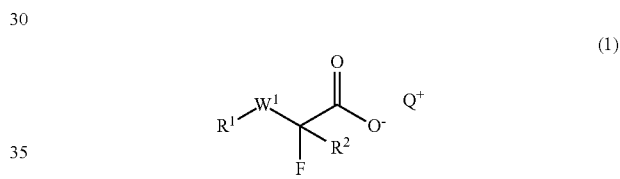

(1)

Herein $R^1$ is a structure derived from a basis skeleton capable of providing the polymerization activity of a polymerizable monomer, represented by any one of the following formulae.

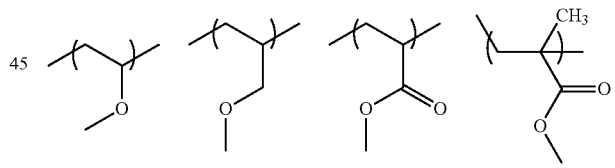

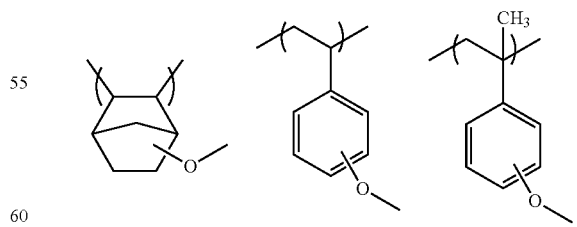

Notably the valence bond extending from the oxygen atom in the structure designates a bond to $W^1$. $R^2$ is fluorine or a fluoroalkyl group. $W^1$ is a divalent organic group. $Q^+$ is a sulfonium cation of the general formula (a) or (b) or a iodonium cation of the general formula (c).

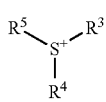
(a)

In formula (a), $R^3$, $R^4$ and $R^5$ are each independently an optionally substituted, straight or branched $C_1$-$C_{10}$ alkyl, alkenyl or oxoalkyl group or an optionally substituted $C_6$-$C_{18}$ aryl, aralkyl or aryloxoalkyl group, or any two or more of $R^3$, $R^4$ and $R^5$ may bond together to form a ring with the sulfur atom in the formula.

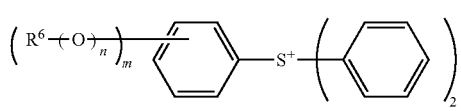
(b)

In formula (b), $R^6$ is an optionally substituted, straight, branched or cyclic $C_1$-$C_{20}$ alkyl or alkenyl group or an optionally substituted $C_6$-$C_{14}$ aryl group, m is an integer of 1 to 5, and n is 0 or 1. $R^6$ may have a carbonyl group, hydroxyl group, ester structure, lactone structure, amino group, amide group or ether-bonding oxygen atom substituted thereon.

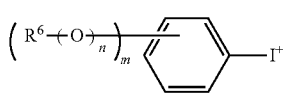
(c)

In formula (c), $R^6$ is an optionally substituted, straight, branched or cyclic $C_1$-$C_{20}$ alkyl or alkenyl group or an optionally substituted $C_6$-$C_{14}$ aryl group, m is an integer of 1 to 5, and n is 0 or 1. $R^6$ may have a carbonyl group, hydroxyl group, ester structure, lactone structure, amino group, amide group or ether-bonding oxygen atom substituted thereon.

The fluorine atom represented by F in formula (1) serves to improve the thermal stability of the sulfonium salt. Upon exposure to high-energy radiation, the sulfonium moiety is photo-degraded to generate an acidic side chain having an acidity stronger than ordinary carboxylic acids and weaker than ordinary sulfonic acids.

In formula (1), $R^1$ is a structure derived from a basis skeleton capable of providing the polymerization activity of a polymerizable monomer, i.e., a structure represented by any one of the above formulae, specifically a vinyl ether structure, allyl ether structure, acrylic acid ester structure, methacrylic acid ester structure, norbornene ether structure or styrene ether structure.

$R^2$ is fluorine or a fluoroalkyl group. The fluoroalkyl groups are preferably of 1 to 12 carbon atoms, more preferably of 1 to 3 carbon atoms. Suitable fluoroalkyl groups include, but are not limited to, trifluoromethyl, pentafluoroethyl, 2,2,2-trifluoroethyl, n-heptafluoropropyl, 2,2,3,3,3-pentafluoropropyl, 3,3,3-trifluoropropyl, and hexafluoroisopropyl. Most preferably $R^2$ is fluorine or trifluoromethyl.

$W^1$ is a single bond or a divalent organic group which links $R^1$ (which is a structure derived from a basis skeleton capable of providing the polymerization activity of a polymerizable monomer) to a carboxylate structure in which α-carbon is substituted with one or more fluorine atoms.

The divalent organic group represented by $W^1$ is an optionally substituted methylene group (—$CR^xR^y$— wherein $R^x$ and $R^y$ are each independently an organic group or hydrogen, at least one of $R^x$ and $R^y$ being an organic group), an optionally substituted divalent alicyclic hydrocarbon group, an optionally substituted divalent aromatic hydrocarbon group, an optionally substituted divalent linking group (such as heterocyclic group), or a divalent linking group comprising any one of the foregoing linking groups, bonded with at least one group selected from among linking groups including ether-bonding oxygen atom, ether-bonding sulfur atom, carbonyl, carbonyloxy, oxycarbonyl, amide, sulfonamide, urethane, and urea groups. In the divalent linking group, any number of hydrogen atoms bonded to carbon atoms may be substituted by fluorine atoms, and at least one set of divalent or multivalent constituent atoms within the linking group (inclusive of substituent group) may bond together to form a ring.

In one embodiment wherein a substituted methylene group (—$CR^xR^y$—) is selected as linking group $W^1$ or a part of $W^1$, the substituent groups $R^x$ and $R^y$ are monovalent groups of 1 to 30 carbon atoms, selected from among halo- or hydroxy-substituted or unsubstituted alkyl groups, substituted or unsubstituted alicyclic hydrocarbon groups, alkoxy groups, substituted or unsubstituted aryl groups, and substituted or unsubstituted fused polycyclic aromatic groups. These monovalent groups may contain a fluorine, oxygen, sulfur, nitrogen atom or a carbon-carbon double bond.

In each of groups $R^x$ and $R^y$, at least one set of divalent or multivalent constituent atoms may bond together to form a ring. In this case, the ring is preferably an alicyclic hydrocarbon structure. The preferred monovalent organic groups represented by $R^x$ and $R^y$ include acyclic alkyl groups of 1 to 30 carbon atoms, preferably 1 to 12 carbon atoms, such as methyl, ethyl, n-propyl, i-propyl, n-butyl, 1-methylpropyl, 2-methylpropyl, tert-butyl, n-pentyl, i-pentyl, 1,1-dimethylpropyl, 1-methylbutyl, 1,1-dimethylbutyl, n-hexyl, n-heptyl, i-hexyl, n-octyl, i-octyl, 2-ethylhexyl, n-nonyl, n-decyl, n-undecyl, and n-dodecyl. Of these, lower alkyl groups are preferred, and methyl, ethyl, n-propyl and i-propyl are most preferred.

Where substituted acyclic alkyl groups are selected as $R^x$ and $R^y$, examples include those alkyl groups in which one or more hydrogen atoms are substituted by $C_1$-$C_4$ alkoxyl, halogen, acyl, acyloxy, cyano, hydroxyl, carboxyl, alkoxycarbonyl, or nitro groups. Of these, alkyl groups having fluorine substituted thereon, i.e., fluoroalkyl groups are preferred. Especially preferred are lower fluoroalkyl groups, for example, trifluoromethyl, pentafluoroethyl, 2,2,2-trifluoroethyl, n-heptafluoropropyl 2,2,3,3,3-pentafluoropropyl, 3,3,3-trifluoropropyl, and hexafluoroisopropyl.

Where alicyclic hydrocarbon groups or alicyclic hydrocarbon groups in which at least one set of divalent or multivalent constituent atoms in each of $R^x$ and $R^y$ bond together to form a ring are selected as $R^x$ and $R^y$, exemplary groups include monocyclic and polycyclic ones, for example, monocyclo, bicyclo, tricyclo and tetracyclo structures of at least 3 carbon atoms. The number of carbon atoms in the cyclic structure preferably ranges from 3 to 30, more preferably from 3 to 25. These alicyclic hydrocarbon groups may have a substituent group or groups. Monocyclic groups are preferably of 3 to 12 member carbon atoms, more preferably 3 to 7 member carbon atoms, and preferred examples thereof include cyclopropyl, cyclobutyl, cyclopentyl, cyclohexyl, cycloheptyl, cyclooctyl, cyclodecanyl, cyclododecanyl, and 4-tert-butylcyclohexyl. Suitable polycyclic groups include those of 7 to 15 member carbon atoms, for example, adamantyl, noradamantyl, decalin residue, tricyclodecanyl, tetracyclododecanyl, norbornyl, and cedrol. The alicyclic hydrocarbon groups may be spiro-system, preferably spiro-system of 3 to 6 carbon atoms. Preferred examples include adamantyl, decalin residue, norbornyl, cedrol, cyclohexyl, cycloheptyl, cyclooctyl, cyclodecanyl, cyclododecanyl, and tricyclodecanyl. Also included are the foregoing organic groups in which one or more of ring-forming carbons are each independently substituted with $C_1$-$C_{30}$ alkyl or substituted alkyl, hydroxyl, alkoxyl, carboxyl or alkoxycarbonyl, the foregoing linking groups in which one or more hydrogen atoms are each independently substituted by $C_1$-$C_{30}$ alkyl or substituted alkyl, hydroxyl, alkoxyl, carboxyl or alkoxycarbonyl, and the foregoing monocyclic groups in which one or more hydrogen atoms are substituted by fluorine or trifluoromethyl. In conjunction with these substituted groups, the $C_1$-$C_{30}$ alkyl groups are preferably lower alkyl groups and more preferably methyl, ethyl, propyl and isopropyl; the substituent groups on the substituted alkyl group include hydroxyl, halogen, and alkoxyl; the alkoxyl groups include those of 1 to 4 carbon atoms, such as methoxy, ethoxy, propoxy and butoxy; and the alkoxycarbonyl groups include methoxycarbonyl, ethoxycarbonyl and isopropoxycarbonyl.

Where alkoxyl is selected as $R^x$ and $R^y$, typical alkoxyl groups are of 1 to 4 carbon atoms, for example, methoxy, ethoxy, propoxy and butoxy.

Where substituted or unsubstituted aryl is selected as $R^x$ and $R^y$, typical aryl groups are monocyclic groups having 6 to 14 carbon atoms in the aromatic ring, more preferably 6 to 10 ring-forming carbon atoms. Examples include phenyl, biphenyl, terphenyl, o-tolyl, m-tolyl, p-tolyl, p-hydroxyphenyl, p-methoxyphenyl, mesityl, o-cumenyl, 2,3-xylyl, 2,4-xylyl, 2,5-xylyl, 2,6-xylyl, 3,4-xylyl, 3,5-xylyl, o-fluorophenyl, m-fluorophenyl, p-fluorophenyl, o-trifluoromethylphenyl, m-trifluoromethylphenyl, p-trifluoromethylphenyl, 2,3-bistrifluoromethylphenyl, 2,4-bistrifluoromethylphenyl, 2,5-bistrifluoromethylphenyl, 2,6-bistrifluoromethylphenyl, 3,4-bistrifluoromethylphenyl, 3,5-bistrifluoromethylphenyl, p-chlorophenyl, p-bromophenyl, and p-iodophenyl. Also preferred are substituted or unsubstituted, fused polycyclic aromatic groups of up to 30 carbon atoms in the aromatic ring, for example, monovalent organic groups derived from pentalene, indene, naphthalene, azulene, heptalene, biphenylene, indacene, acenaphthylene, fluorene, phenalene, phenanthrene, anthracene, fluoracene, acephenanthrylene, aceanthrylene, triphenylene, pyrene, chrysene, naphthacene, picene, perylene, pentaphene, pentacene, tetraphenylene, hexaphene, hexacene, rubicene, coronene, trinaphthylene, heptaphene, heptacene, pyranthrene, and ovalene, by eliminating one hydrogen therefrom. Also preferred are such organic groups in which one or more hydrogen atoms are substituted by fluorine, $C_1$-$C_4$ alkyl or fluoroalkyl.

Where monocyclic or polycyclic heterocyclic groups are selected as $R^x$ and $R^y$, typical are monocyclic or polycyclic heterocyclic groups of 3 to 25 ring-forming carbon atoms, preferably 4 to 14 carbon atoms. Examples include pyridyl, furyl, thienyl, pyranyl, pyrrolyl, thianthrenyl, pyrazolyl, isothiazolyl, isooxazolyl, pyradinyl, pyrimidinyl, pyridazinyl, tetrahydropyranyl, tetrahydrofuranyl, tetrahydrothiopyranyl, tetrahydrothiofuranyl, and 3-tetrahydrothiophene-1,1-dioxide. One or more hydrogen atoms on the ring-forming carbon atoms may be substituted by alkyl, alicyclic hydrocarbon, aryl, or heterocyclic groups. Most preferably groups having a monocyclic or polycyclic ether ring or lactone ring are selected as $R^x$ and $R^y$, and examples thereof are given below.

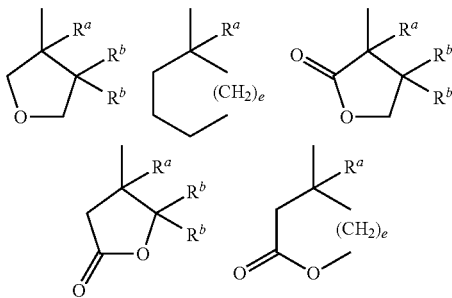

Herein $R^a$ and $R^b$ are each independently hydrogen or $C_1$-$C_4$ alkyl, and e is an integer of 2 to 4.

In another embodiment wherein a divalent alicyclic hydrocarbon group is selected as linking group $W^1$ or a part of $W^1$, it may be either monocyclic or polycyclic. Exemplary groups include monocyclo, bicyclo, tricyclo and tetracyclo structures of at least 3 carbon atoms. The number of carbon atoms in the cyclic structure preferably ranges from 3 to 30, more preferably from 3 to 25. These alicyclic hydrocarbon groups may have a substituent group or groups. Monocyclic groups are preferably of 3 to 12 member carbon atoms, more preferably 3 to 7 member carbon atoms, and preferred examples thereof include cyclopropylene, cyclobutylene, cyclopentylene, cyclohexylene, cycloheptylene, cyclooctylene, cyclodecanylene, cyclododecanylene, and 4-tert-butylcyclohexylene. Suitable polycyclic groups include those of 7 to 15 member carbon atoms, for example, adamantylene, noradamantylene, divalent decalin residue, tricyclodecanylene, tetraclydodecanylene, norbornylene, and divalent cedrol residue. The alicyclic hydrocarbon groups may be of spiro-system, preferably spiro-system of 3 to 6 carbon atoms. Also included are the foregoing organic groups in which one or more of ring-forming carbons are each independently substituted with $C_1$-$C_{30}$ alkyl or substituted alkyl, hydroxyl, alkoxyl, carboxyl or alkoxycarbonyl, and the foregoing linking groups in which one or more hydrogen atoms are each independently substituted by $C_1$-$C_{30}$ alkyl or substituted alkyl, hydroxyl, alkoxyl, carboxyl or alkoxycarbonyl. In conjunction with these substituted groups, the $C_1$-$C_{30}$ alkyl groups are preferably lower alkyl groups and more preferably methyl, ethyl, propyl and isopropyl; the substituent groups on the substituted alkyl group include hydroxyl, halogen, and alkoxyl; the alkoxyl groups include those of 1 to 4 carbon atoms, such as methoxy, ethoxy, propoxy and butoxy; and the alkoxycarbonyl groups include methoxycarbonyl, ethoxycarbonyl and isopropoxycarbonyl.

In a further embodiment wherein a divalent aromatic hydrocarbon group is selected as linking group $W^1$ or a part of $W^1$, monocyclic or polycyclic aromatic groups of 6 to 30 carbon atoms are typical. Monocyclic groups are preferably of 6 to 14 member carbon atoms, more preferably 6 to 10 member carbon atoms, and preferred examples thereof include divalent groups derived from benzene, biphenyl, terphenyl, toluene, phenol, anisole, mesitylene, cumene, 2,3-xylylene, 2,4-xylene, 2,5-xylene, 2,6-xylene, 3,4-xylene, 3,5-xylene, fluorobenzene, trifluoromethylbenzene, o-bistrifluoromethylbenzene, m-bistrifluoromethylbenzene, p-bistrifluoromethylbenzene, chlorobenzene, bromobenzene, and iodobenzene, by eliminating two hydrogen atoms therefrom. Fused polycyclic aromatic groups may be substituted or unsubstituted, and preferably of 8 to 30 carbon atoms, and preferred examples thereof include divalent groups derived from pentalene, indene, naphthalene, azulene, heptalene, biphenylene, indacene, acenaphthylene, fluorene, phenalene, phenanthrene, anthracene, fluoracene, acephenanthrylene, aceanthrylene, triphenylene, pyrene, chrysene, naphthacene, picene, perylene, pentaphene, pentacene, tetraphenylene, hexaphene, hexacene, rubicene, coronene, trinaphthylene, heptaphene, heptacene, pyranthrene, and ovalene, by eliminating two hydrogen atoms therefrom. Also preferred are such organic groups in which one or more hydrogen atoms are substituted by fluorine, $C_1$-$C_4$ alkyl or fluoroalkyl.

In a further embodiment wherein a heterocyclic group is selected as linking group $W^1$ or a part of $W^1$, monocyclic or polycyclic heterocyclic groups of 3 to 25 ring-forming carbon atoms, preferably 4 to 14 carbon atoms are typical. The heterocyclic groups may be of aromatic or non-aromatic ring, and examples include divalent organic groups derived from pyridine, furan, thienine, pyranine, pyrroline, thianthrene, pyrazone, isothiazone, isooxazone, pyrazine, pyrimidine, pyridazine, tetrahydropyranine, tetrahydrofuranine, tetrahydrothiopyranine, and tetrahydrothiofuran, by eliminating two hydrogen atoms therefrom, as well as the foregoing groups in which one or more hydrogen atoms on the ring-forming carbon atoms are substituted by alkyl (preferably lower alkyl), alicyclic hydrocarbon, aryl or heterocyclic groups. Of these, monocyclic or polycyclic ether rings are preferred, examples of which are shown below.

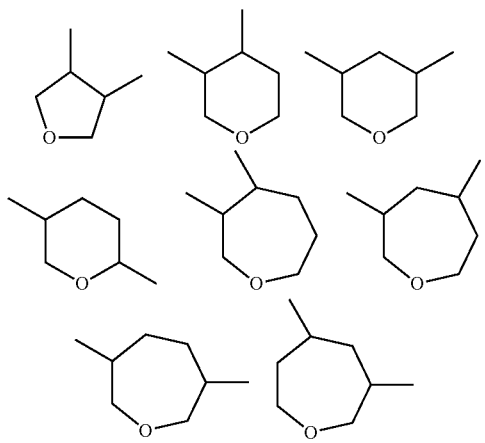

Further the linking group $W^1$ may be a combination of divalent groups illustrated above. It may also be a divalent linking group comprising any one of the foregoing linking groups, bonded with at least one group selected from among linking groups including ether-bonding oxygen atom, ether-bonding sulfur atom, carbonyl, ester, oxycarbonyl, amide, sulfonamide, urethane, and urea groups. Examples of the divalent linking group are shown below wherein O and C represent oxygen and carbon atoms, each adjoining a substituted methylene group, respectively.

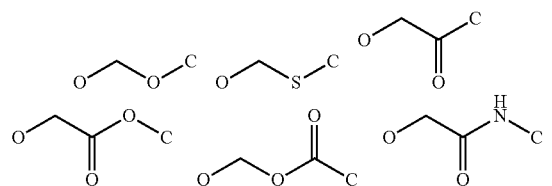

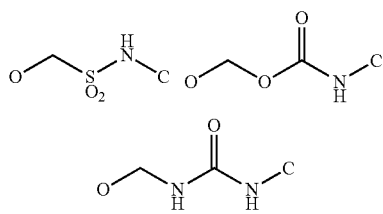

The most preferred linking group $W^1$ is a substituted methylene group: —$CR^xR^y$— wherein $R^x$ and $R^y$ may be the same or different and one of $R^x$ and $R^y$ may be hydrogen. Preferred examples of the substituted methylene group are shown below wherein O and C represent oxygen and carbon atoms, each adjoining the substituted methylene group, respectively.

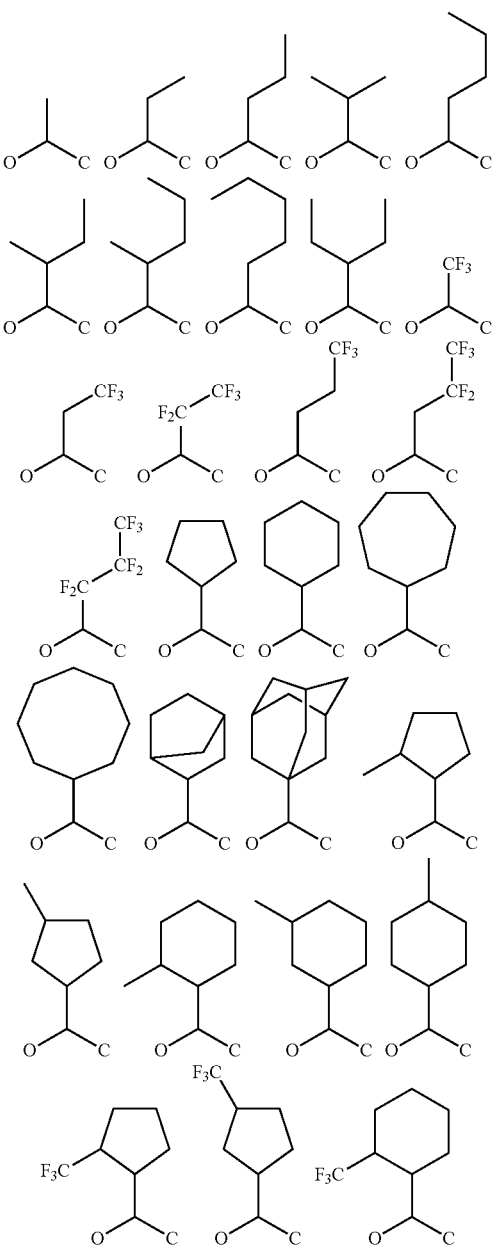

-continued

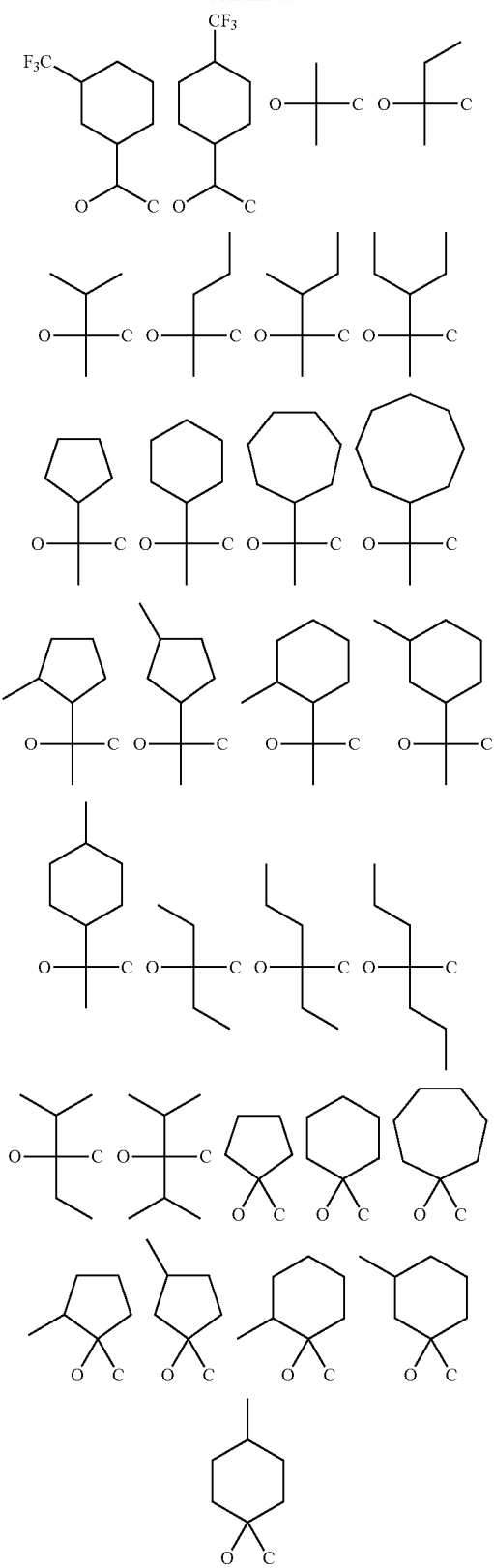

In formula (1), $Q^+$ is a sulfonium cation of the general formula (a) or (b) or a iodonium cation of the general formula (c). It is a counter cation to the carboxylate anion structure.

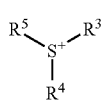

(a)

In formula (a), $R^3$, $R^4$ and $R^5$ are each independently an optionally substituted, straight or branched $C_1$-$C_{10}$ alkyl, alkenyl or oxoalkyl group or an optionally substituted $C_6$-$C_{18}$ aryl, aralkyl or aryloxoalkyl group, or any two or more of $R^3$, $R^4$ and $R^5$ may bond together to form a ring with the sulfur atom in the formula.

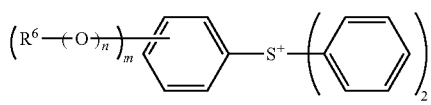

(b)

In formula (b), $R^6$ is an optionally substituted, straight, branched or cyclic $C_1$-$C_{20}$ alkyl or alkenyl group or an optionally substituted $C_6$-$C_{14}$ aryl group, m is an integer of 1 to 5, and n is 0 or 1. $R^6$ may have a carbonyl group, hydroxyl group, ester structure, lactone structure, amino group, amide group or ether-bonding oxygen atom substituted thereon.

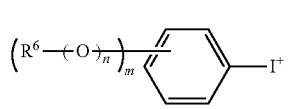

(c)

In formula (c), $R^6$ is an optionally substituted, straight, branched or cyclic $C_1$-$C_{20}$ alkyl or alkenyl group or an optionally substituted $C_6$-$C_{14}$ aryl group, m is an integer of 1 to 5, and n is 0 or 1. $R^6$ may have a carbonyl group, hydroxyl group, ester structure, lactone structure, amino group, amide group or ether-bonding oxygen atom substituted thereon.

In formulae (a) to (c), groups $R^3$ to $R^6$ may have a substituent group as mentioned above. Preferred substituent groups include a hydroxyl group, amino group, ester structure, lactone structure, amide group, alkyl group separated by an ether-bonding oxygen atom, and aryl group.

Upon exposure to high-energy radiation, $Q^+$ forms a neutral compound with proton via rearrangement of aromatic ring. The fluorine atom represented by F in formula (1) serves to improve the thermal stability of the onium salt. Upon exposure to high-energy radiation, the sulfonium moiety is photo-degraded to generate an acidic side chain having an acidity stronger than ordinary carboxylic acids and weaker than ordinary sulfonic acids.

Sulfonium Cation of Formula (a)

In formula (a), $R^3$, $R^4$ and $R^5$ are each independently an optionally substituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^3$, $R^4$ and $R^5$ may bond together to form a ring with the sulfur atom. Suitable alkyl groups include methyl, ethyl, n-propyl, isopropyl, cyclopropyl, n-butyl, sec-butyl, isobutyl, tert-butyl, n-pentyl, cyclopentyl, n-hexyl, n-heptyl, 2-ethylhexyl, cyclohexyl, cycloheptyl, 4-methylcyclohexyl, cyclohexylmethyl, n-octyl, n-decyl, 1-adamantyl, 2-adamantyl, bicyclo[2.2.1]hepten-2-yl, 1-adamantanemethyl, and 2-adamantanemethyl. Suitable alkenyl groups include vinyl, allyl, propenyl, butenyl, hexenyl, and cyclohexenyl. Suitable oxoalkyl groups include 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include phenyl, naphthyl, thienyl, alkoxyphenyl groups such as p-methoxyphenyl, m-methoxyphenyl, o-methoxyphenyl, p-ethoxyphenyl, p-tert-butoxyphenyl, m-tert-butoxyphenyl, alkylphenyl groups such as 2-methylphenyl, 3-methylphenyl, 4-methylphenyl and ethylphenyl, alkylnaphthyl groups such as methylnaphthyl and ethylnaphthyl, dialkylnaphthyl groups such as diethylnaphthyl, and dialkoxynaphthyl groups such as dimethoxynaphthyl and diethoxynaphthyl. Suitable aralkyl groups include benzyl, 1-phenylethyl and 2-phenylethyl. Suitable aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. When any two or more of $R^3$, $R^4$ and $R^5$ bond together to form a cyclic structure with the sulfur atom, typical ring-forming groups are 1,4-butylene and 3-oxa-1,5-pentylene. Exemplary cyclic structures are of the following formulae wherein the broken line designates the remaining one substituent group of $R^3$, $R^4$ and $R^5$.

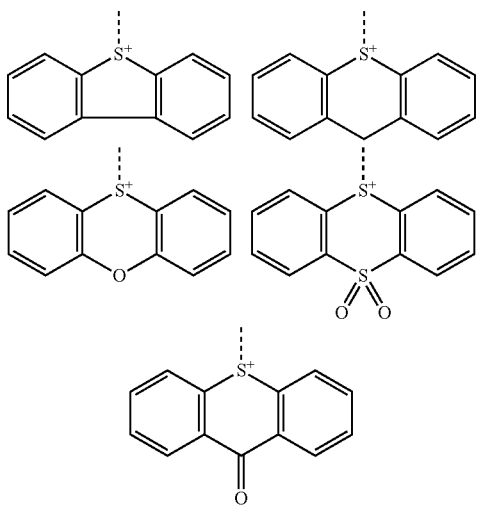

Also included are aryl groups having a polymerizable substituent group such as acryloyloxy or methacryloyloxy, for example, 4-(acryloyloxy)phenyl, 4-(methacryloyloxy)phenyl, 4-vinyloxyphenyl, and 4-vinylphenyl.

Illustrative examples of the sulfonium cation of formula (a) include triphenylsulfonium,
(4-tert-butylphenyl)diphenylsulfonium,
bis(4-tert-butylphenyl)phenylsulfonium,
tris(4-tert-butylphenyl)sulfonium,
(3-tert-butylphenyl)diphenylsulfonium,
bis(3-tert-butylphenyl)phenylsulfonium,
tris(3-tert-butylphenyl)sulfonium,
(3,4-di-tert-butylphenyl)diphenylsulfonium,
bis(3,4-di-tert-butylphenyl)phenylsulfonium,
tris(3,4-di-tert-butylphenyl)sulfonium,
(4-tert-butoxyphenyl)diphenylsulfonium,
bis(4-tert-butoxyphenyl)phenylsulfonium,
tris(4-tert-butoxyphenyl)sulfonium,
(3-tert-butoxyphenyl)diphenylsulfonium,
bis(3-tert-butoxyphenyl)phenylsulfonium,
tris(3-tert-butoxyphenyl)sulfonium,
(3,4-di-tert-butoxyphenyl)diphenylsulfonium,
bis(3,4-di-tert-butoxyphenyl)phenylsulfonium,
tris(3,4-di-tert-butoxyphenyl)sulfonium,
diphenyl(4-thiophenoxyphenyl)sulfonium,
(4-tert-butoxycarbonylmethyloxyphenyl)diphenylsulfonium,
tris(4-tert-butoxycarbonylmethyloxyphenyl)sulfonium,
(4-tert-butoxyphenyl)bis(4-dimethylaminophenyl)sulfonium,
tris(4-dimethylaminophenyl)sulfonium,
2-naphthyldiphenylsulfonium, dimethyl(2-naphthyl)sulfonium,
(4-hydroxyphenyl)dimethylsulfonium,
(4-methoxyphenyl)dimethylsulfonium, trimethylsulfonium,
(2-oxocyclohexyl)cyclohexylmethylsulfonium,
trinaphthylsulfonium, tribenzylsulfonium,
diphenylmethylsulfonium, dimethylphenylsulfonium,
2-oxo-2-phenylethylthiacyclopentanium,
diphenyl-2-thienylsulfonium,
4-n-butoxynaphthyl-1-thiacyclopentanium,
2-n-butoxynaphthyl-1-thiacyclopentanium,
4-methoxynaphthyl-1-thiacyclopentanium, and
2-methoxynaphthyl-1-thiacyclopentanium.

Preferred cations are triphenylsulfonium,
(4-tert-butylphenyl)diphenylsulfonium,
(4-tert-butoxyphenyl)diphenylsulfonium,
tris(4-tert-butylphenyl)sulfonium,
(4-tert-butoxycarbonylmethyloxyphenyl)diphenylsulfonium,
5-phenyldibenzothiophenium,
5-(4-hydroxyphenyl)dibenzothiophenium,
5-(4-methylphenyl)dibenzothiophenium,
5-(4-t-butylphenyl)dibenzothiophenium,
10-phenylphenoxathiinium,
10-(4-hydroxyphenyl)phenoxathiinium, and
10-(4-tert-butoxyphenyl)phenoxathiinium,
as well as sulfonium cations of the structure shown below.

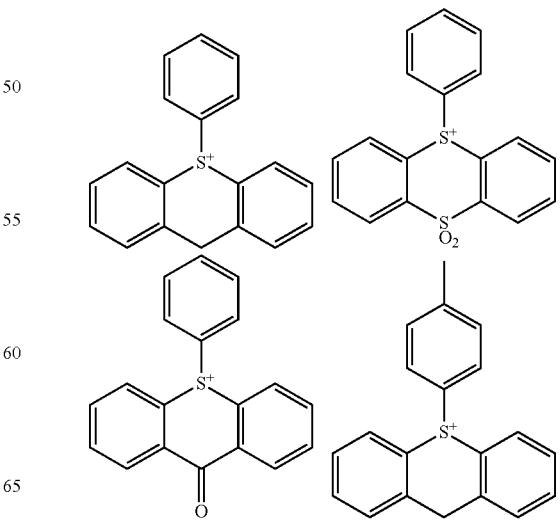

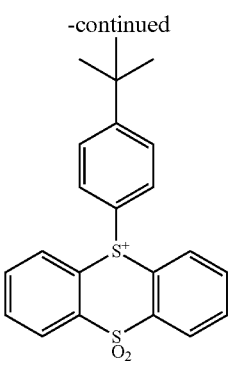

Also included are
4-(methacryloyloxy)phenyldiphenylsulfonium,
4-(acryloyloxy)phenyldiphenylsulfonium,
4-(methacryloyloxy)phenyldimethylsulfonium, and
4-(acryloyloxy)phenyldimethylsulfonium. With respect to the polymerizable sulfonium cations, reference may be made to JP-A H04-230645 and JP-A 2005-84365.

Sulfonium Cation of Formula (b)

In formula (b), the substitution position of $R^6$—$(O)_n$—group wherein n is 0 or 1 is not particularly limited, but is preferably 4- or 3-position on the phenyl group, and more preferably 4-position. Examples of groups represented by $R^6$ include methyl, ethyl, n-propyl, sec-propyl, cyclopropyl, n-butyl, sec-butyl, isobutyl, tert-butyl, n-pentyl, cyclopentyl, n-hexyl, cyclohexyl, n-octyl, n-decyl, n-dodecyl, 1-adamantyl, 2-adamantyl, bicyclo[2.2.1]hepten-2-yl, phenyl, 4-methoxyphenyl, 4-tert-butylphenyl, 4-biphenyl, 1-naphthyl, 2-naphthyl, 10-anthranyl, and 2-furanyl. In the case of n=1, acryloyl, methacryloyl, vinyl, and allyl are exemplary of $R^6$.

Illustrative examples of the sulfonium cation of formula (b) include (4-methylphenyl)diphenylsulfonium,
(4-ethylphenyl)diphenylsulfonium,
(4-cyclohexylphenyl)diphenylsulfonium,
(4-n-hexylphenyl)diphenylsulfonium,
(4-n-octylphenyl)diphenylsulfonium,
(4-methoxyphenyl)diphenylsulfonium,
(4-ethoxyphenyl)diphenylsulfonium,
(4-tert-butoxyphenyl)diphenylsulfonium,
(4-cyclohexyloxyphenyl)diphenylsulfonium,
(4-trifluoromethylphenyl)diphenylsulfonium,
(4-trifluoromethyloxyphenyl)diphenylsulfonium, and
(4-tert-butoxycarbonylmethyloxyphenyl)diphenylsulfonium.

Iodonium Cation of Formula (c)

In formula (c), the substitution position of $R^6$—$(O)_n$—group wherein n is 0 or 1 is not particularly limited, but is preferably 4- or 3-position on the phenyl group, and more preferably 4-position. Examples of groups represented by $R^6$ are as exemplified for $R^6$ in formula (b).

Illustrative examples of the iodonium cation of formula (c) include bis(4-methylphenyl)iodonium,
bis(4-ethylphenyl)iodonium, bis(4-tert-butylphenyl)iodonium,
bis(4-(1,1-dimethylpropyl)phenyl)iodonium,
(4-methoxyphenyl)phenyliodonium,
(4-tert-butoxyphenyl)phenyliodonium,
(4-acryloyloxyphenyl)phenyliodonium, and
(4-methacryloyloxyphenyl)phenyliodonium,
with the bis(4-tert-butylphenyl)iodonium being preferred.

With respect to polymerization reaction using a monomer having a polymerization active basis skeleton providing the structure $R^1$, many processes for the synthesis of polymers for use in chemically amplified resist compositions are known in the art. Monomers having an acrylate or methacrylate structure are preferred because polymers are readily obtainable therefrom.

In a preferred embodiment, the recurring units of formula (1) of which the inventive polymer is composed are recurring units of a fluorinated carboxylic acid onium salt having the general formula (2).

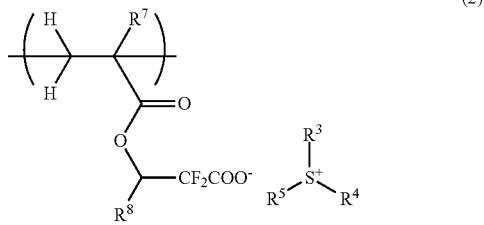

(2)

Herein $R^7$ is hydrogen or methyl; $R^8$ is hydrogen or $C_1$-$C_6$ alkyl; $R^3$, $R^4$ and $R^5$ are each independently an optionally substituted, straight or branched $C_1$-$C_{10}$ alkyl, alkenyl or oxoalkyl group or an optionally substituted $C_6$-$C_{18}$ aryl, aralkyl or aryloxoalkyl group, or any two or more of $R^3$, $R^4$ and $R^5$ may bond together to form a ring with the sulfur atom.

In formula (2), $R^7$ is hydrogen or methyl. $R^8$ is hydrogen or a $C_1$-$C_6$ alkyl group which is typically selected from among methyl, ethyl, propyl, butyl, pentyl, hexyl, cyclopentyl, cyclohexyl and structural isomers thereof. As the sulfonium cation moiety consisting of $R^3$, $R^4$, $R^5$ and sulfur, any of numerous sulfonium salts well known for use as acid generators in resist compositions may generally be used. Some preferred examples will be enumerated in the list of exemplary acid generators described later.

Upon exposure to high-energy radiation, typically UV, DUV such as KrF and ArF excimer laser radiation, EUV, or EB, a polymer comprising recurring units of formula (1) functions such that the sulfonium structure is degraded to produce a neutral compound and a polymer-bound carboxylic acid which is fluorinated at α-carbon and has a relatively high acid strength. Then the polymer can be used as a photosensitive resin and a polymer-bound fluorinated carboxylic acid precursor as well as a photosensitive acid generator such that the acid generated therefrom may cause deprotection reaction of an acid labile protective group having a low level of activation energy such as acetal.

It is noted that a monomer which provides the recurring units of formula (1) via polymerization is an onium salt of a fluorinated carboxylic acid derivative as mentioned above. Since various methods are already known for the synthesis of fluorinated carboxylic acids and onium salts, the monomer can be obtained by combining these methods. For example, a method for the synthesis of an acrylic acid derivative having a fluorocarboxylic acid pendant is disclosed in JP-A 2009-19199 wherein an ethyl ester form of fluorinated carboxylic acid is hydrolyzed into a carboxylic acid under mild hydrolysis conditions. Also, a method for the synthesis of a new sulfonium salt from a starting sulfonium salt via salt exchange is disclosed in JP-A H09-309874 wherein salt exchange takes place between sulfonium chloride or bromide and the sodium or potassium salt of sulfonic acid. With these teachings borne in mind, the relevant monomer can be prepared by using a monomer having a fluorinated carboxylic acid pendant, converting it into an alkali metal salt, and effecting salt exchange between the alkali metal salt and a sulfonium salt having the desired structure.

The most simple use of the polymer comprising recurring units of formula (1) is a photosensitive resin. For example, a single polymer comprising recurring units of formula (1) is used to form a resin layer. The resin layer is exposed to a pattern of UV, whereupon a highly hydrophilic fluorinated carboxylic acid derivative pendant is available from the recurring unit of formula (1) in the exposed region. If the exposure is of sufficient dose, only the exposed region is made water-soluble. Subsequent development in water results in a resin pattern corresponding to the exposure pattern.

First Resist Composition

A more advantageous use of the polymer comprising recurring units of formula (1) is an acid generator in a chemically amplified resist composition for the microfabrication of semiconductor devices and the like. This composition is designated "first resist composition" as one embodiment of the invention. An acid generator capable of generating sulfonic acid is already known from Patent Document 4, for example, as the acid generator capable of generating a polymer-bound strong acidic functional group for use in chemically amplified resist compositions, but an acid generator capable of generating a weaker acid and having high thermal stability is not known. On the other hand, a few examples of the acid generator capable of generating a polymer-unbound fluorinated carboxylic acid derivative are found in Patent Document 3, for example, but a polymer capable of generating a fluorinated carboxylic acid featuring the controlled mobility of an acidic functional group as in the invention is not known. Of acetal protective groups commonly used in resist compositions, an acetal protective group in which the substituent group on the carbon between two oxygen atoms in the acetal structure is a primary alkyl group may have the problem that the process dependence changes too largely because of the low activation energy of deprotection reaction. When such an acid generator capable of generating a non-volatile acid slightly weaker than sulfonic acid is combined with a protective group having a low level of activation energy, the acid generator itself is useful as a material having controlled diffusibility.

When a polymer comprising recurring units of formula (1) is added as the acid generator to a chemically amplified positive resist composition, the recurring units of formula (1) make a least contribution toward the adhesion to the substrate on which a resist pattern is to be formed. When the polymer comprising recurring units of formula (1) is used in admixture with a polymer free of recurring units of formula (1), a compatibility between the polymers must be insured. For these reasons, the polymer comprising recurring units of formula (1) should preferably further comprise recurring units for providing substrate adhesion.

Specifically, preferred examples of the adhesion-promoting recurring units to be copolymerized with recurring units of formula (1) include (i) recurring units having a phenolic hydroxyl group on a side chain, represented by the general formula (3):

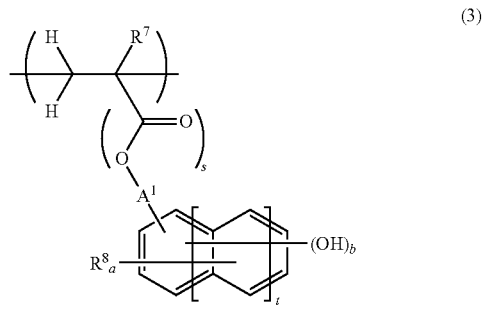

wherein $R^7$ is hydrogen or methyl, $A^1$ is a single bond or a $C_1$-$C_{10}$ alkylene group which may be separated by an ether bond, $R^8$ is each independently hydrogen or $C_1$-$C_6$ alkyl, a is an integer of 0 to 4, b is an integer of 1 to 5, s is 0 or 1, and t is an integer of 0 to 2;

(ii) recurring units having a carboxylic acid side chain, represented by the general formula (4):

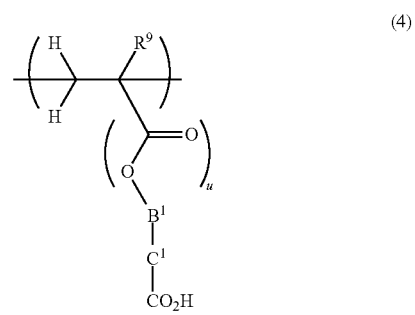

wherein $R^9$ is hydrogen, methyl or carboxymethyl, $B^1$ is a single bond or an alkylene group which may be separated by an ether bond, $C^1$ is a single bond or a $C_1$-$C_{14}$ divalent aromatic ring or divalent alicyclic structure, u is 0 or 1, with the proviso that $B^1$ and $C^1$ are not single bonds at the same time and that $C^1$ is a single bond or a divalent aromatic ring when u is 0 and $B^1$ is a single bond;

(iii) recurring units having a fluoroalcohol-containing substituent group in which at least one carbon atom bonded to the carbon atom having hydroxyl bonded thereto is substituted with at least two fluorine atoms, in total, so that the hydroxyl group may exhibit high polarity, represented by the general formula (5):

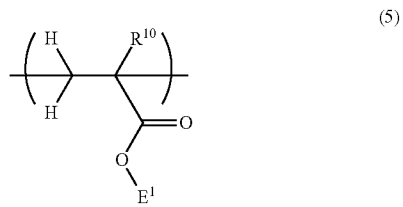

wherein $R^{10}$ is hydrogen or methyl, and $E^1$ is a $C_1$-$C_{15}$ fluoroalcohol-containing substituent group; and (iv) hydroxyl-containing recurring units represented by the general formula (6) and (v) lactone-containing recurring units represented by the general formula (7):

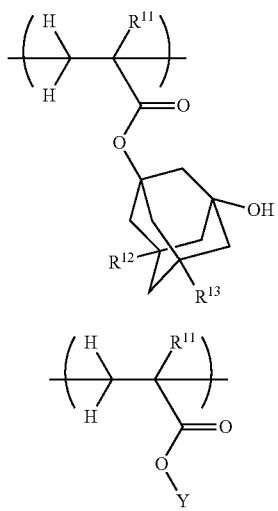

(6)

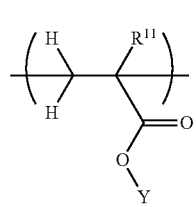

(7)

wherein $R^{11}$ is hydrogen or methyl, $R^{12}$ and $R^{13}$ are hydrogen or hydroxyl, and Y is a lactone-containing substituent group.

With respect to these units, a number of polymers are known in the art including the polymers developed for use in resist compositions for KrF excimer laser lithography and EB lithography and the polymers developed for use in resist compositions for ArF excimer laser lithography. Any well-known polymers may be used herein while preferred polymers will be described later.

The necessary amount of recurring units of formulae (3) to (7) to provide the polymer with adhesive property should be determined in accordance with structural factors including the fat solubility of particular recurring units used. The amount may also be selected over a wide range depending on whether the polymers are used alone or in admixture. Typically, the polymer design is devised such that the total amount of recurring units of formulae (3) to (7) may account for at least 30 mol % of the overall recurring units of the polymer, whereby the desired adhesion is available. Another consideration to be taken in determining a compositional ratio of recurring units is a solubility in the developer to be described later. For example, it is sometimes undesirable to use recurring units of formula (4) alone. Also, the upper limit must be determined by taking into account units for providing another function. When different type polymers are used in admixture, the polymer added in a smaller amount may comprise at most 99 mol % of adhesion-promoting units. The overall adjustment of polymer will be described later.

In the designing of recurring units of the polymer, it is desired for preventing any residues from remaining after development that the polymer be soluble in alkaline developer during development. Then the polymer comprising recurring units of formula (1) should preferably be either a polymer that is soluble in alkaline developer or a polymer that is insoluble in alkaline developer, but has an acidic functional group protected with a protective group which may be deprotected with an acid catalyst so that the polymer may become soluble in alkaline developer after the acid catalyzed reaction. In order that a polymer comprising an acrylic acid derivative like recurring units of formula (1) be soluble in alkaline developer, recurring units having a water-soluble side chain like polyoxyalkylene side chain or recurring units having an acidic functional group are copolymerized as the recurring units other than the recurring units of formula (1), whereby the polymer becomes alkali soluble. Of these units, use of recurring units having an acidic functional group is preferred for the additional design for etch resistance and solubility change. A number of examples are already known as the recurring units having an acidic functional group. For example, recurring units of formulae (3), (4) and (5), mentioned above as the adhesion-promoting units, or recurring units having an acidic functional group protected with an acid labile protective group are preferably copolymerized. Preferred examples of the recurring units having an acidic functional group protected with an acid labile protective group will be described later.

First described is the polymer that is soluble in alkaline developer. In the design of this polymer, adjustment should be made depending on structural factors including the fat solubility of particular recurring units used. Typically, a polymer comprising, in combination, recurring units of formula (1) and acidic recurring units of formulae (3) to (5) becomes soluble in alkaline developer if the amount of recurring units of formula (1) is up to 70 mol % based on the overall recurring units of the polymer. The polymer comprising recurring units of formula (1) and recurring units of formula (3) or (5) may further comprise non-acidic recurring units other than the recurring units of formula (1) as long as the amount of recurring units of formula (3) or (5) is at least 30 mol %, preferably at least 40 mol % based on the overall recurring units of the polymer. On the other hand, since the recurring units of formula (4) have a higher acidity than the recurring units of formula (3) or (5), the polymer comprising recurring units of formula (1) and recurring units of formula (4) becomes soluble in alkaline developer if the amount of recurring units of formula (4) is at least 15 mol % based on the overall recurring units of the polymer. Note that the non-acidic recurring units which can be advantageously used herein will be described later.

Next described is the polymer comprising recurring units of formula (1) that is insoluble in alkaline developer, but has an acidic functional group protected with a protective group which can be deprotected with an acid catalyst so that the polymer may become soluble in alkaline developer after the acid catalyzed reaction. In the design of this polymer, recurring units of formulae (3) to (5) may be incorporated into the polymer such that some or all recurring units are protected with a protective group which can be deprotected with an acid catalyst, as long as alkaline solubility is available. In this regard, acetal is the preferred protective group which ensures that sufficient deprotection reaction takes place under the catalysis of fluorinated carboxylic acid generated from the recurring unit of formula (1). The acetal used as the protective group will be described later.

As is well known in the art, a chemically amplified positive resist composition essentially comprises a base polymer which is insoluble in alkaline developer, but becomes alkali soluble via acid catalyzed reaction and an acid generator which generates an acid upon exposure to high-energy radiation. When a polymer comprising recurring units of formula (1) is contained as the acid generator in the chemically amplified positive resist composition, the polymer comprising recurring units of formula (1) may be only a part or the entirety of the base polymer.

In an embodiment wherein only a single polymer comprising recurring units of formula (1) is used as the base polymer, the amount of recurring units of formula (1) is preferably 1 to 20 mol % based on the overall recurring units of the base polymer. If the amount of recurring units of formula (1) is less than 1 mol %, a necessary sensitivity may not be available sometimes. An amount of recurring units (1) in excess of 20 mol % can be a cause of pattern stripping. The base polymer may comprise other constituent units including units having an acidic functional group protected with a protective group which can be deprotected with acid catalyst and substrate adhesion-providing units, optionally in combination with solubility-controlling units and etch resistance-providing units. Illustrative examples of these units will be described later. A polymeric composition capable of forming a satisfactory pattern is available when the amount of substrate adhesion-providing units is 30 to 80 mol %, and the amount of units having an acidic functional group protected with a protective group which can be deprotected with acid catalyst is 2 to 50 mol %, more preferably 5 to 45 mol %, based on the overall recurring units of the base polymer.

In another case, plural polymers comprising recurring units having formula (1) are used as the base polymer, or a polymer comprising recurring units having formula (1) is used in combination with any of well-known polymers free of recurring units having formula (1) commonly used in chemically amplified positive resist compositions. In this case, the polymer design may be made to provide an overall balance of the base polymer. Specifically, the content of recurring units of formula (1) is preferably 1 to 20 mol % based on the overall recurring units of the base polymer, as in the single polymer. Also, since the content of recurring units of formula (1) in the single polymer is from 0 mol % (absent) to 70 mol % as described above, polymers are preferably combined in such a mixing ratio that the content of recurring units of formula (1) may fall in the above-defined range of 1 to 20 mol % based on the polymers combined. The contents of other recurring units are similarly adjusted. Specifically, the content of recurring units having a certain function is adjusted so as to fall in an appropriate range based on the overall base polymer, whereas individual polymers are designed so as to ensure a solubility in alkaline developer by setting the total amount of recurring units having an acidic functional group and acidic functional groups protected with a protective group to a value of at least 10 mol % of the overall recurring units of the individual polymer. With respect to the recurring units which can be used herein, their description will be given later although a number of examples are known.

While the chemically amplified resist composition comprising a polymer comprising recurring units of formula (1) as the acid generator is generally completed by combining the polymer serving as a base polymer with an organic solvent, any well-known additives such as a basic compound and a surfactant may be added for fine adjustment of physical properties of the composition.

Second Resist Composition

If sulfonic acid is present in proximity to the recurring unit of formula (1), an exchange takes place between hydrogen of sulfonic acid and a sulfonium cation, forming a polymer having a sulfonic acid-sulfonium salt and an α-fluorinated carboxylic acid side chain. In a second embodiment, a polymer comprising recurring units of formula (1) is added to a positive resist composition comprising a positive resist-forming polymer of the type wherein an acidic functional group is protected with a protective group having a higher level of activation energy than an acetal group in which the substituent group on the carbon between two oxygen atoms is a primary alkyl group and an acid generator capable of generating sulfonic acid. Then, in a region where a minor amount of sulfonic acid is generated, the sulfonic acid is neutralized with the recurring unit of formula (1) and consequently, no deprotection reaction of the protective group having a higher level of activation energy takes place. Accordingly, the recurring unit of formula (1) apparently functions as a base in this situation. It is also believed that when a protective group having a low level of activation energy is used, the acid catalyst species changes from sulfonic acid to a polymer-bound carboxylic acid, which controls the acid catalyst function together with the limitation of a region exhibiting catalyst function, exerting a substantial base effect.

Then the second resist composition is a chemically amplified positive resist composition comprising a base polymer which is insoluble in alkaline developer, but turns soluble therein under the catalysis of acid, the base polymer being composed entirely or partially of a polymer comprising recurring units of formula (1), and an acid generator capable of generating sulfonic acid.

In the second resist composition, the design of a polymer comprising recurring units of formula (1) is basically the same as in the first resist composition, but different in that since the acid generator is in fact to generate sulfonic acid, the protective group used as a protective group for the acidic functional group is not particularly limited, and any of well-known protective groups may generally be used.

The polymer comprising recurring units of formula (1) may be used as part of the base polymer. Alternatively, all base polymers may comprise recurring units of formula (1). The polymer as the base polymer may be designed in accordance with the above-described guideline except that the protective group is different and that the constitutional ratio of recurring units of formula (1) in the overall base polymer is different.

Described below is the second resist composition comprising an aromatic skeleton-bearing base polymer for use in the lithography involving exposure to KrF excimer laser, EB, EUV or the like.

For the polymer comprising recurring units of formula (1) used in the formulation of the second resist composition, the content of recurring units of formula (1) is preferably up to 70 mol % based on the entire recurring units of the polymer, as in the first resist composition, in order that the polymer become soluble in alkaline developer. The lower limit is generally at least 0.1 mol %, and preferably at least 0.5 mol %.

When the polymer is provided with an aromatic skeleton, recurring units of the general formula (3) are advantageously used as the substrate adhesion-providing unit and etch resistance-providing unit.

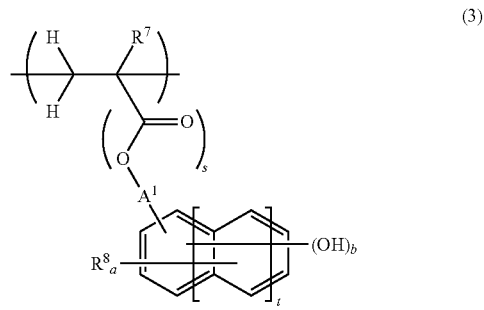

(3)

Herein $R^7$ is hydrogen or methyl, $A^1$ is a single bond or a $C_1$-$C_{10}$ alkylene group which may be separated by an ether bond, $R^8$ is each independently hydrogen or $C_1$-$C_6$ alkyl, a is an integer of 0 to 4, b is an integer of 1 to 5, s is 0 or 1, and t is an integer of 0 to 2. The recurring units of formula (3) are already used in many resist compositions for KrF excimer laser and EB lithography including the above-cited documents.

In formula (3), $A^1$ is a single bond or a $C_1$-$C_{10}$ alkylene group which may be separated by an ethereal oxygen atom (or ether bond). Preferred examples of the alkylene group include methylene, ethylene, propylene, butylene, pentylene, hexylene, and structural isomers of a carbon skeleton having branched or cyclic structure. For the alkylene group containing an ethereal oxygen atom, where s in formula (3) is 1, the ethereal oxygen may be incorporated at any position excluding the position between α- and β-carbons relative to the ester oxygen. Where s is 0, the atom in $A^1$ that bonds with the main chain becomes an ethereal oxygen and a second ethereal oxygen atom may be incorporated at any position excluding the position between the α- and β-carbons relative to that ethereal oxygen. Alkylene groups having more than 10 carbon atoms are undesirable because of a low solubility in alkaline developer.

$R^8$ is each independently hydrogen or a $C_1$-$C_6$ alkyl group. Preferred examples of the alkyl group include methyl, ethyl, propyl, isopropyl, butyl, pentyl, hexyl, and structural isomers of a carbon skeleton having branched or cyclic structure. Alkyl groups having more than 6 carbon atoms are undesirable because of a low solubility in alkaline developer.

The subscript "a" is an integer of 0 to 4, and "b" is a positive integer of 1 to 5. Preferably, a is an integer of 0 to 3 and b is an integer of 1 to 3 when t is 0. Also preferably, a is an integer of 0 to 4 and b is an integer of 1 to 5 when t is 1 or 2. The subscript t is an integer of 0 to 2. The structure represents a benzene skeleton when t=0, a naphthalene skeleton when t=1, and an anthracene skeleton when t=2.

Of the recurring units of formula (3), those recurring units wherein s is 0 and $A^1$ is a single bond (meaning that the aromatic ring is directly bonded to the main chain of the polymer), that is, linker-free recurring units are units derived from monomers in which a 1-substituted or unsubstituted vinyl group is attached to a hydroxyl-substituted aromatic ring, as typified by hydroxystyrene units. Preferred examples include 3-hydroxystyrene, 4-hydroxystyrene, 5-hydroxy-2-vinylnaphthalene, and 6-hydroxy-2-vinylnaphthalene.

Those recurring units wherein s is 1, that is, recurring units having an ester structure as the linker are units of carbonyl-substituted vinyl monomers as typified by (meth)acrylates.

Preferred examples of the units of formula (3) having a linker (—CO—O-$A^1$-) derived from (meth)acrylates are shown below.

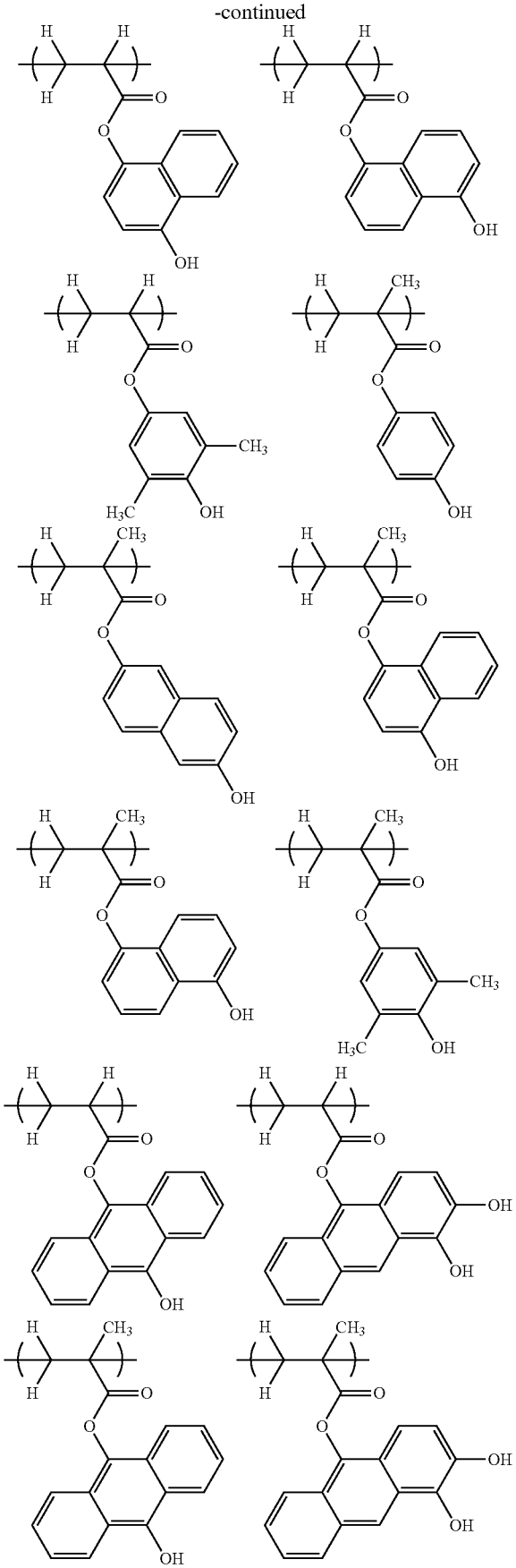

-continued

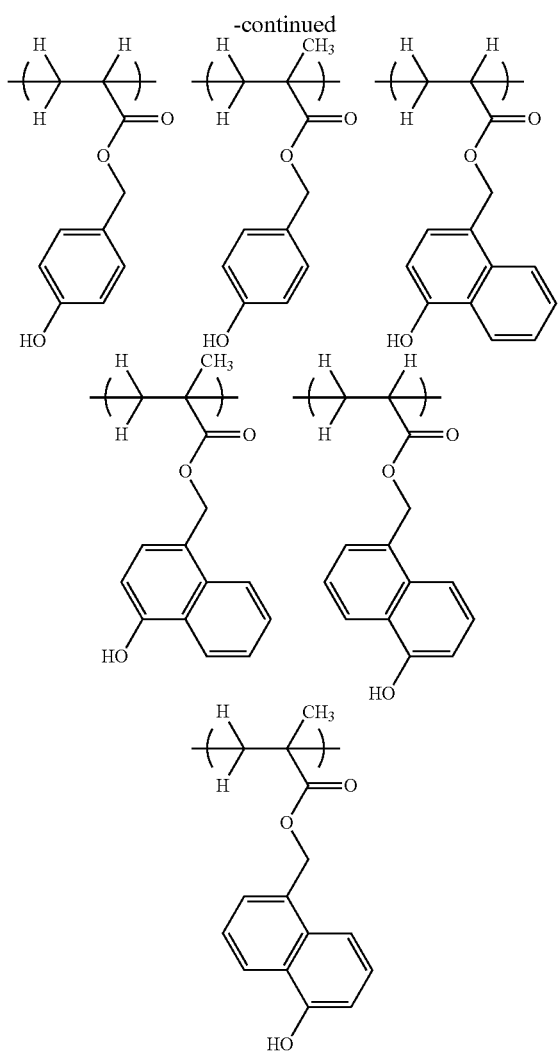

Useful recurring units having an acidic functional group protected with an acid labile protective group include units of the general formula (8).

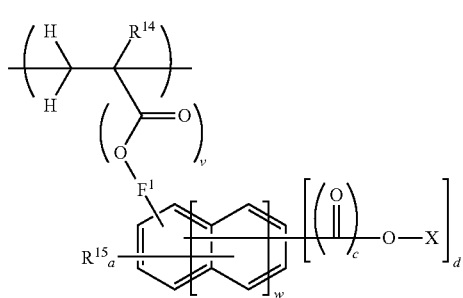

Herein $F^1$ is a single bond or a $C_1$-$C_{10}$ alkylene group which may contain an ethereal oxygen atom, $R^{14}$ is hydrogen or methyl, $R^{15}$ is each independently hydrogen or $C_1$-$C_6$ alkyl, X is an acid labile group when d is 1, X is hydrogen or an acid labile group, at least one X being an acid labile group, when d is 2 or 3, a is an integer of 0 to 4, c is 0 or 1, d is an integer of 1 to 3, v is 0 or 1, and w is an integer of 0 to 2.

In formula (8), $F^1$ is a single bond or a $C_1$-$C_{10}$ alkylene group which may contain an ethereal oxygen atom. Preferred alkylene groups are the same as exemplified above for $A^1$. $R^{15}$ is each independently hydrogen or $C_1$-$C_6$ alkyl. Preferred alkyl groups are the same as exemplified above for $R^8$.

The unit of formula (8) corresponds to the unit of formula (3) wherein at least one of phenolic hydroxyl groups substituting on an aromatic ring in the unit is replaced by an acid labile group, or at least one phenolic hydroxyl group is replaced by a carboxyl group which is in turn protected with an acid labile group. The acid labile group used herein may be any of acid labile groups which are eliminated with an acid to provide acidic groups, as commonly used in many well-known chemically amplified resist compositions.

Whether the phenolic hydroxyl group or the carboxyl group is to be protected, a choice of a tertiary alkyl group as the acid labile group for protection is preferred. The choice ensures that when a thin resist film which is as thin as 10 to 100 nm is processed to form a fine size pattern having a line width of up to 45 nm, the edge roughness of the pattern (a phenomenon that the edge of a pattern feature takes an irregular shape) is low. The tertiary alkyl group used herein is preferably selected from those of 4 to 18 carbon atoms because a corresponding monomer subject to polymerization can be isolated by distillation. The alkyl substituents on tertiary carbon of the tertiary alkyl group include straight, branched or cyclic alkyl groups of 1 to 15 carbon atoms which may partially contain an ether bond or an oxygen-containing functional group such as carbonyl while the substituents may bond together to form a ring.

The substituents on tertiary carbon of the tertiary alkyl group are preferably straight, branched or cyclic alkyl groups which may have an oxygen-containing functional group while the alkyl substituent groups on tertiary carbon may bond together to form a ring. Examples of the preferred substituents include, but are not limited to, methyl, ethyl, propyl, adamantyl, norbornyl, tetrahydrofuran-2-yl, 7-oxan-orbornan-2-yl, cyclopentyl, 2-tetrahydrofuryl, tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, tetracyclo[4.4.0.1$^{2,5}$.1$^{7,10}$]dodecyl, and 3-oxo-1-cyclohexyl. Examples of the tertiary alkyl group include t-butyl, t-pentyl, 1-ethyl-1-methylpropyl, 1,1-diethylpropyl, 1,1,2-trimethylpropyl, 1-adamantyl-1-methylethyl, 1-methyl-1-(2-norbornyl)ethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl, 1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl.

An acetal group as used in the first resist composition is also a useful acid labile protective group. In particular, an acetal group of the general formula (9):

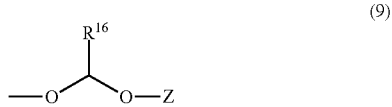
(9)

wherein $R^{16}$ is hydrogen or a straight, branched or cyclic $C_1$-$C_{10}$ alkyl group, and Z is a straight, branched or cyclic $C_1$-$C_{30}$ alkyl group (inclusive of polycyclic one) is often utilized. It is a good choice as the acid labile group that ensures consistent formation of a pattern which is relatively rectangular at the interface between the pattern and the substrate. In particular, a polycyclic alkyl group of 7 to 30 carbon atoms is preferably included to gain a higher resolution. When Z is a polycyclic alkyl group, preferably a bond forms between secondary carbon of the polycyclic ring structure and acetal oxygen. This is because if a bond forms on tertiary carbon of the ring structure, the polymer becomes an unstable compound, and as a result, the resulting resist composition may lack storage stability and have poor resolution. Inversely, if Z bonds on primary carbon via a straight alkyl group of at least 1 carbon, the polymer may have a low glass transition temperature (Tg), and as a result, the resist pattern as developed may suffer a profile failure by baking.

Examples of the acetal group of formula (9) are given below.

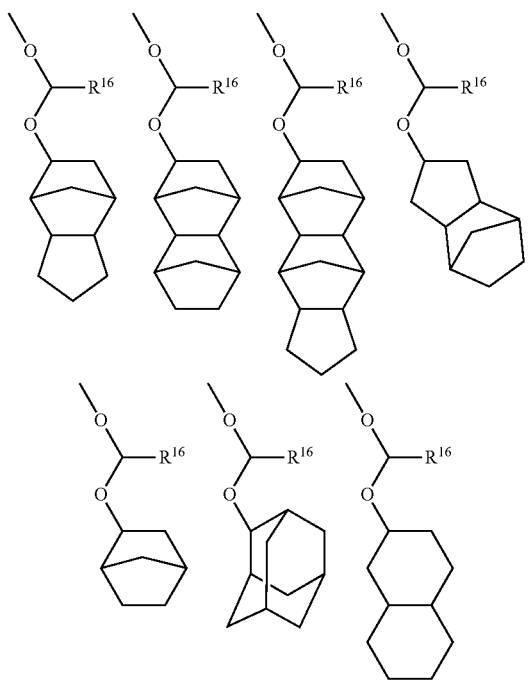

While $R^{16}$ is hydrogen or a straight, branched or cyclic $C_1$-$C_{10}$ alkyl group, a suitable group $R^{16}$ may be selected in accordance with the design of acid sensitivity of acid labile group. In one exemplary design that the acid labile group has a relatively high stability and is decomposable with a strong acid, hydrogen is selected as $R^{16}$. In another exemplary design that a higher sensitivity to pH changes is available due to relatively high reactivity, a straight alkyl group is selected as $R^{16}$. Partly depending on a combination of an acid generator and a basic compound present in a resist composition, an alkyl group in which the carbon bonding to the acetal carbon is primary is preferably selected as $R^{16}$ when the polymer is used in the first resist composition; and hydrogen atom or an alkyl group in which the carbon bonding to the acetal carbon is secondary is preferably selected as $R^{16}$ when the polymer is used in the second resist composition. Examples of $R^{16}$ which bonds to the acetal carbon via secondary carbon include isopropyl, sec-butyl, cyclopentyl, and cyclohexyl.

An alternative choice of acid labile group is bonding —$CH_2COO$— (tertiary alkyl group) to a phenolic hydroxyl group. This is an exceptional structure of acid labile group in that it is not a protective group for hydroxyl. The tertiary alkyl group used herein may be the same as the above-mentioned tertiary alkyl group used for the protection of a phenolic hydroxyl group.

When a single polymer comprising recurring units of formula (1) is used as the base polymer, the content of recurring units of formula (1) is preferably 0.005 to 10 mol %, more preferably 0.01 to 7 mol %, and even more preferably 0.1 to 5 mol % based on the total recurring units of the base polymer. If the content of recurring units of formula (1) is less than 0.005 mol %, there is a possibility of failing in full control of acid diffusion, leading to a decline of resolution. If the content is more than 10 mol %, a necessary sensitivity may not be attained. With respect to the contents of other recurring units, which depend on physical properties of the recurring unit of a certain type, a compositional range that ensures a better pattern is generally found when the content of substrate adhesion-providing units is in a range of 30 to 80 mol % and the content of units having an acidic functional group protected with a protective group which can be deprotected with an acid catalyst is in a range of 2 to 50 mol %, more preferably 5 to 45 mol %, based on the total recurring units of the base polymer.

When a blend of plural polymers comprising recurring units of formula (1) or a blend of a polymer comprising recurring units of formula (1) and any well-known polymer free of recurring units of formula (1) (commonly used in conventional chemically amplified positive resist compositions) is used as the base polymer, the polymer design may be made so as to provide an overall balance of the base polymer. Specifically, the content of recurring units of formula (1) is preferably 0.005 to 10 mol %, more preferably 0.01 to 7 mol %, and even more preferably 0.1 to 5 mol % based on the total recurring units of the base polymer, as in the case of a single polymer. Also, since the content of recurring units of formula (1) in the single polymer is from 0 mol % (absent) to 70 mol % as described above, polymers are preferably blended in such a mixing ratio that the content of recurring units of formula (1) falls in the above-defined range, specifically 0.005 to 10 mol %, more preferably 0.01 to 7 mol %, and even more preferably 0.1 to 5 mol %, based on the overall recurring units of the polymer blend as the base polymer. Likewise, with respect to the other recurring units, the content of recurring units having a certain function in the overall base polymer falls in an appropriate range, and to insure solubility in alkaline developer, the total amount of recurring units having an acidic functional group and acidic functional groups protected with a protective group is at least 10 mol % based on the overall recurring units of which the individual polymers are composed.

Useful units which can be incorporated as main constituent units of the polymer in addition to the aforementioned recurring units include units of the general formula (10) and/or (11).

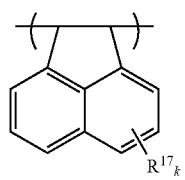
(10)

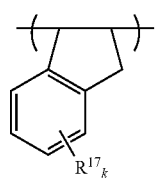
(11)

Herein k is an integer of 0 to 4, and $R^{17}$ is each independently hydrogen, hydroxyl, $C_1$-$C_7$ alkylcarbonyloxy, or $C_1$-$C_6$ alkyl or alkoxy group, or halogenated alkyl or alkoxy group. When units of formulae (10) and (11) are used as constituent units in the polymer, there are obtained the advantages that the aromatic ring provides etch resistance and the addition of cyclic structure to the main chain enhances resistance to EB irradiation during etching or pattern inspection.

The recurring units which serve to improve etch resistance by imparting a cyclic structure to the main chain may be of one type or a mixture of two or more types. For the purpose of improving etch resistance, these recurring units are preferably incorporated in a content of 5 mol % to 40 mol % based on the overall monomeric units of the base polymer. A content of more than 40 mol % may become a cause for development defects. When $R^{17}$ is hydroxyl, the content can be increased beyond 40 mol % without incurring development defects. As long as the content of units wherein $R^{17}$ is hydroxyl is up to 90 mol %, the units may be designed as part of the substrate adhesion-providing units.

Next, the use of the polymer in the ArF lithography resist is described. In the ArF lithography resist, as is well known in the art, aromatic skeleton-bearing recurring units cannot be used in such a large amount as in the KrF, EB or EUV lithography resist, and instead, alicyclic skeleton-bearing recurring units are used to provide etch resistance. In the design of the recurring unit to be combined with the recurring unit of formula (1) according to the invention, a combination of recurring units different from the combination of aromatic skeleton-bearing recurring units is used.

First, with respect to the recurring units having an acidic functional group protected with a protective group, a number of recurring units are well known as ArF resist polymers. Basically, any of these known recurring units may be utilized in combination with the recurring unit of formula (1). Preferred are recurring units of the general formula (12).

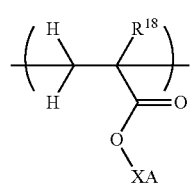
(12)

Herein $R^{18}$ is hydrogen, fluorine, methyl or trifluoromethyl, and XA is an acid labile group.

A polymer comprising recurring units of formula (12) functions such that it may be decomposed to generate carboxylic acid under the action of an acid and become alkali soluble. The acid labile groups represented by XA may be selected from a variety of such groups. Examples of the acid labile group include groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

(L1)

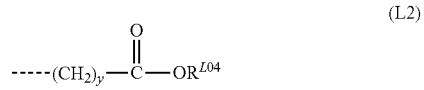
(L2)

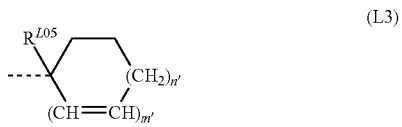
(L3)

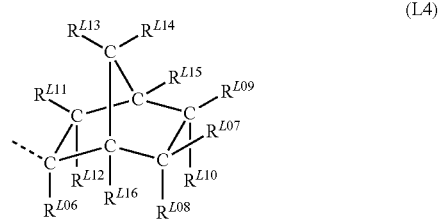
(L4)

It is noted that the broken line denotes a valence bond herein and throughout the specification.

In formula (L1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Exemplary straight, branched or cyclic alkyl groups include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. Illustrative examples of the substituted alkyl groups are shown below.

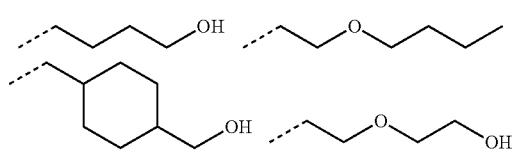

-continued

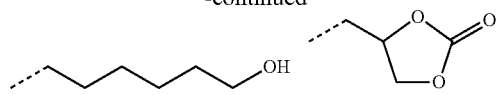

A pair of $R^{L01}$ and $R^{L02}$, $R^{L01}$ and $R^{L03}$, or $R^{L02}$ and $R^{L03}$ may bond together to form a ring with the carbon and oxygen atom to which they are attached. Each of $R^{L''}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxoxan-4-yl, and 5-methyl-2-oxooxolan-5-yl. Letter y is an integer of 0 to 6.

In formula (L3), $R^{L05}$ is an optionally substituted, straight, branched or cyclic $C_1$-$C_8$ alkyl group or an optionally substituted $C_6$-$C_{20}$ aryl group. Examples of the optionally substituted alkyl group include straight, branched or cyclic alkyl groups such as methyl, ethyl, propyl, isopropyl, n-butyl, sec-butyl, tert-butyl, tert-amyl, n-pentyl, n-hexyl, cyclopentyl and cyclohexyl, and substituted forms of the foregoing in which some hydrogen atoms are substituted by hydroxyl, alkoxy, carboxyl, alkoxycarbonyl, oxo, amino, alkylamino, cyano, mercapto, alkylthio, sulfo or the like. Examples of the optionally substituted aryl groups include phenyl, methylphenyl, naphthyl, anthryl, phenanthryl, and pyrenyl. Letter m' is equal to 0 or 1, n' is equal to 0, 1, 2 or 3, and 2 m'+n' is equal to 2 or 3.

In formula (L4), $R^{L06}$ is an optionally substituted, straight, branched or cyclic $C_1$-$C_8$ alkyl group or an optionally substituted $C_6$-$C_{20}$ aryl group. Examples of these groups are the same as exemplified for $R^{L05}$. $R^{L07}$ to $R^{L16}$ independently represent hydrogen or monovalent $C_1$-$C_{15}$ hydrocarbon groups. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of the foregoing in which some hydrogen atoms are replaced by hydroxyl, alkoxy, carboxyl, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

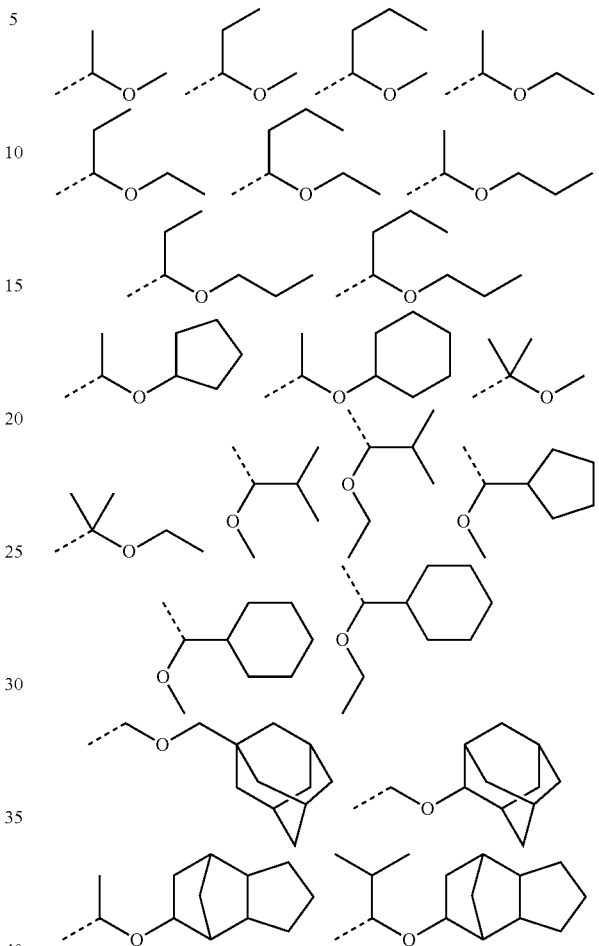

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl,
tert-amyloxycarbonyl, tert-amyloxycarbonylmethyl,
1,1-diethylpropyloxycarbonyl,
1,1-diethylpropyloxycarbonylmethyl,
1-ethyl cyclopentyloxycarbonyl,
1-ethylcyclopentyloxycarbonylmethyl,
1-ethyl-2-cyclopentenyloxycarbonyl,
1-ethyl-2-cyclopentenyloxycarbonylmethyl,
1-ethoxyethoxycarbonylmethyl,
2-tetrahydropyranyloxycarbonylmethyl, and
2-tetrahydrofuranyloxycarbonylmethyl groups.

Examples of the acid labile groups of formula (L3) include
1-methylcyclopentyl, 1-ethylcyclopentyl,
1-n-propylcyclopentyl, 1-isopropylcyclopentyl,
1-n-butylcyclopentyl, 1-sec-butylcyclopentyl,
1-cyclohexylcyclopentyl, 1-(4-methoxy-n-butyl)cyclopentyl,
1-methylcyclohexyl, 1-ethylcyclohexyl,
3-methyl-1-cyclopenten-3-yl, 3-ethyl-1-cyclopenten-3-yl,
3-methyl-1-cyclohexen-3-yl, and
3-ethyl-1-cyclohexen-3-yl groups.

Of the acid labile groups having formula (L4), groups having the following formulas (L4-1) to (L4-4) are preferred.

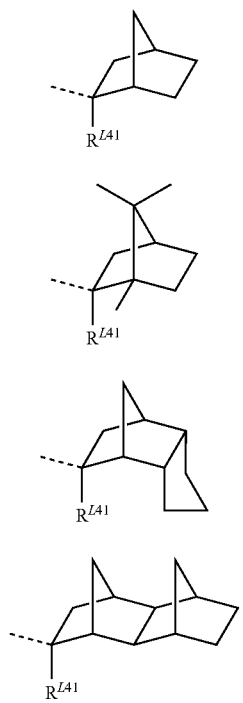

(L4-1)

(L4-2)

(L4-3)

(L4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

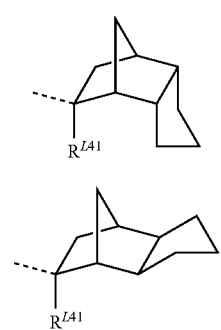

(L4-3-1)

(L4-3-2)

Similarly, the general formula (L4-4) represents one or a mixture of two or more selected from groups having the following general formulas (L4-4-1) to (L4-4-4).

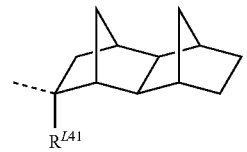

(L4-4-1)

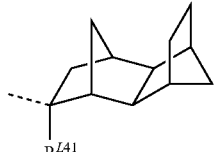

(L4-4-2)

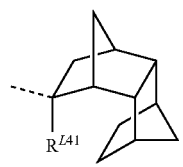

(L4-4-3)

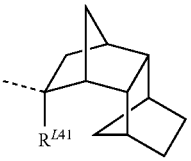

(L4-4-4)

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

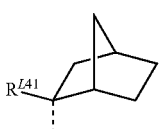

(L4-1-endo)

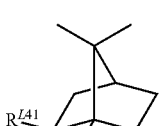

(L4-2-endo)

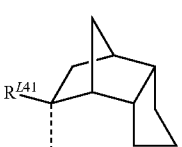

(L4-3-endo)

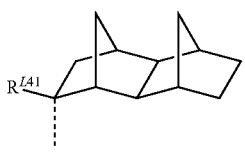
(L4-4-endo)
Illustrative examples of the acid labile group of formula (L4) are given below.
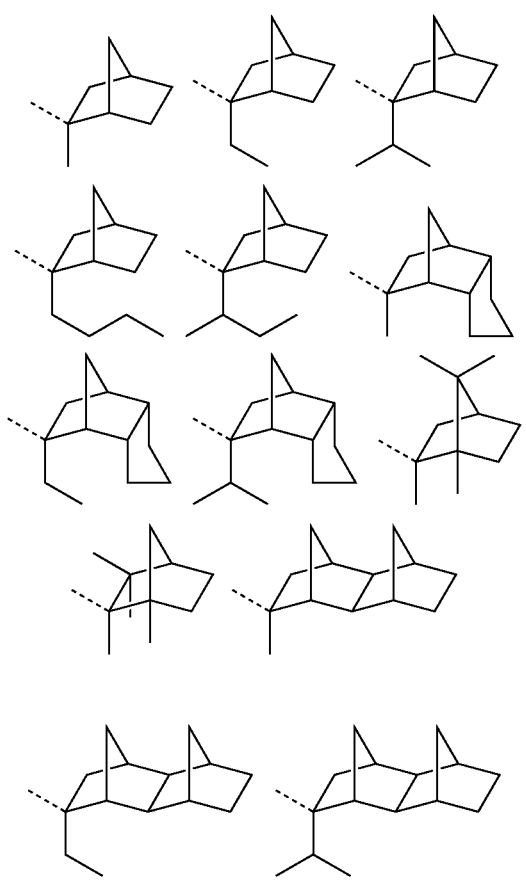
Examples of the tertiary $C_4$-$C_{20}$ alkyl groups, trialkylsilyl groups in which each alkyl moiety has 1 to 6 carbon atoms, and $C_4$-$C_{20}$ oxoalkyl groups are as exemplified for $R^{L04}$.
Illustrative examples of the recurring units of formula (12) are given below, but not limited thereto.
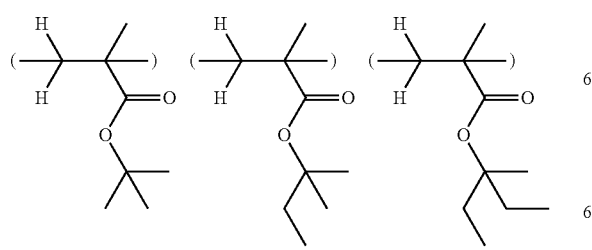
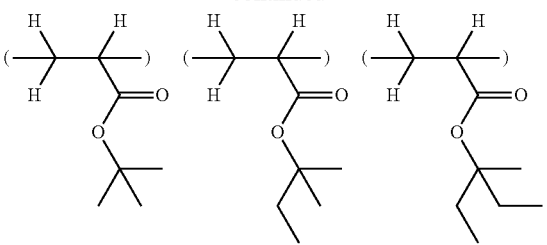
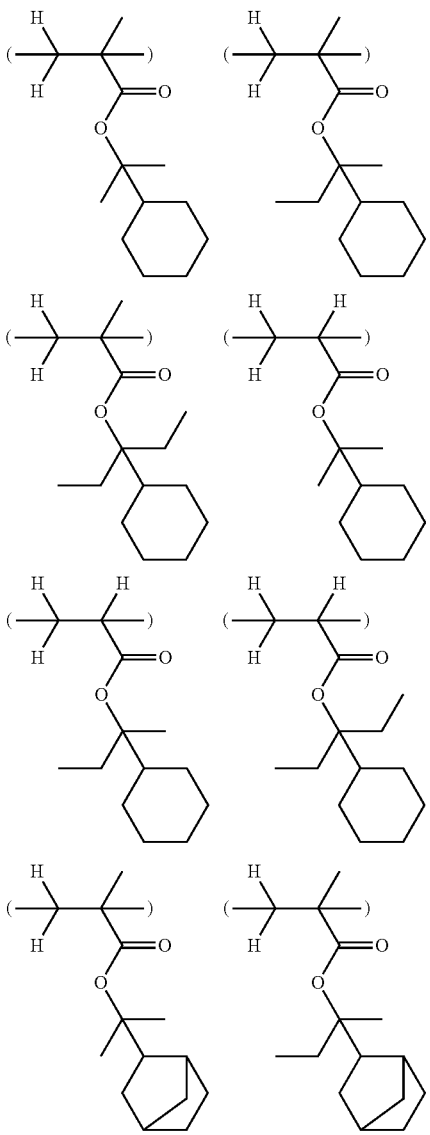
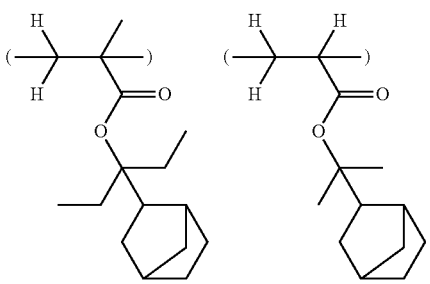

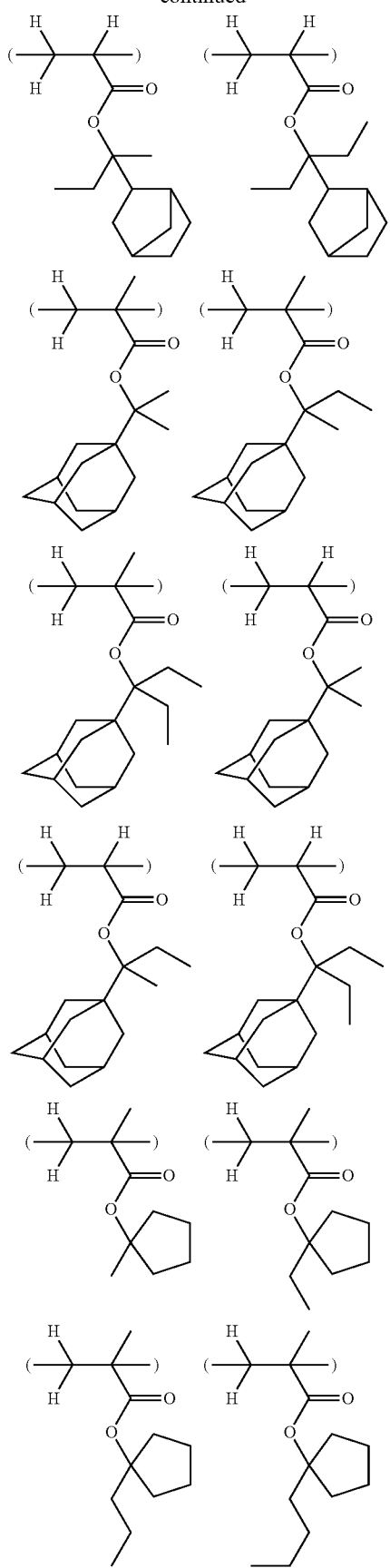
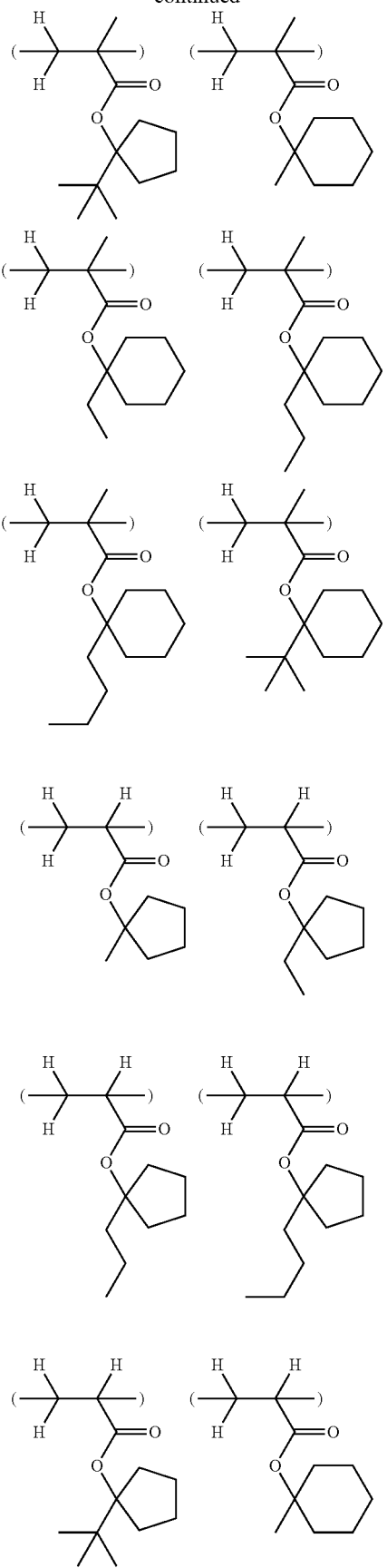

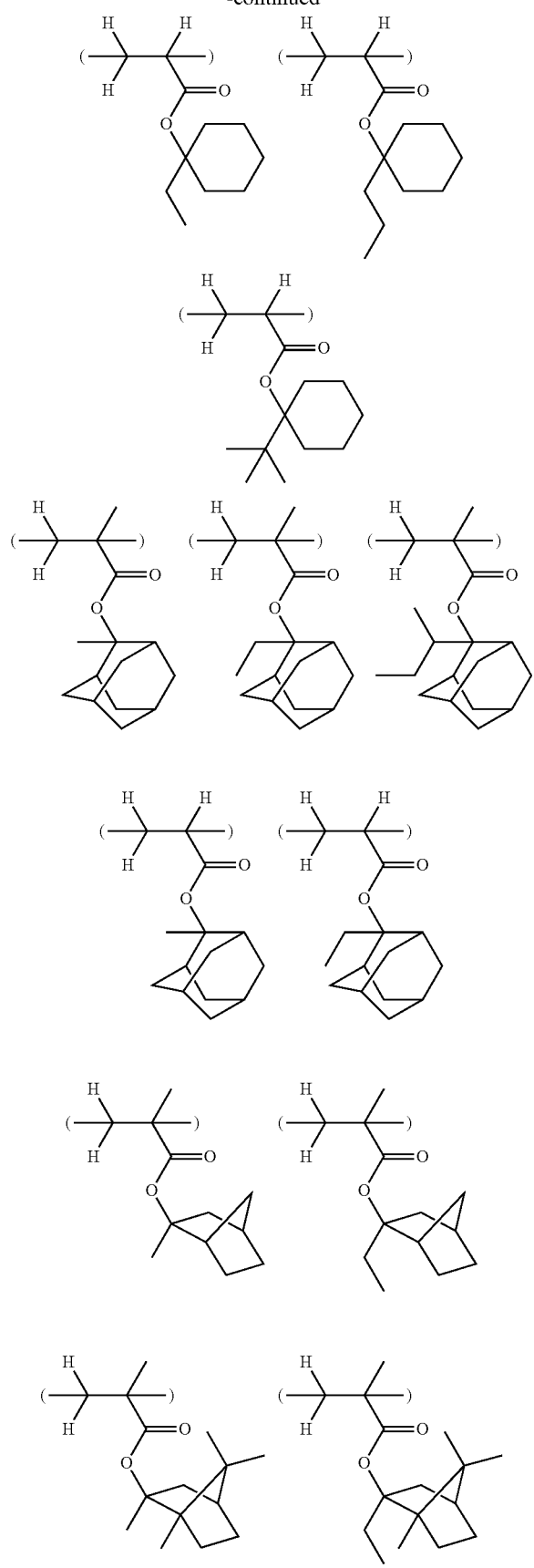
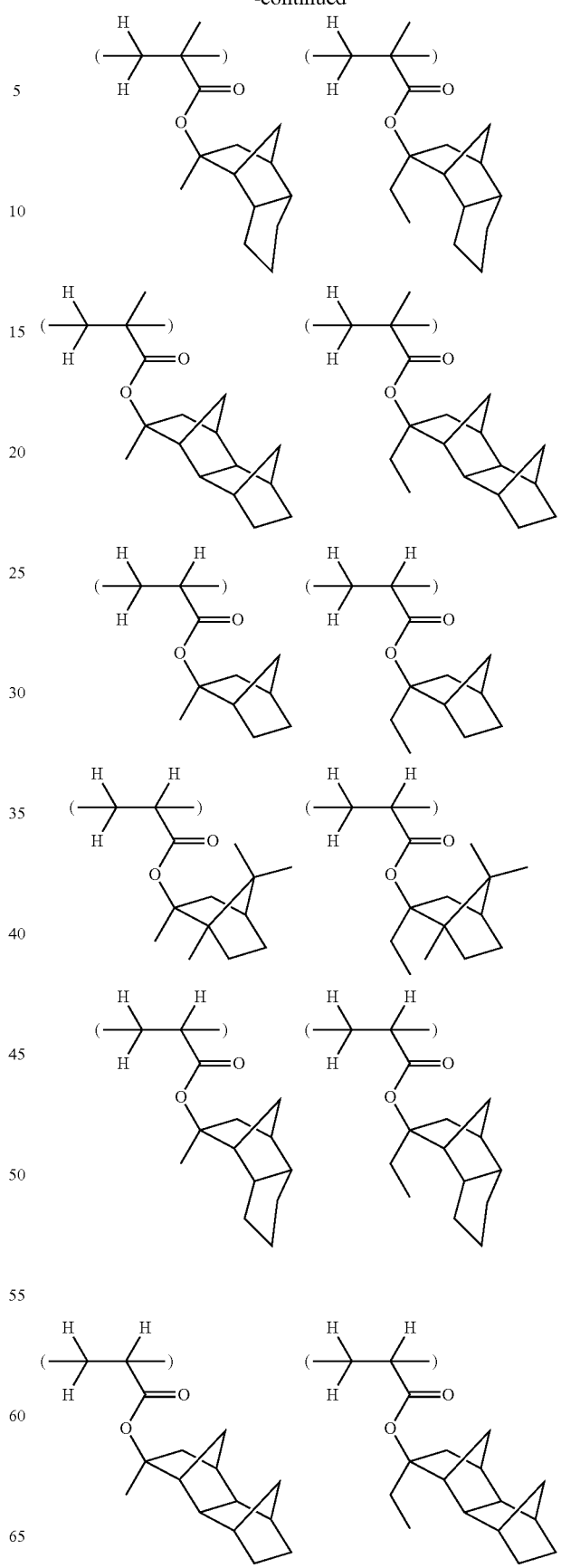

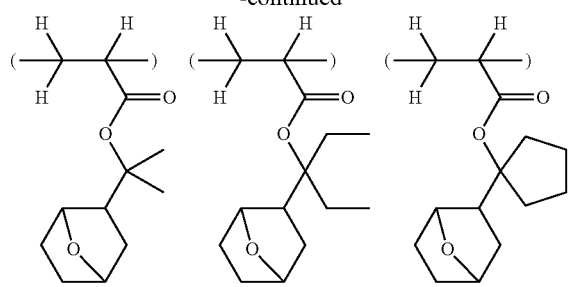
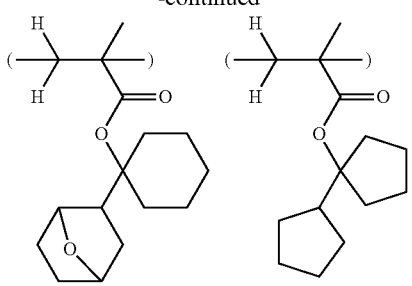
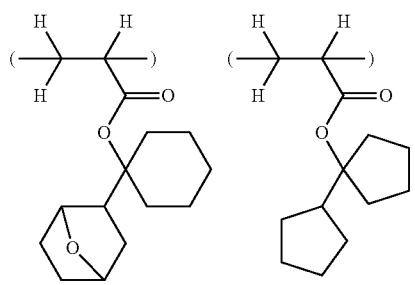
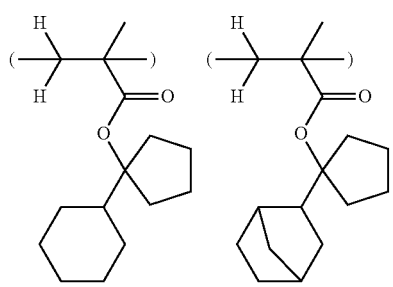
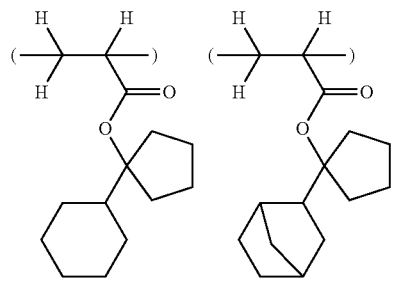
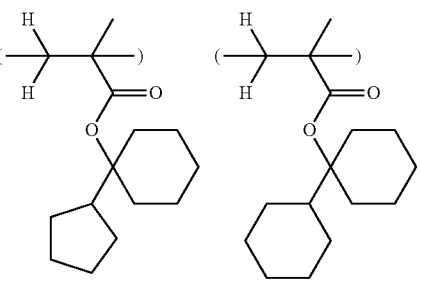
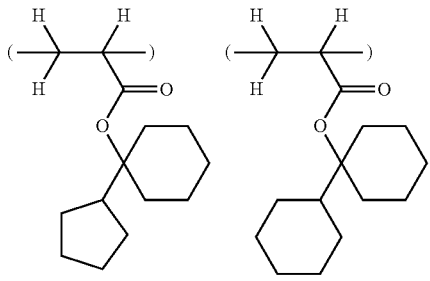
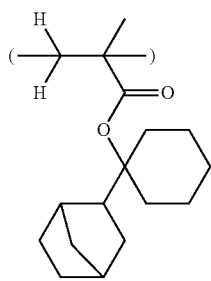
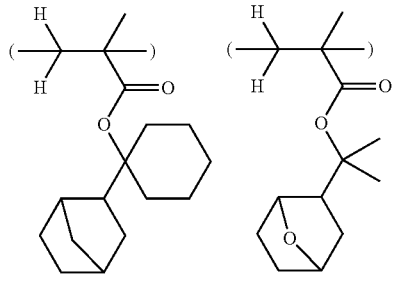
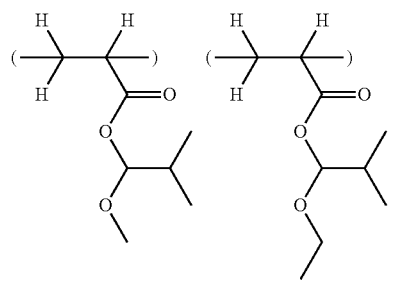
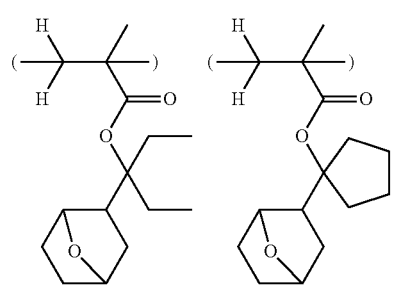
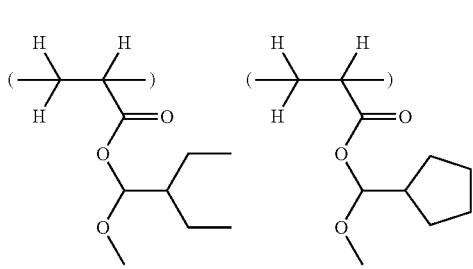

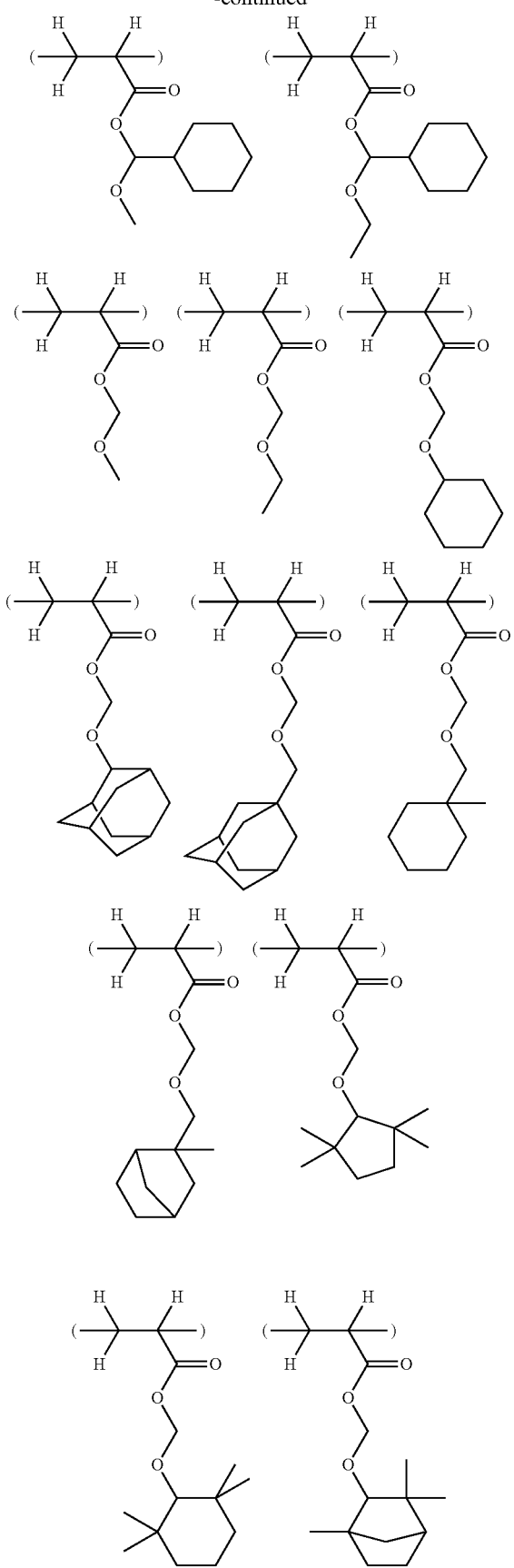
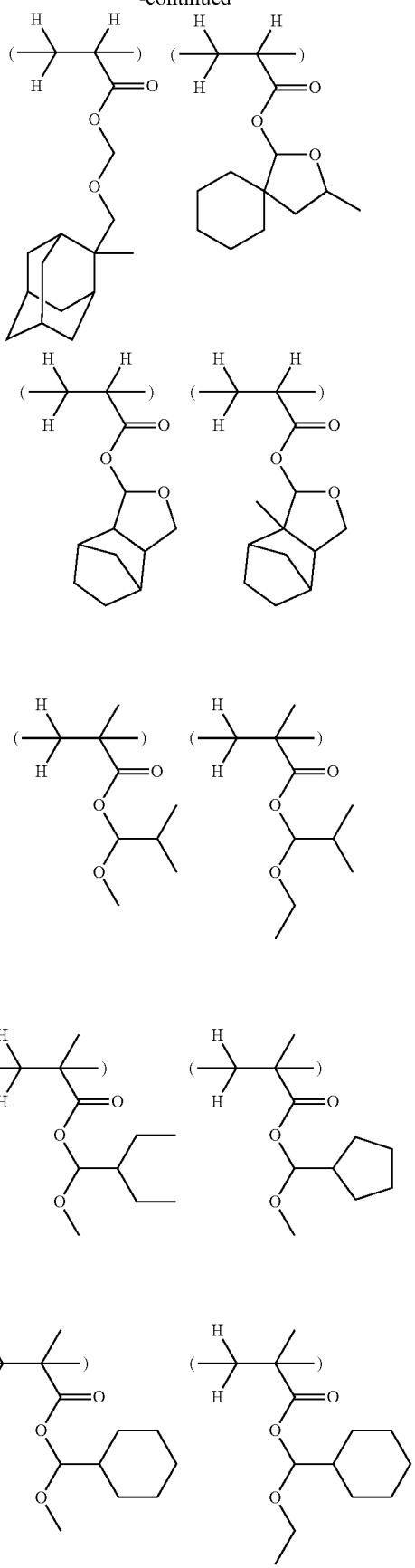

-continued

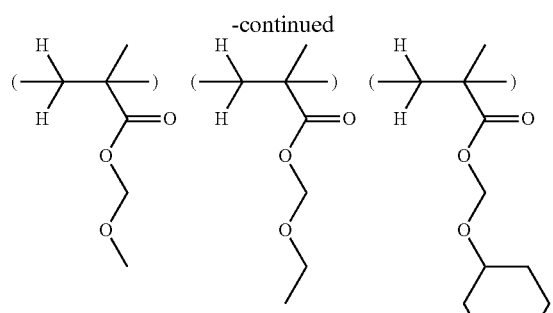
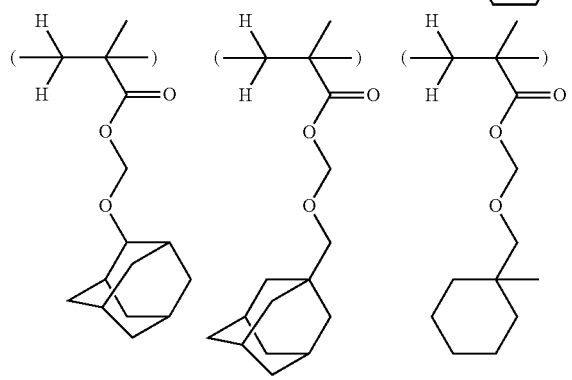
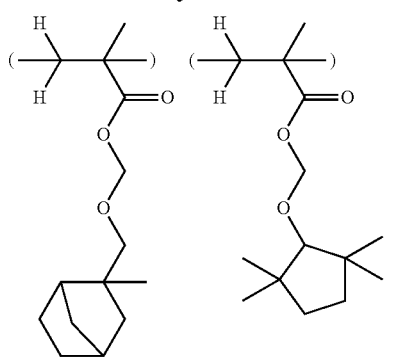
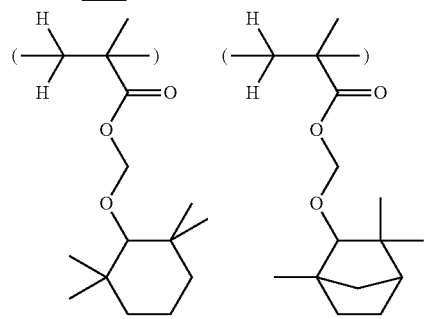
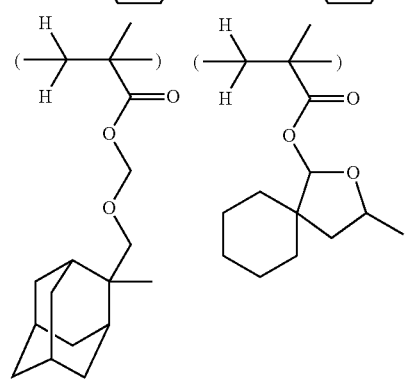

-continued

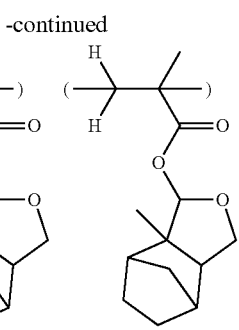

Preferably the polymer further comprises units of at least one type for providing substrate adhesion. Preferred as the substrate adhesion-providing units are units of the general formulae (6), (7), (5), and (13).

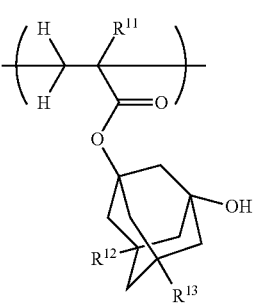

(6)

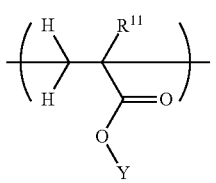

(7)

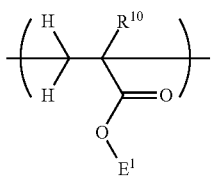

(5)

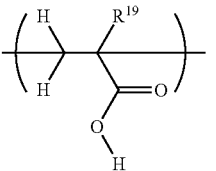

(13)

Herein $R^{11}$ and $R^{10}$ are hydrogen or methyl, $R^{19}$ is hydrogen, methyl or carboxymethyl, $R^{12}$ and $R^{13}$ are hydrogen or hydroxyl, Y is a lactone structure-bearing substituent group, and $E^1$ is a $C_1$-$C_{15}$ fluoroalcohol-containing substituent group. Notably, the recurring unit of formula (5) or (13) also functions as a substituent group for providing a high solubility in alkaline developer.

Illustrative examples of the recurring units of formula (6) are given below.
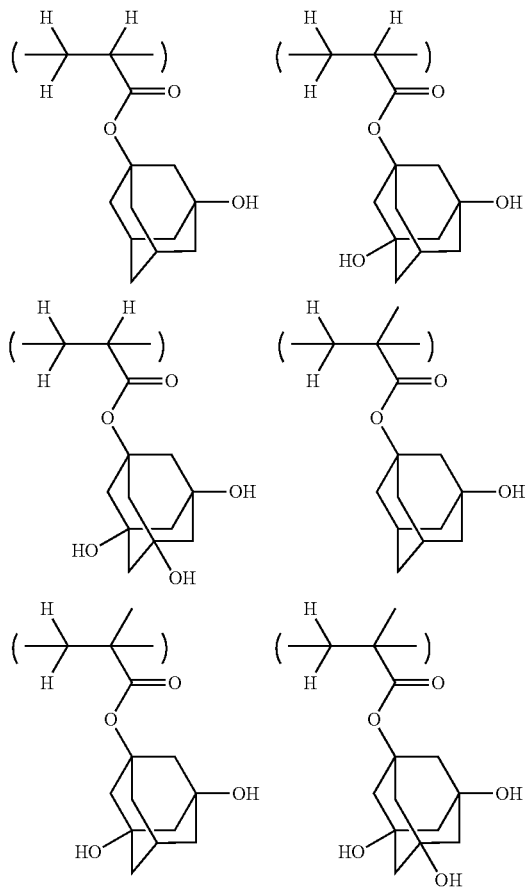
Illustrative examples of the recurring units of formula (7) are given below.
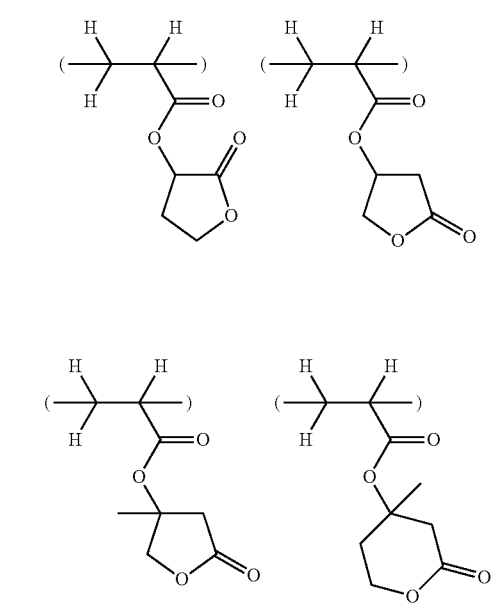
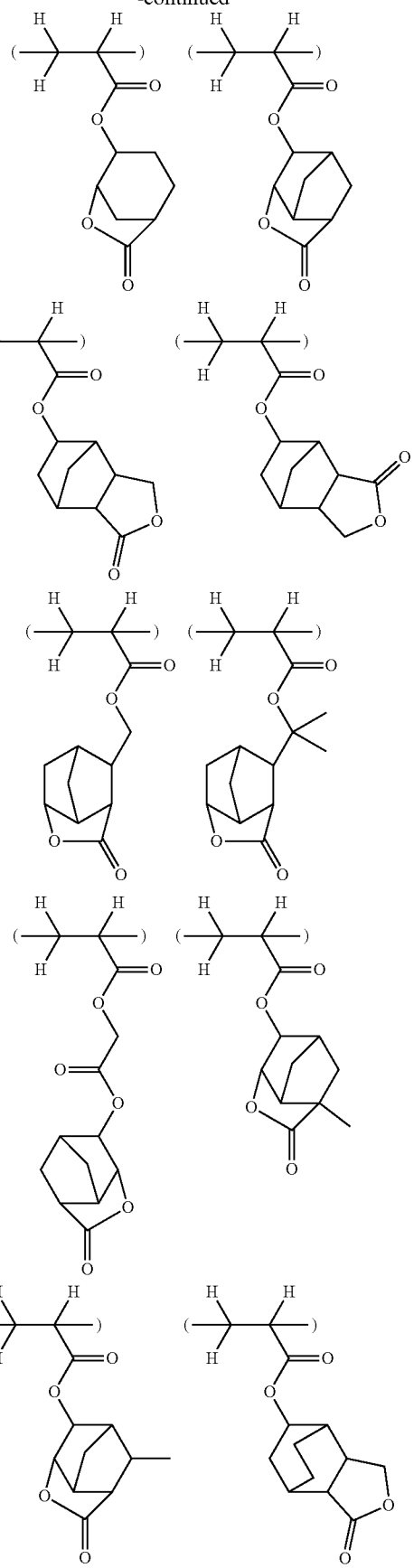

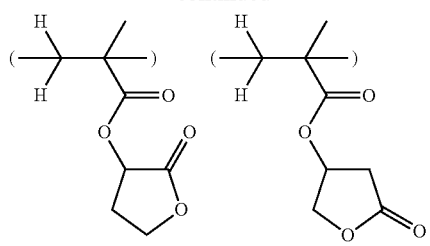
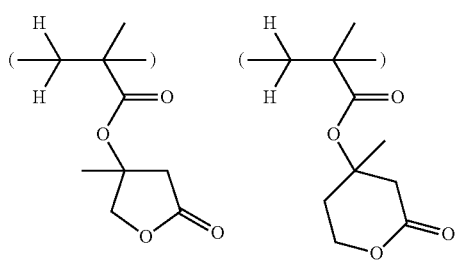
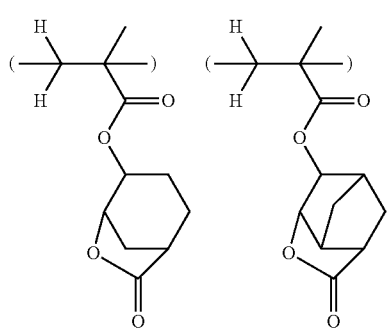
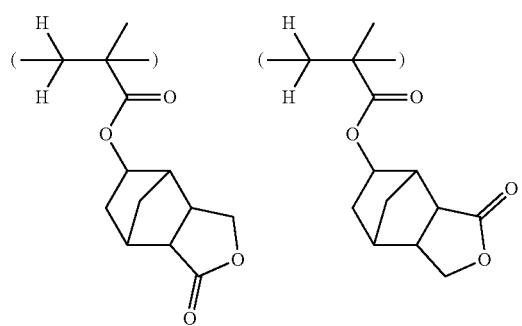
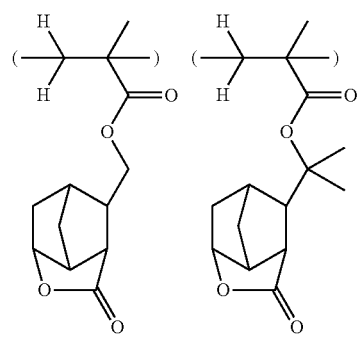
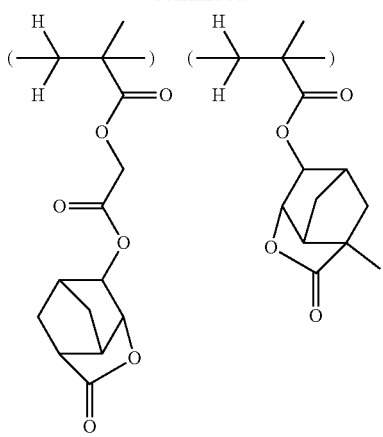
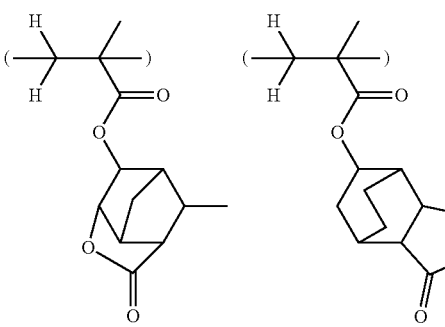
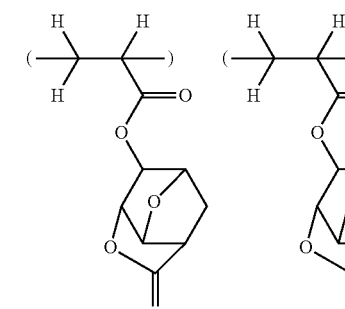
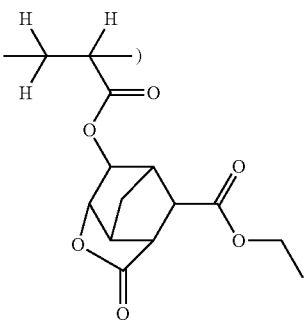
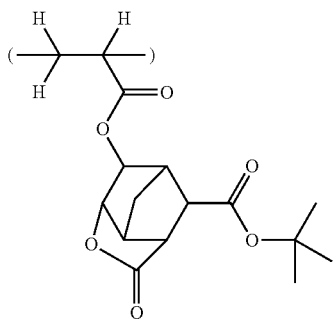

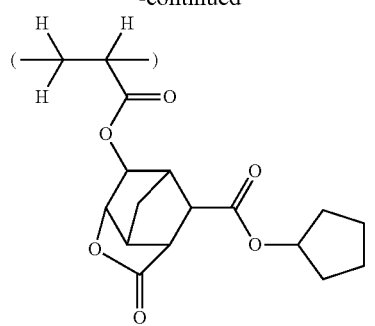
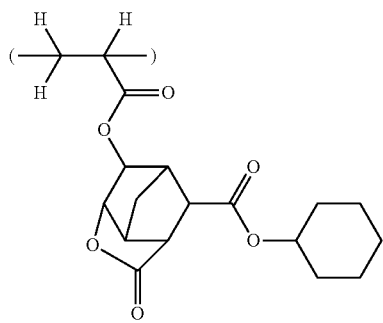
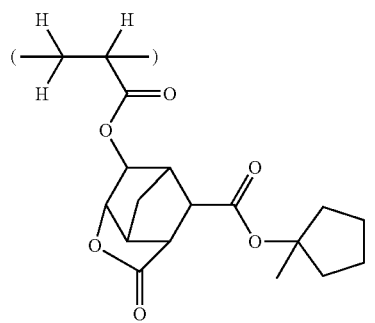
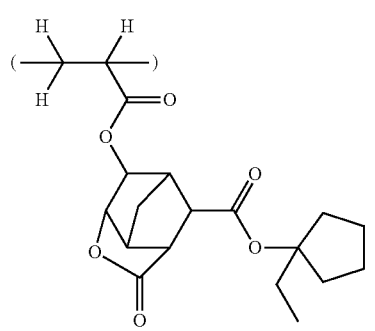
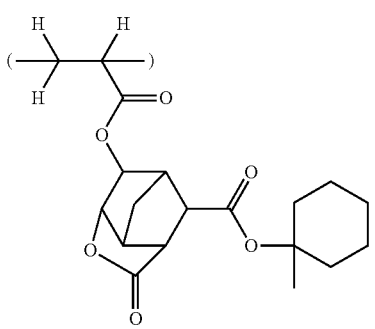
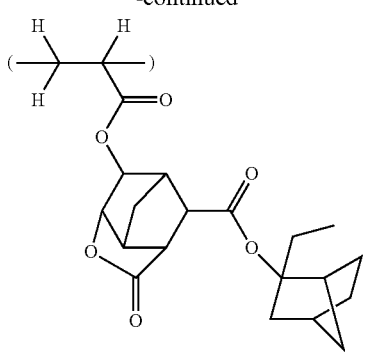
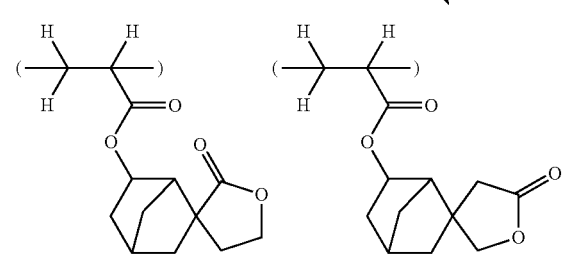
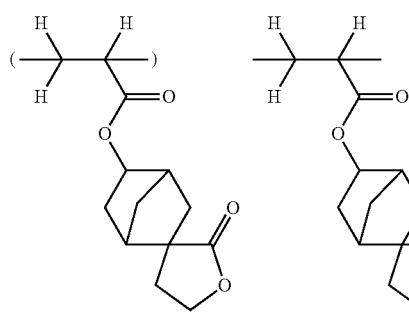
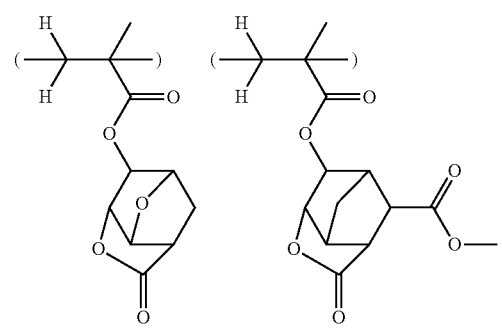
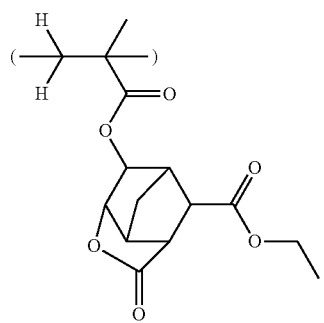

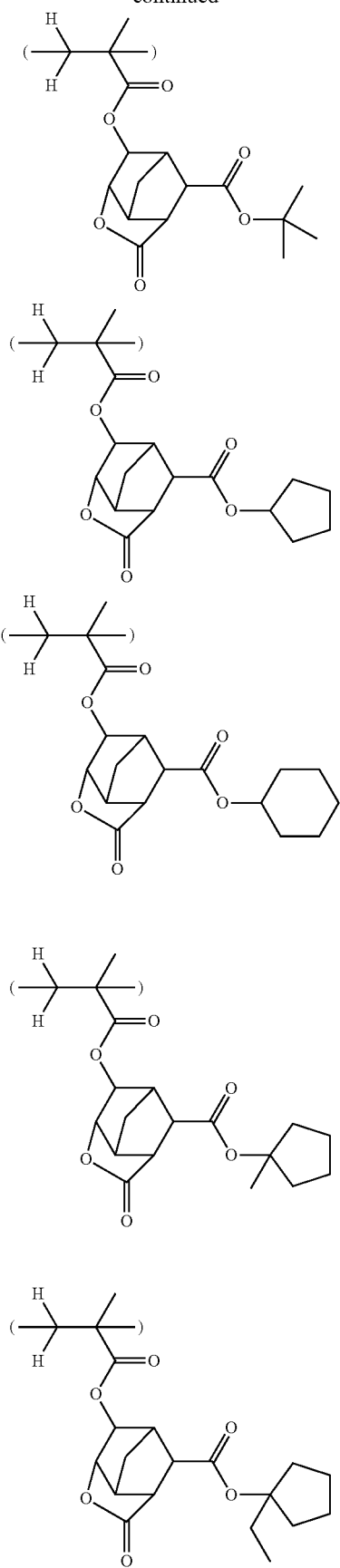
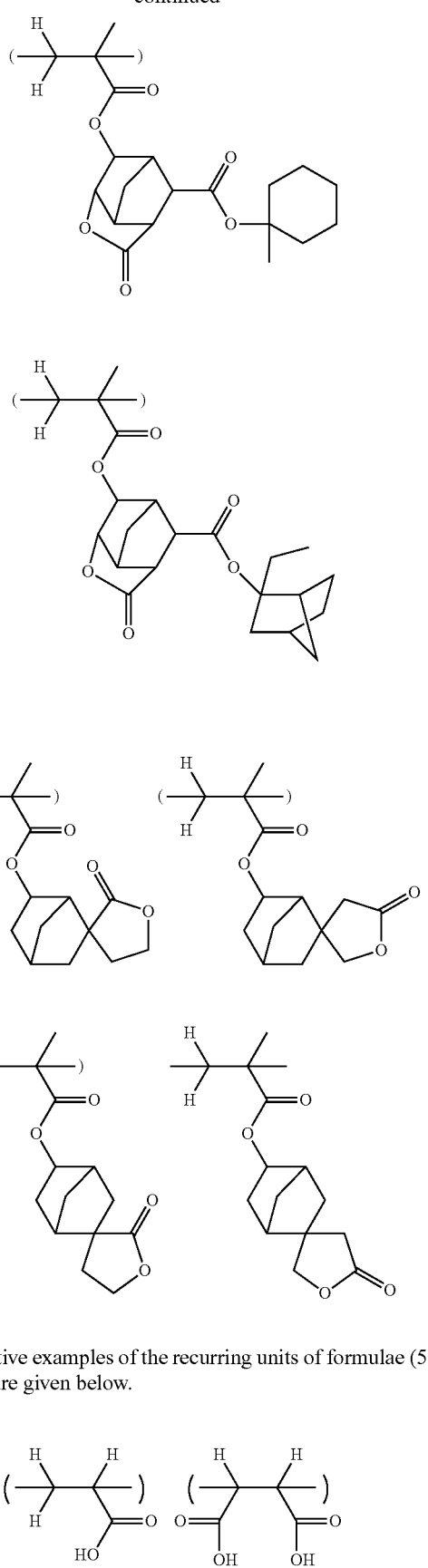
Illustrative examples of the recurring units of formulae (5) and (13) are given below.

-continued

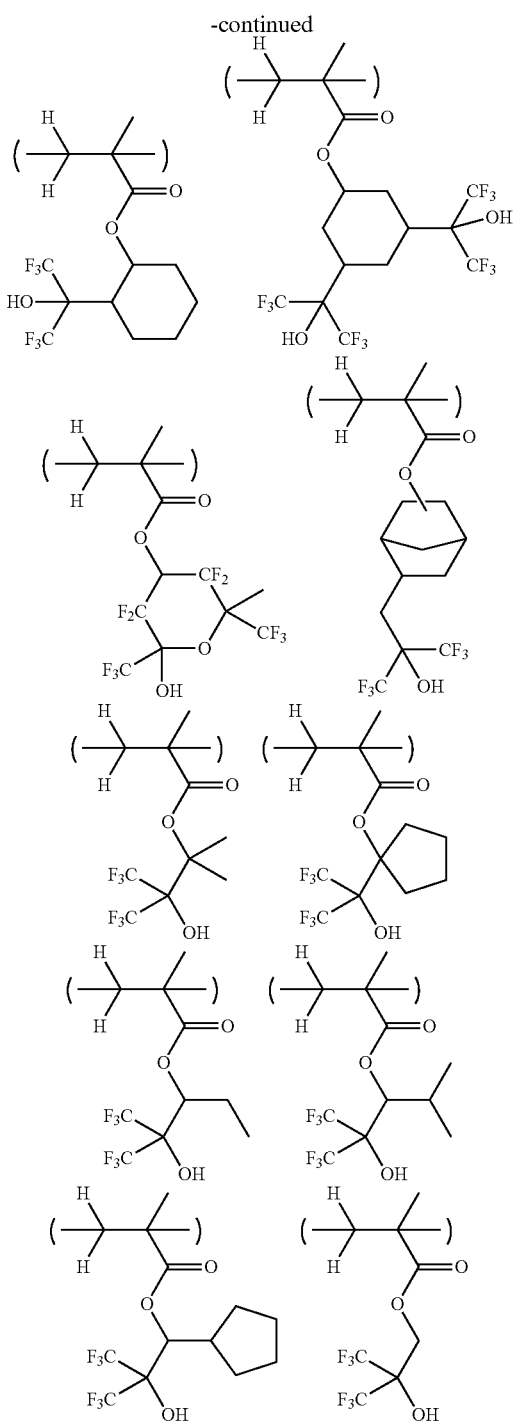

In addition to the foregoing units, the polymer for use in the resist composition of the invention may further comprise recurring units derived from carbon-to-carbon double bond-bearing monomers other than the above-described ones, for example, substituted acrylic acid esters such as methyl methacrylate, methyl crotonate, dimethyl maleate and dimethyl itaconate, cyclic olefins such as norbornene, norbornene derivatives, and tetracyclo[6.2.1.1$^{3,6}$.0$^{2,7}$]dodecene derivatives, unsaturated acid anhydrides such as maleic anhydride and itaconic anhydride, and other monomers.

Like the embodiment wherein an aromatic ring-bearing polymer is used as the base polymer, recurring units of the base polymer in the resist composition for use in the ArF excimer laser lithography are designed as follows. When only a single polymer comprising recurring units of formula (1) is used as the base polymer, the content of recurring units of formula (1) is preferably 0.1 to 20 mol % based on the overall recurring units of the base polymer. If the content of recurring units of formula (1) is less than 0.1 mol %, there is a possibility of failing in full control of acid diffusion, leading to a decline of resolution. If the content is more than 20 mol %, a necessary sensitivity may not be attained. With respect to the contents of other recurring units, which depend on physical properties of the recurring unit of a certain type, a compositional range that ensures a better pattern is generally found when the content of substrate adhesion-providing units is in a range of 0 to 80 mol % and the content of units having an acidic functional group protected with a protective group which can be deprotected with an acid catalyst is in a range of 2 to 50 mol %, more preferably 5 to 45 mol %, based on the total recurring units of the base polymer.

When a blend of plural polymers comprising recurring units of formula (1) or a blend of a polymer comprising recurring units of formula (1) and any well-known polymer free of recurring units of formula (1) (commonly used in conventional chemically amplified positive resist compositions) is used as the base polymer, the polymer design may be made so as to provide an overall balance of the base polymer. Specifically, the content of recurring units of formula (1) is preferably 0.1 to 20 mol % based on the total recurring units of the base polymer, as in the case of a single polymer. Also, since the content of recurring units of formula (1) in the single polymer is from 0 mol % (absent) to 70 mol % as described above, polymers are preferably blended in such a mixing ratio that the content of recurring units of formula (1) falls in the above-defined range, specifically 0.1 to 20 mol % based on the overall recurring units of the polymer blend as the base polymer. Likewise, with respect to the other recurring units, the content of recurring units having a certain function in the overall base polymer falls in an appropriate range, and to insure solubility in alkaline developer, the total amount of recurring units having an acidic functional group and acidic functional groups protected with a protective group is preferably at least 10 mol % based on the overall recurring units of which the individual polymers are composed.

The polymer comprising the foregoing recurring units may be prepared by effecting copolymerization of monomers by any well-known techniques with an optional combination of protection and deprotection reactions. The copolymerization reaction is preferably radical polymerization, but not limited thereto.

The base polymer preferably has a weight average molecular weight (Mw) of 1,000 to 50,000, and more preferably 2,000 to 20,000, as measured by gel permeation chromatography (GPC) using polystyrene standards. A polymer with a Mw of less than 1,000 may lead to a pattern having a rounded top, reduced resolution, and degraded LER as is well known in the art. If Mw is higher than the necessity, the pattern tends to have increased LER, depending on the pattern size to be resolved. The Mw is preferably controlled to 20,000 or less particularly when a pattern having a line width of up to 100 nm is formed.

The polymer preferably has a narrow dispersity as demonstrated by a molecular weight distribution Mw/Mn in the range of 1.0 to 3.0, more preferably 1.0 to 2.5. A broader dispersity may cause drawbacks to the pattern such as foreign matter after development and degraded profile.

To the second resist composition, an acid generator capable of generating a sulfonic acid upon exposure to high-energy radiation is added. A number of acid generators are known for use in chemically amplified resist compositions. Preferred photoacid generators include sulfonium salt, iodonium salt, sulfonyldiazomethane, and N-sulfonyloxyimide acid generators. Generally any of these acid generators may be used. A mixture of acid generators of the same family or different families may be used. The photoacid generators may be used alone or in admixture.

The amount of the PAG (capable of generating sulfonic acid) added to the second resist composition may be selected with reference to, for example, Patent Documents 1 to 5. The PAG is preferably added in an amount of 0.1 to 15 parts, more preferably 2.0 to 12 parts by weight per 100 parts by weight of the base polymer in the resist composition. An excess of the PAG added may give rise to such problems as foreign particles left on the substrate upon development and resist stripping. A less amount of the PAG may fail to provide a sensitivity.

The sulfonium acid generator is useful because of a good balance of stability and acid generation efficiency. A number of such acid generators are well known. Further, the sulfonium acid generator may take the form of a polymer having the acid generator incorporated in a side chain from its recurring unit.

Preferred examples of the acid generator are illustrated below, but not limited thereto.

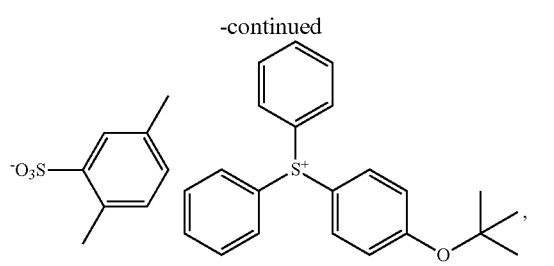

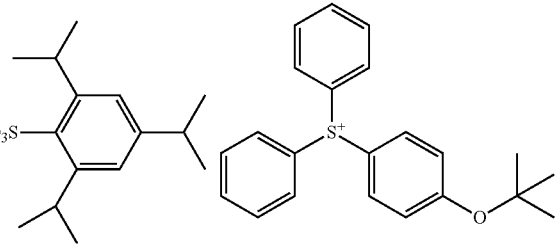

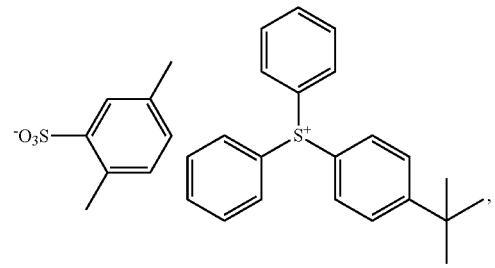

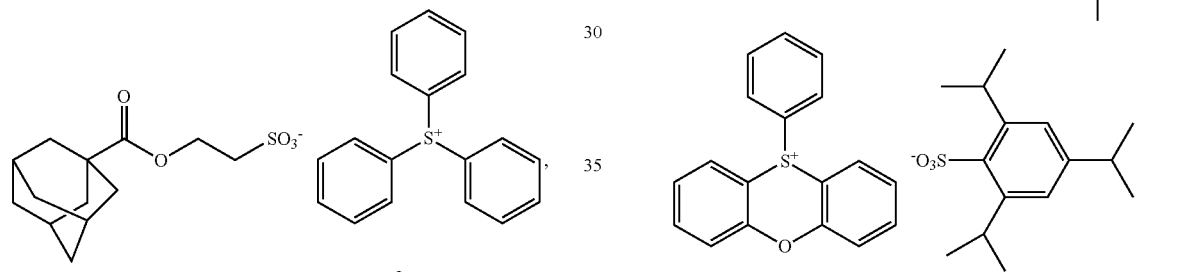

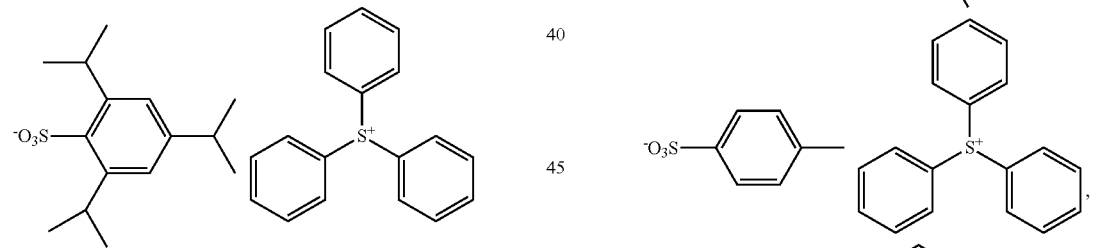

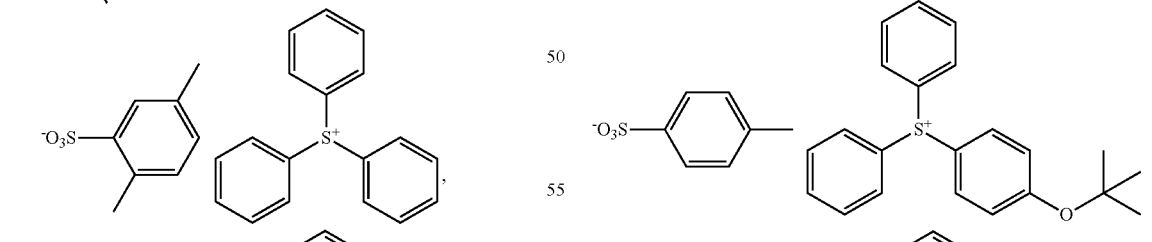

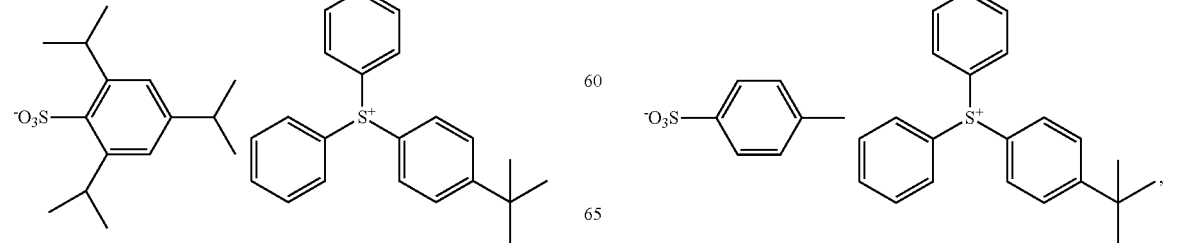

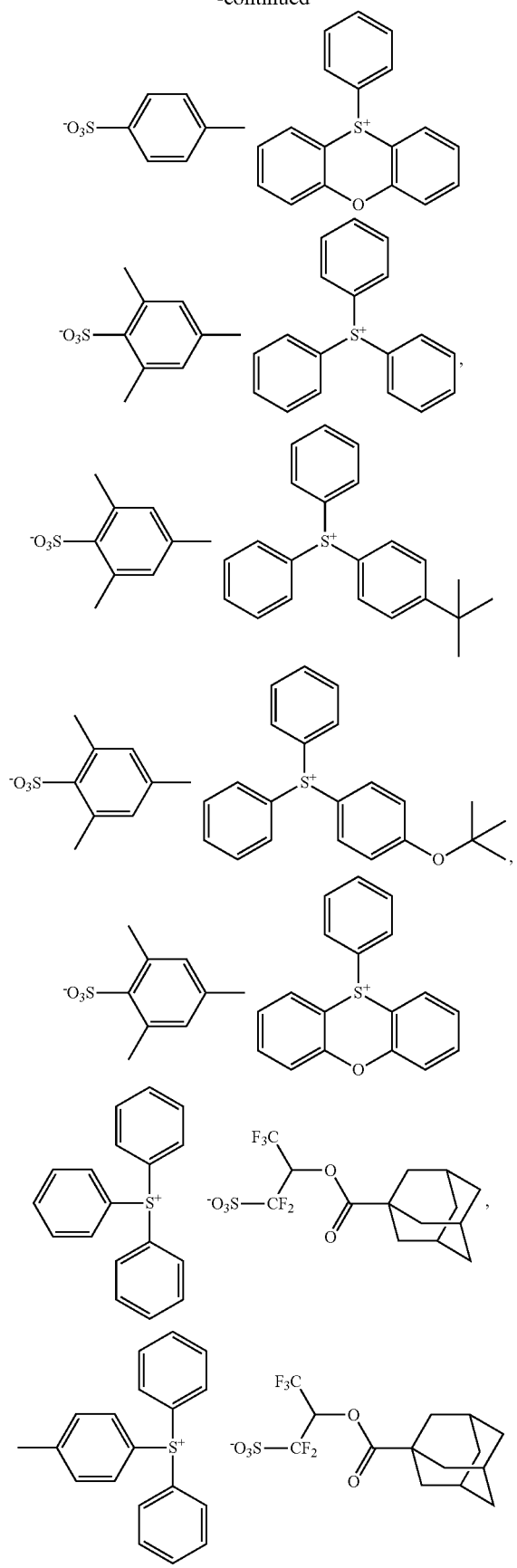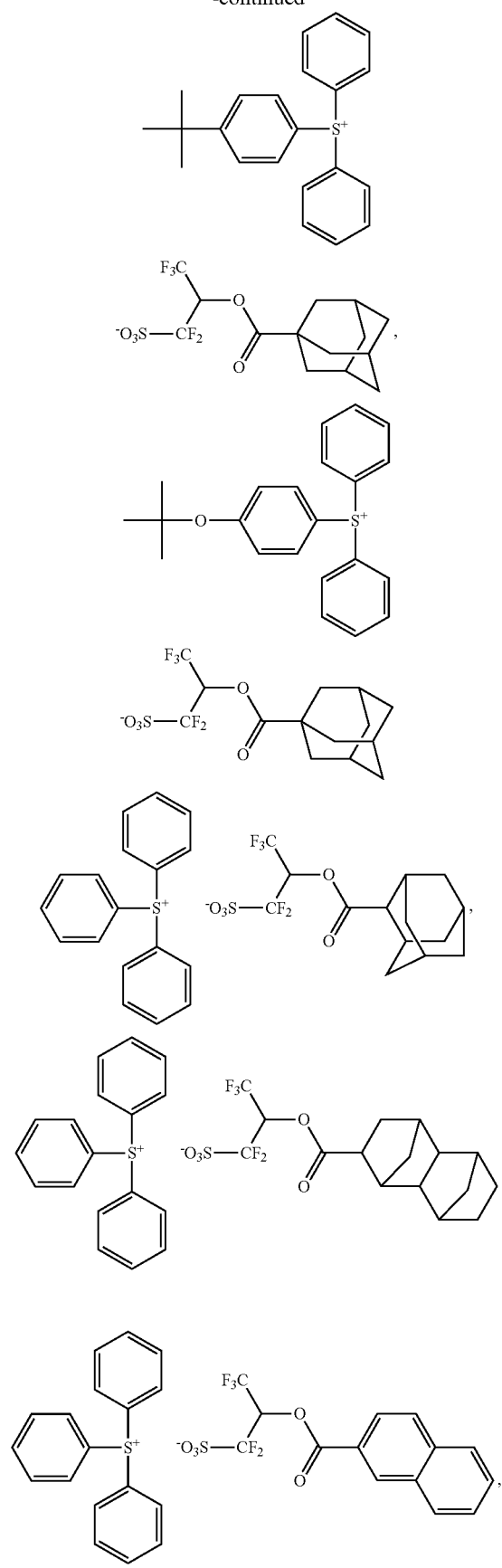

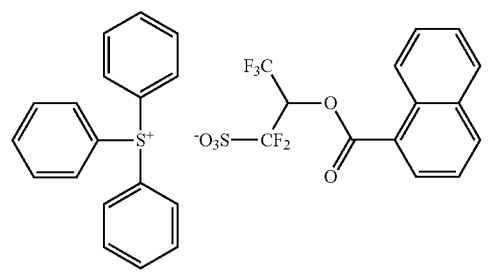
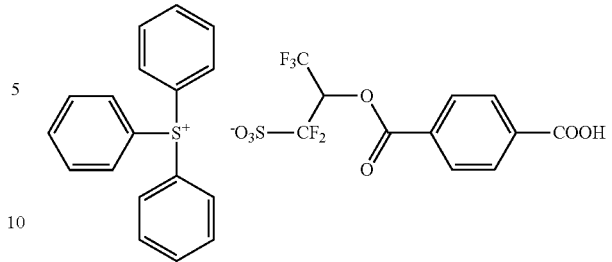
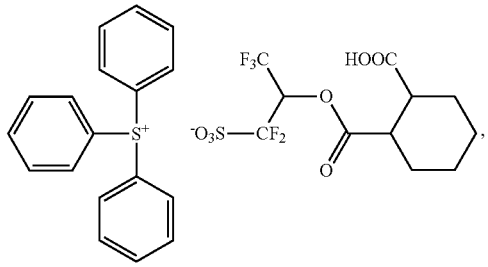
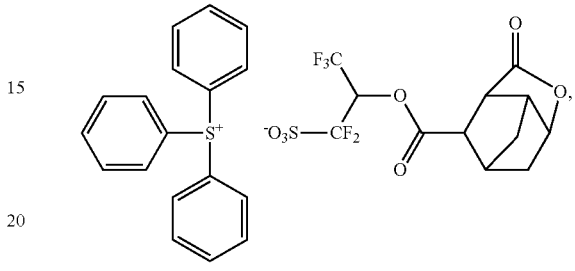
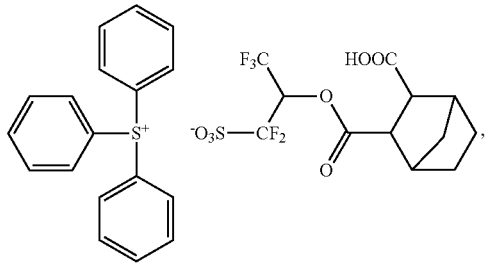
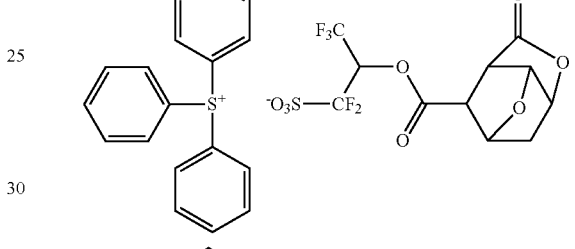
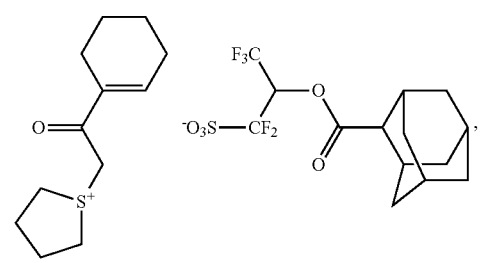
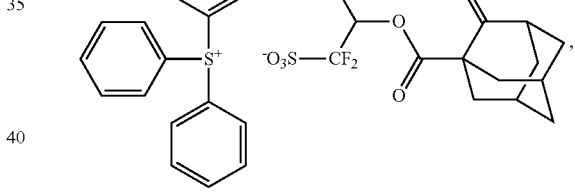
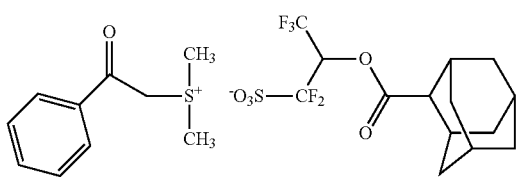
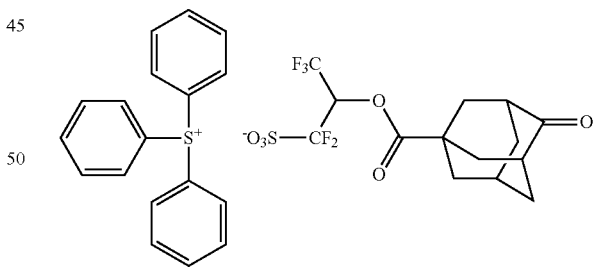
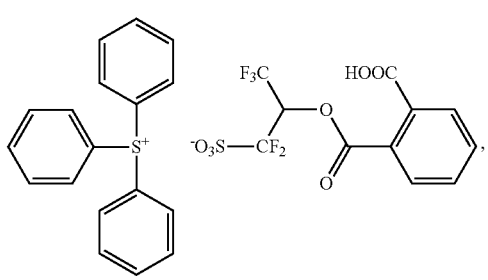
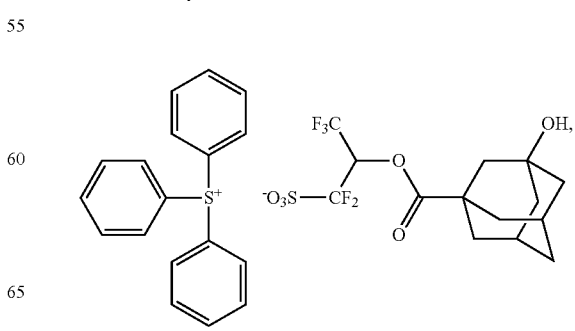

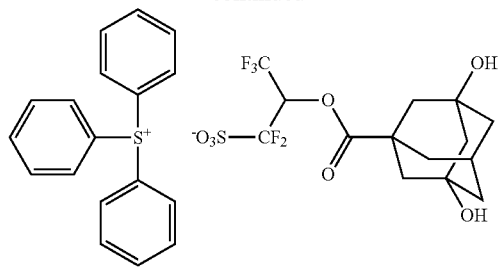
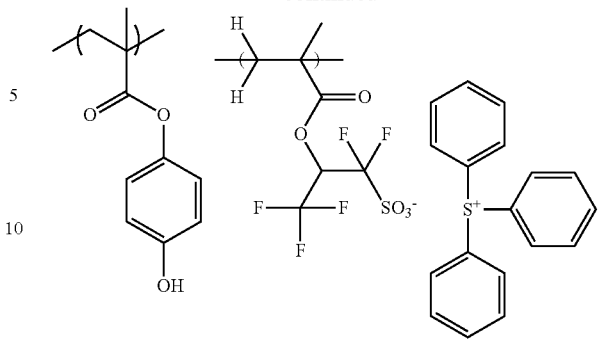
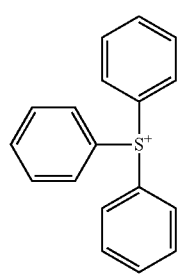
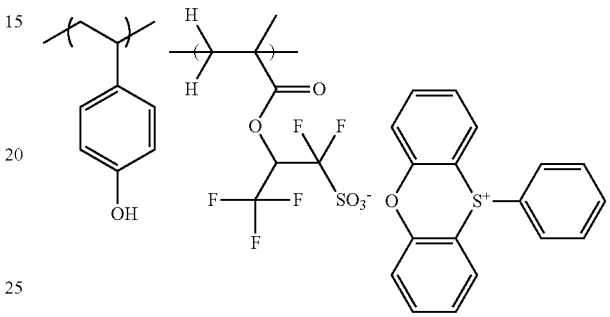
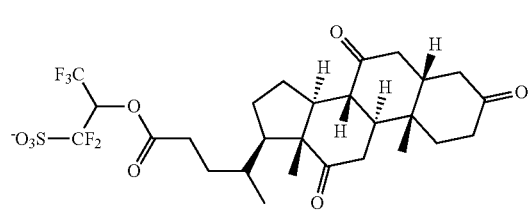
Examples of the polymer having the acid generator incorporated in a side chain from its recurring unit include the following as well as the above-illustrated polymers.
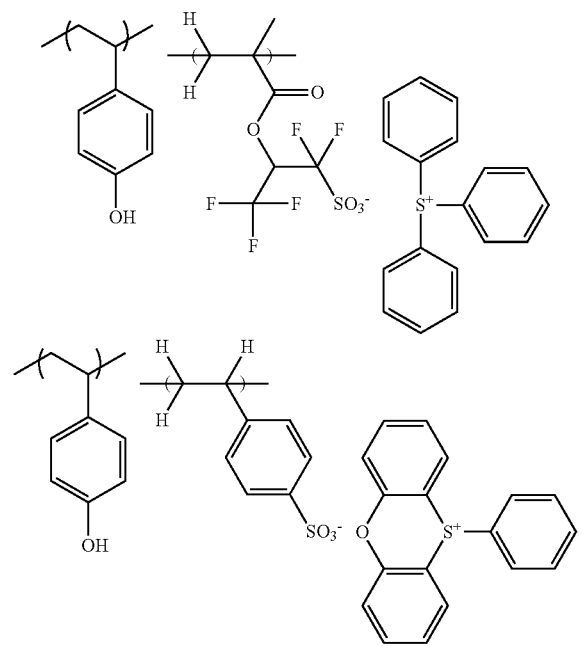
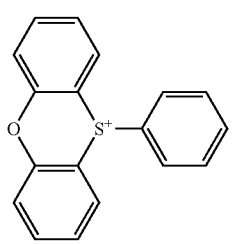

71
-continued
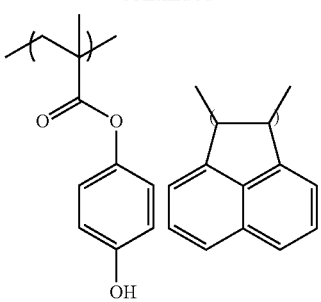
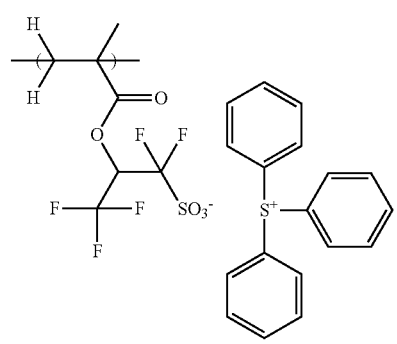
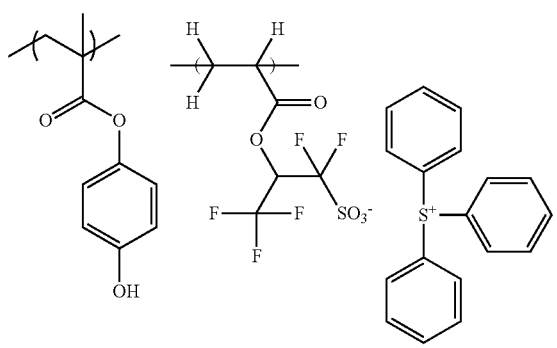
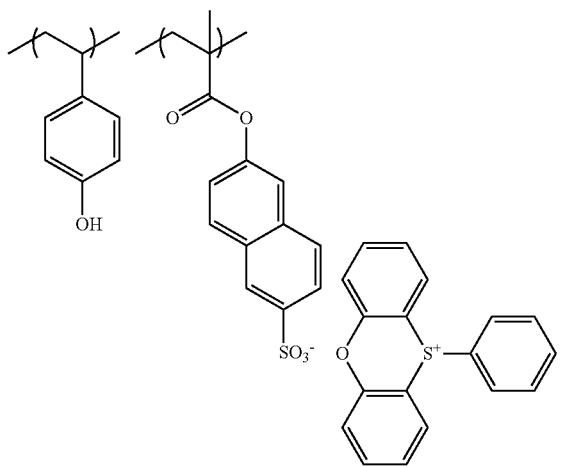
72
-continued
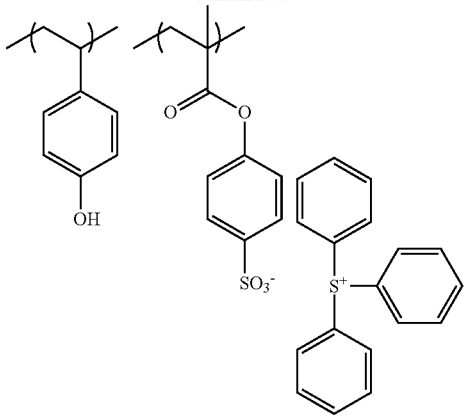
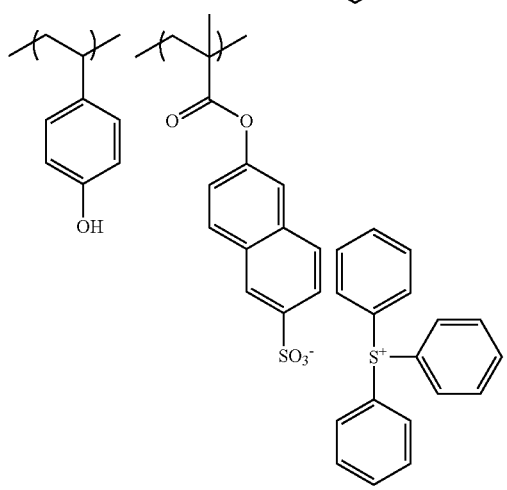
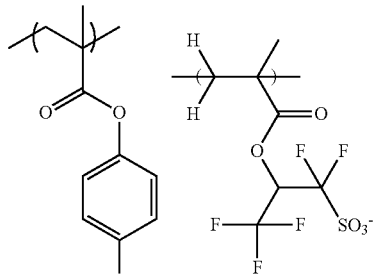
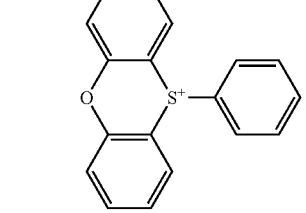

73
-continued
74
-continued
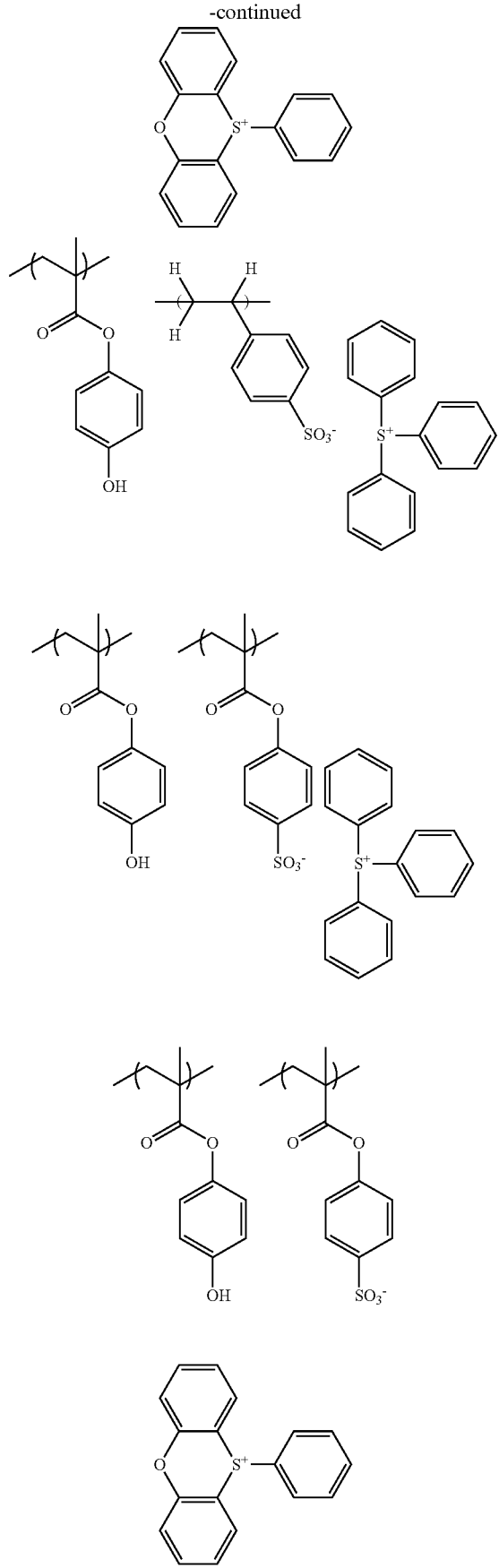
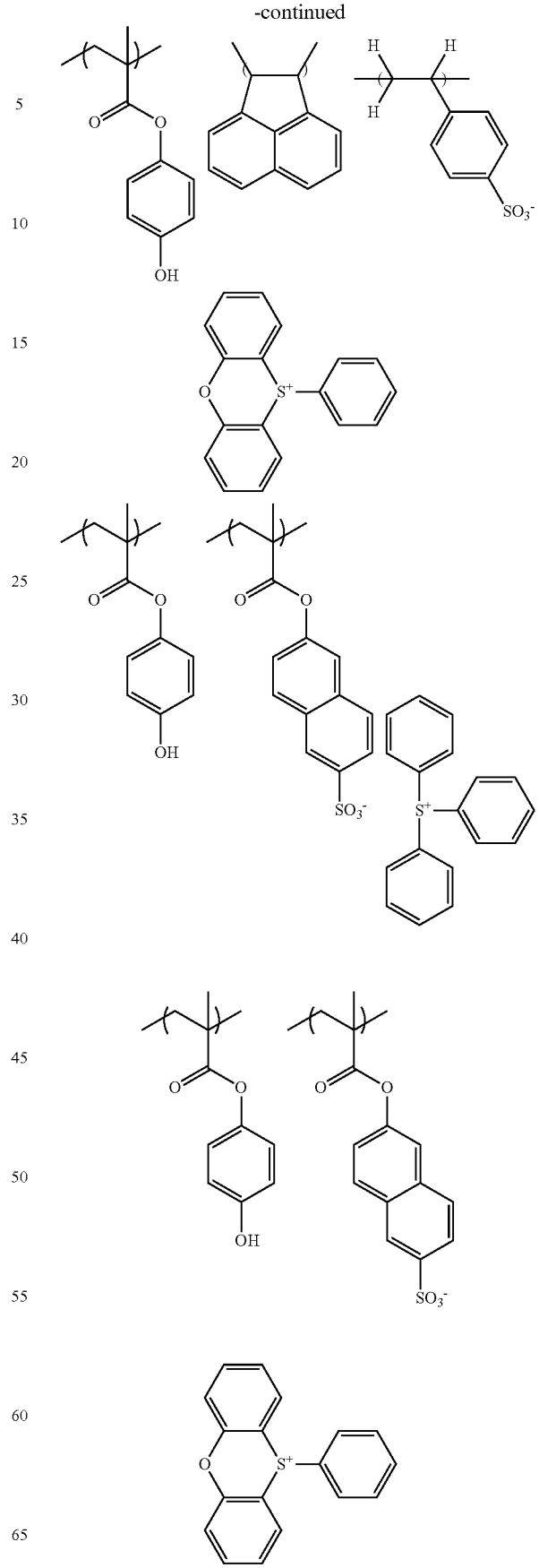

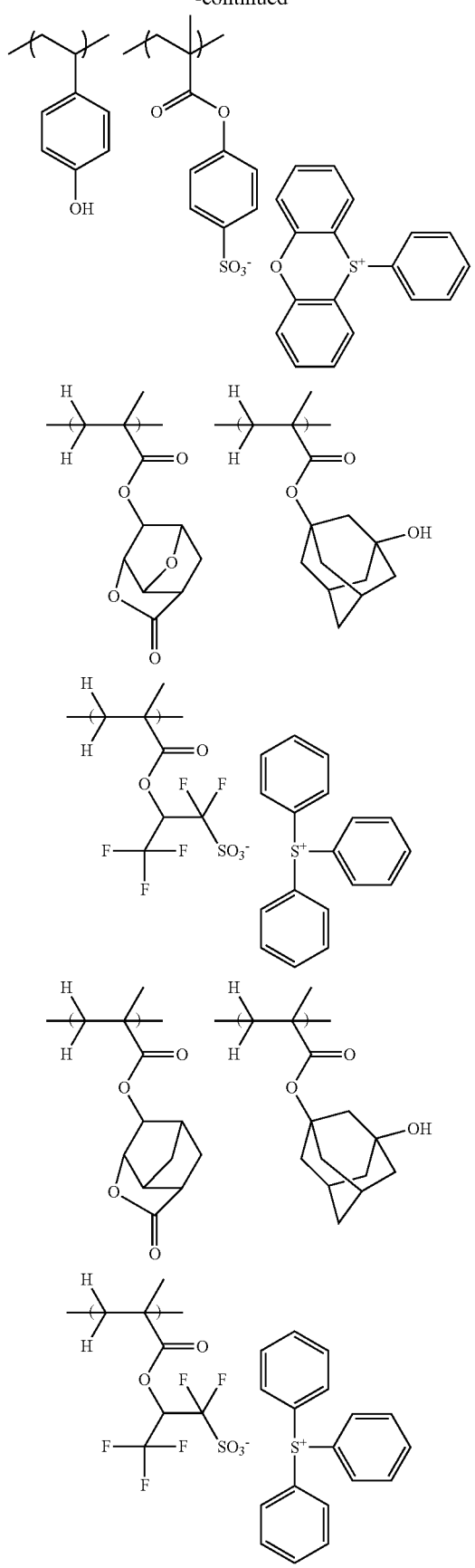
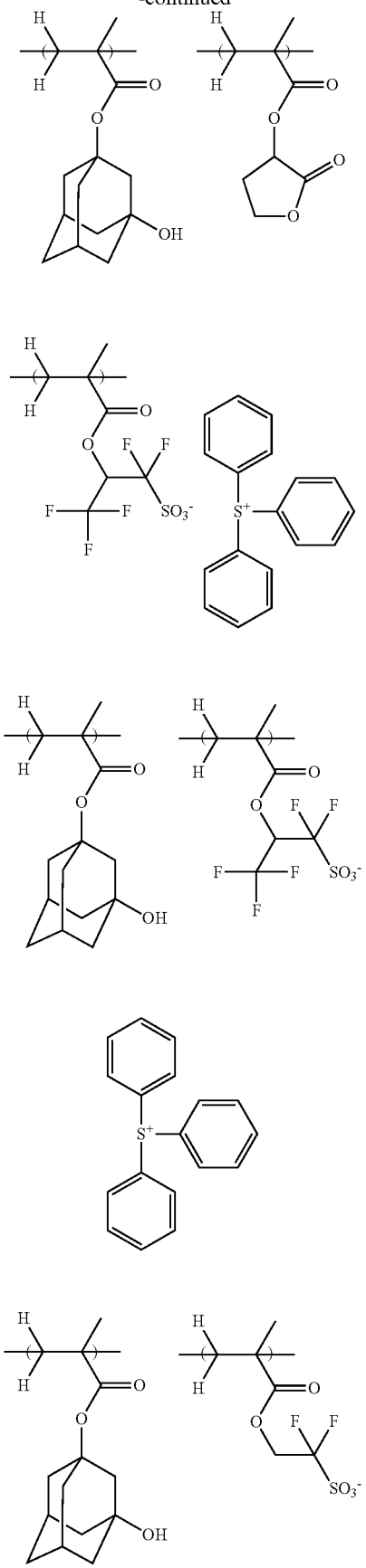

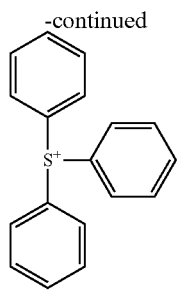

Also useful are the compounds described in Patent Document 5.

The resist composition may be obtained by dissolving the foregoing components in a solvent to be described later and optionally adding other additives such as a basic compound having a molecular weight of up to 1,000, a surfactant, and a dissolution inhibitor.

In the first resist composition, a basic compound need not be positively added because the acid generated is bound to the polymer and displays only limited diffusion. Nevertheless, a basic compound is preferably added in order to provide a high resolution. When used, the basic compound is preferably added in an amount of 0.001 to 10% by weight based on the total weight of the base polymer.

In the second resist composition, a basic compound is generally unnecessary. Nevertheless, it is acceptable to add a basic compound having a molecular weight of up to 1,000 for fine adjustment of a pattern profile such as overhanging at the top or footing near the substrate and fine adjustment of sensitivity. When used, the basic compound is preferably added in an amount of up to 1/20 mole per mole of the acid generator. An excess of the basic compound may compromise the effect of the polymer comprising recurring units of formula (1).

With respect to the basic compound which can be used herein, a number of suitable compounds are known, for example, from Patent Documents 1 to 5. Examples include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, carbamate derivatives, and ammonium salts. Numerous examples of these basic compounds are described in Patent Document 2. Generally any of these basic compounds may be used. Two or more may be selected from these basic compounds and used in admixture.

Examples of the basic compound which is preferably compounded herein include tris(2-(methoxymethoxy)ethyl) amine N-oxide, morpholine derivatives, and imidazole derivatives.

An amine is effective when a resist pattern is formed on a substrate, typically a substrate having a surface layer of chromium compound, which is susceptible to a phenomenon that the resist film becomes substantially insoluble at the substrate interface during pattern formation, known as a footing phenomenon. Specifically, an amine compound or amine oxide compound having a carboxyl group, but free of hydrogen in covalent bond with nitrogen serving as basic center (exclusive of those amine and amine oxide compounds whose nitrogen atom is contained in the cyclic structure of aromatic ring) is effectively used for improving the pattern profile.

Preferred examples of the amine or amine oxide compound having a carboxyl group, but free of hydrogen in covalent bond with nitrogen serving as basic center include compounds of the general formulae (14) to (16), but are not limited thereto.

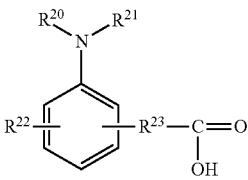

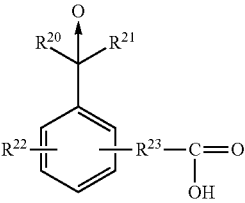

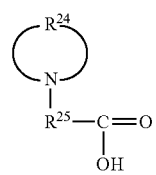

Herein $R^{20}$ and $R^{21}$ are each independently a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl group, or $C_1$-$C_{10}$ alkylthioalkyl group. $R^{20}$ and $R^{21}$ may bond together to form a ring with the nitrogen atom to which they are attached. $R^{22}$ is hydrogen, a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl group, $C_1$-$C_{10}$ alkylthioalkyl group, or halogen. $R^{23}$ is a single bond, a straight, branched or cyclic $C_1$-$C_{20}$ alkylene group, or $C_6$-$C_{20}$ arylene group. $R^{24}$ is an optionally substituted, straight or branched $C_2$-$C_{20}$ alkylene group whose carbon-carbon linkage may be separated by at least one carbonyl (—CO—), ether (—O—), ester (—COO—) or sulfide (—S—) group. $R^{25}$ is a straight, branched or cyclic $C_1$-$C_{20}$ alkylene group or $C_6$-$C_{20}$ arylene group.

Exemplary groups in these structural formulae are given below, but not limited thereto. Suitable $C_6$-$C_{20}$ aryl groups include phenyl, naphthyl, anthryl, phenanthryl, pyrenyl, naphthacenyl, and fluorenyl. Suitable straight, branched or cyclic $C_1$-$C_{20}$ alkyl groups include methyl, ethyl, propyl, isopropyl, butyl, isobutyl, t-butyl, pentyl, hexyl, decyl, cyclopentyl, cyclohexyl, and decahydronaphthalenyl. Suitable $C_7$-$C_{20}$ aralkyl groups include benzyl, phenethyl, phenylpropyl, naphthylmethyl, naphthylethyl, and anthracenylmethyl. Suitable $C_2$-$C_{10}$ hydroxyalkyl groups include hydroxymethyl, hydroxyethyl, and hydroxypropyl. Suitable $C_2$-$C_{10}$ alkoxyalkyl groups include methoxymethyl, 2-methoxyethyl, ethoxymethyl, 2-ethoxyethyl, propoxymethyl, 2-propoxyethyl, butoxymethyl, 2-butoxyethyl, amyloxymethyl, 2-amyloxyethyl, cyclohexyloxymethyl, 2-cyclohexyloxyethyl, cyclopentyloxymethyl, 2-cyclopentyloxyethyl, and isomers of their alkyl moiety. Suitable $C_2$-$C_{10}$ acyloxyalkyl groups include formyloxymethyl, acetoxymethyl, propionyloxymethyl, butyryloxymethyl, pivaloyloxymethyl, cyclohexanecarbonyloxymethyl, and decanoyloxymethyl. Suitable $C_1$-$C_{10}$ alkylthioalkyl groups include methylthiomethyl, ethylthiomethyl, propylthiomethyl, isopropylthiomethyl, butylthiomethyl, isobutylthiomethyl, t-butylthiomethyl, t-amylthiomethyl, decylthiomethyl, and cyclohexylthiomethyl.

Preferred examples of the amine compound of formula (14) include, but are not limited thereto,
o-dimethylaminobenzoic acid, p-dimethylaminobenzoic acid,
m-dimethylaminobenzoic acid, p-diethylaminobenzoic acid, p-dipropylaminobenzoic acid, p-dibutylaminobenzoic acid, p-dipentylaminobenzoic acid, p-dihexylaminobenzoic acid, p-diethanolaminobenzoic acid,
p-diisopropanolaminobenzoic acid,
p-dimethanolaminobenzoic acid,
2-methyl-4-diethylaminobenzoic acid,
2-methoxy-4-diethylaminobenzoic acid,
3-dimethylamino-2-naphthalenic acid,
3-diethylamino-2-naphthalenic acid,
2-dimethylamino-5-bromobenzoic acid,
2-dimethylamino-5-chlorobenzoic acid,
2-dimethylamino-5-iodobenzoic acid,
2-dimethylamino-5-hydroxybenzoic acid,
4-dimethylaminophenylacetic acid,
4-dimethylaminophenylpropionic acid,
4-dimethylaminophenylbutyric acid,
4-dimethylaminophenylmalic acid,
4-dimethylaminophenylpyruvic acid,
4-dimethylaminophenyllacetic acid,
2-(4-dimethylaminophenyl)benzoic acid, and
2-(4-(dibutylamino)-2-hydroxybenzoyl)benzoic acid.

Preferred examples of the amine oxide compound of formula (15) include oxidized forms of exemplary amine compounds of formula (14), but are not limited thereto.

Preferred examples of the amine compound of formula (16) include, but are not limited thereto, 1-piperidinepropionic acid, 1-piperidinebutyric acid, 1-piperidinemalic acid, 1-piperidinepyruvic acid, and 1-piperidinelactic acid.

Some of the compounds having an amine oxide structure represented by formula (15) are existing and some are novel compounds. They may be prepared by selecting an optimum method in accordance with a particular structure. Exemplary non-limiting methods include oxidizing reaction of a nitrogen-containing compound using an oxidizing agent and oxidizing reaction of a nitrogen-containing compound in a hydrogen peroxide water diluted solution. These methods are described below in detail.

One exemplary method for preparing a nitrogen-containing alcohol compound through esterifying reaction is shown below. This method is applicable to the synthesis of a compound of formula (15).

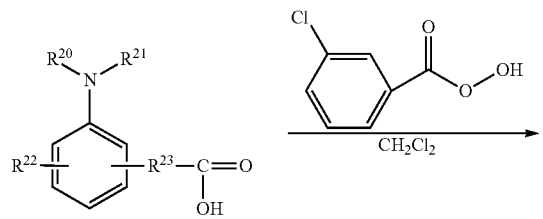

-continued

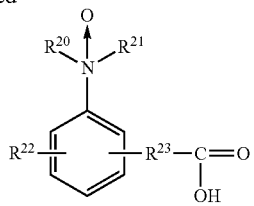

Herein $R^{20}$ to $R^{23}$ are as defined above.

This reaction is an oxidizing reaction of an amine using an oxidizing agent, m-chloroperbenzoic acid. The reaction may be performed using other oxidizing agents commonly employed in standard oxidizing reaction. Following the reaction, the reaction mixture may be purified by standard techniques such as distillation, chromatography and recrystallization. Reference is made to Patent Document 6.

To the resist composition, any of surfactants commonly used for improving coating characteristics may be added. While a number of surfactants are well known and described in Patent Documents 1 to 6, any suitable one may be selected therefrom.

In the resist composition, the surfactant is preferably added in an amount of up to 2 parts, and more preferably up to 1 part by weight, per 100 parts by weight of the base polymer. When used, the surfactant is preferably added in an amount of at least 0.01 part by weight.

An organic solvent may be used in the preparation of the resist composition. It may be any of organic solvents in which the base polymer, acid generator and other additives are dissolvable. Suitable organic solvents include, but are not limited to, ketones such as cyclohexanone and methyl n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in admixture. Of these solvents, ethyl lactate, propylene glycol monomethyl ether, PGMEA, and mixtures thereof are preferred because the acid generator is most soluble therein.

In the resist composition, the organic solvent is preferably used in an amount of 1,000 to 10,000 parts by weight, more preferably 2,000 to 9,700 parts by weight per 100 parts by weight of the base polymer. When adjusted to such a concentration, the resist composition is applicable by a spin coating technique to form a resist film having a thickness of 10 to 200 nm and an improved flatness in a consistent manner.

Process

Pattern formation using the resist composition of the invention may be performed by well-known lithography processes. The process generally involves coating, exposure to high-energy radiation, and development with alkaline developer. The resist composition is first applied onto a substrate for IC fabrication (e.g., Si, $SiO_2$, SiN, SiON, TiN, WSi, BPSG, SOG or organic antireflective coating) or a substrate for mask circuit fabrication (e.g., Cr, CrO, CrON or MoSi) by a suitable coating technique such as spin coating. The coating is prebaked on a hot plate at a temperature of 60 to 150° C. for 1 to 10 minutes, preferably 80 to 140° C. for 1 to 5 minutes to form a resist film of 0.05 to 2.0 μm thick.

Then the resist film is exposed to high-energy radiation (e.g., DUV, excimer laser or X-ray) through a mask having a desired pattern. Alternatively, a pattern is written on the resist film directly with EB. The exposure dose is preferably 1 to 200 mJ/cm$^2$, more preferably 10 to 100 mJ/cm$^2$. The exposure may be performed by conventional lithography whereas the immersion lithography of holding a liquid between the mask and the resist film may be employed if desired. In this case, a protective film which is insoluble in water may be applied on the resist film. The resist film is then baked (PEB) on a hot plate at 60 to 150° C. for 1 to 5 minutes, preferably 80 to 140° C. for 1 to 3 minutes. Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle and spray techniques. In this way, a desired resist pattern is formed on the substrate.

One advantage of the resist composition is high etch resistance. Also the resist composition is effective when it is required that the pattern experience a minimal change of line width even when the duration between exposure and PEB is prolonged.

EXAMPLE

Synthesis Examples, Examples, and Comparative Examples are given below by way of illustration and not by way of limitation. The average molecular weights including weight average molecular weight (Mw) and number average molecular weight (Mn) are determined by gel permeation chromatography (GPC) versus polystyrene standards, from which a dispersity (Mw/Mn) is computed. Me stands for methyl. The compositional ratio of a copolymer is on a molar basis.

Monomer Synthesis Example 1

Preparation of triphenylsulfonium 2,2-difluoro-3-methacryloyloxypentanoate

A 1-L glass flask equipped with a dropping funnel was charged with 108 g (0.486 mol) of 1-hydroxycarbonyl-1,1-difluoro-2-butyl methacrylate and 108 g of chloroform, which were stirred and cooled at 0° C. Then 224 g (0.560 mol/1.15 equivalent) of a 10 wt % sodium hydroxide aqueous solution was added dropwise to the solution, which was stirred at room temperature for 1 hour. Then 169 g (0.492 mol/1.01 equivalent) of triphenylsulfonium bromide in 432 g of chloroform was added to the solution, which was stirred at room temperature for 1 hour. After the completion of reaction was confirmed by $^1$H-NMR spectroscopy, an organic layer was separated from the reaction liquid and washed 3 times with 300 g of water. The organic layer was concentrated in vacuum, obtaining 238 g (yield 81%, purity 80%) of triphenylsulfonium 2,2-difluoro-3-methacryloyloxypentanoate, designated Monomer Z-1, having the following structure.

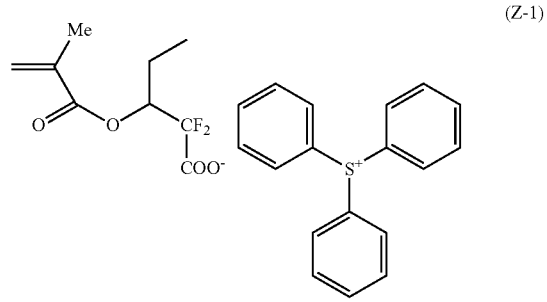

(Z-1)

Identification of triphenylsulfonium 2,2-difluoro-3-methacryloyloxypentanoate $^1$H-NMR (measurement solvent: heavy chloroform, reference: tetramethylsilane); δ=7.67 (m, 15H; Ph group), 6.10 (s, 1H; =CH$_2$), 5.53 (m, 1H; CH—O), 5.47 (s, 1H; =CH$_2$), 1.86 (s, 3H; CH$_3$—C), 1.84 (m, 1H; CH$_2$ of CH—CH$_2$CH$_3$), 1.71 (m, 1H; CH$_2$ of CH—CH$_2$CH$_3$), 0.83 (t, J=7.6 Hz, 3H; CH$_3$ of CH—CH$_2$CH$_3$)

$^{19}$F-NMR (measurement solvent: heavy chloroform, reference: trichlorofluoromethane); δ=−111.52 (d, J=244 Hz, 1F), −118.07 (d, J=244 Hz, 1F)

Polymer Synthesis Example 1

In a 200-mL dropping funnel under nitrogen blanket, a solution was prepared by dissolving 13.74 g of 4-hydroquinone monomethacrylate, 3.00 g of acenaphthylene, 12.47 g of 4-amyloxystyrene, 0.79 g of Monomer Z-1, and 3.02 g of dimethyl 2,2'-azobis(2-methylpropionate) (V601, Wako Pure Chemical Industries, Ltd.) in 42 g of methyl ethyl ketone (MEK) as a solvent. A 200-mL polymerization flask was purged with nitrogen, charged with 28 g of MEK, and heated at 80° C., after which the solution was added dropwise to the flask over 4 hours. After the completion of dropwise addition, stirring was continued for 4 hours to effect polymerization while maintaining the temperature of 80° C. The polymerization solution was then cooled down to room temperature and added dropwise to 600 g of hexane for precipitation. The copolymer precipitate was collected by filtration and washed twice with 150 g of hexane. The mass collected by filtration was dissolved in 70 g of MEK. The MEK solution was passed through a nylon filter with a pore size of 0.02 μm and added dropwise to 600 g of hexane for precipitation. The copolymer precipitate was collected by filtration, washed twice with 150 g of hexane, and dried, yielding 28 g of a white copolymer, designated Polymer 1, having Mw=3,530 and Mw/Mn=1.40.

Polymer Synthesis Example 2

In a 200-mL dropping funnel under nitrogen blanket, a solution was prepared by dissolving 25.24 g of 4-(1-ethoxyethoxy)styrene, 4.0 g of acenaphthylene, 19.48 g of 4-amyloxystyrene, 1.27 g of Monomer Z-1, and 4.84 g of dimethyl 2,2'-azobis(2-methylpropionate) (V601, Wako Pure Chemical Industries, Ltd.) in 64 g of methyl ethyl ketone (MEK) as a solvent. A 300-mL polymerization flask was purged with nitrogen, charged with 50 g of MEK, and heated at 80° C., after which the solution was added dropwise to the flask over 4 hours. After the completion of dropwise addition, stirring was continued for 18 hours to effect polymerization while maintaining the temperature of 80° C. The polymerization solution was then cooled down to room temperature and concentrated. To the concentrate were added 54 g of tetrahydrofuran (THF), 18 g of methanol, and 0.85 g of oxalic acid dihydrate. The mixture was stirred for 3 hours at 50° C. The reaction solution was added dropwise to a mixture of 360 g of hexane and 360 g of diisopropyl ether for precipitation. The copolymer precipitate was collected by filtration and washed twice with a mixture of 150 g of hexane and 150 g of diisopropyl ether. The solid was dissolved in 90 g of acetone. The acetone solution was passed through a nylon filter with a pore size of 0.02 μm and added dropwise to 1350 g of water for precipitation. The copolymer precipitate was collected by filtration, washed twice with 200 g of water, and dried, yielding 35 g of a grayish white copolymer, designated Polymer 3, having Mw=3,840 and Mw/Mn=1.45.

Polymer Synthesis Example 3

A polymer was obtained by introducing hydroxystyrene units according to the same procedure as Polymer Synthesis Example 2 except that the type and amount of monomers were changed. This polymer, 10 g, was dissolved in 25 g of THF. To this solution was added 2.8 g of 1-methoxy-2-methyl-1-propene under acidic conditions including a catalytic amount (0.6 g) of methanesulfonic acid at a temperature of 0-10° C. to react at a temperature of 0-10° C. for 10 hours. After the completion of reaction, the reaction solution was neutralized with 1.05 equivalents (per equivalent of the methanesulfonic acid) of triethylamine. The thus obtained solution was added to a mixed solution of 75 g of hexane and 75 g of diisopropylether to deposit an acetal-modified copolymer, which was then separated by filtration. The separated copolymer was washed twice with 50 g of diisopropylether. The copolymer was dissolved in 50 g of ethyl acetate, washed with water, and separated, which cycle was repeated three times. After the final separation, ethyl acetate was removed from the organic layer or ethyl acetate solution. The resulting acetal-modified copolymer was dissolved in 30 g of acetone, and the solution was added to 1,000 g of water to deposit the acetal-modified copolymer, which was then separated by filtration. The separated copolymer was wash twice with 100 g of water and then dried in vacuo at 40° C. for 20 hours, yielding 10 g of a white acetal-modified copolymer, designated Polymer 6, having Mw=5,500 and Mw/Mn=1.43.

With respect to the deprotection and protection of polyhydroxystyrene derivative, reference may be made to Patent Documents 7 and 8.

Polymer Synthesis Example 4

A flask in nitrogen atmosphere was charged with 168.6 g of 2-ethyladamantan-2-yl methacrylate, 85.5 g of 3-hydroxy-1-adamantyl methacrylate, 172.1 g of 2-oxotetrahydrofuran-3-yl methacrylate, 11.3 g of Monomer Z-1, and 510 g of propylene glycol methyl ether acetate (PMA) to form a monomer solution. An initiator solution was prepared by combining 14.86 g of 2,2'-azobisisobutyronitrile and 2.6 g of 2-mercaptoethanol with 127 g of PMA. Another flask in nitrogen atmosphere was charged with 292 g of PMA and heated at 80° C. with stirring, after which the monomer solution and the initiator solution were simultaneously added dropwise over 4 hours. After the completion of dropwise addition, stirring was continued for 2 hours to effect polymerization while maintaining the temperature of 80° C. Thereafter, the polymerization solution was cooled down to room temperature and added dropwise to 12 kg of methanol under vigorous stirring, for precipitation. The copolymer precipitate was collected by filtration, washed twice with 3 kg of methanol, and vacuum dried at 50° C. for 20 hours, yielding 384 g of a copolymer in white powder form, designated Polymer 12, having Mw=7,130 and Mw/Mn=1.60.

Synthesis of Polymers 2, 4, 5, 7 to 11, 13 to 42

Resins (Polymers) shown in Table 1 were synthesized by the same procedure as Polymer Synthesis Example 1, 2, 3 or 4 except that the type and amount of monomers were changed. The units 1 to 5 in Table 1 have the structure shown in Tables 2 to 7. In Table 1, a ratio of each unit incorporated is on a molar basis.

TABLE 1

| Resin | Unit 1 (ratio) | Unit 2 (ratio) | Unit 3 (ratio) | Unit 4 (ratio) | Unit 5 (ratio) |
|---|---|---|---|---|---|
| Polymer 1 | A-1 (0.47) | B-1 (0.40) | D-2 (0.12) | Z-1 (0.01) | — |
| Polymer 2 | A-1 (0.51) | B-1 (0.35) | D-1 (0.13) | Z-1 (0.01) | — |
| Polymer 3 | A-2 (0.50) | B-1 (0.39) | D-2 (0.10) | Z-1 (0.01) | — |
| Polymer 4 | A-3 (0.50) | B-1 (0.39) | D-2 (0.10) | Z-1 (0.01) | — |
| Polymer 5 | A-1 (0.47) | B-2 (0.40) | D-2 (0.12) | Z-1 (0.01) | — |
| Polymer 6 | A-1 (0.55) | C-1 (0.25) | D-2 (0.19) | Z-1 (0.01) | — |
| Polymer 7 | A-1 (0.55) | C-2 (0.25) | D-2 (0.19) | Z-1 (0.01) | — |
| Polymer 8 | A-1 (0.60) | C-3 (0.20) | D-2 (0.19) | Z-1 (0.01) | — |
| Polymer 9 | A-2 (0.71) | C-3 (0.18) | D-2 (0.10) | Z-1 (0.01) | — |
| Polymer 10 | A-1 (0.55) | C-4 (0.25) | D-2 (0.19) | Z-1 (0.01) | — |
| Polymer 11 | A-1 (0.60) | C-5 (0.20) | D-2 (0.19) | Z-1 (0.01) | — |
| Polymer 12 | B-5 (0.33) | E-1 (0.18) | E-6 (0.48) | Z-1 (0.01) | — |
| Polymer 13 | B-3 (0.33) | E-1 (0.18) | E-6 (0.48) | Z-1 (0.01) | — |
| Polymer 14 | B-4 (0.33) | E-1 (0.18) | E-6 (0.48) | Z-1 (0.01) | — |
| Polymer 15 | B-6 (0.33) | E-1 (0.18) | E-6 (0.48) | Z-1 (0.01) | — |
| Polymer 16 | B-7 (0.33) | E-1 (0.18) | E-6 (0.48) | Z-1 (0.01) | — |
| Polymer 17 | B-8 (0.33) | E-1 (0.18) | E-6 (0.48) | Z-1 (0.01) | — |
| Polymer 18 | B-5 (0.33) | E-2 (0.18) | E-3 (0.48) | Z-1 (0.01) | — |
| Polymer 19 | B-5 (0.33) | E-4 (0.18) | E-5 (0.48) | Z-1 (0.01) | — |
| Polymer 20 | B-5 (0.33) | E-7 (0.18) | E-8 (0.48) | Z-1 (0.01) | — |
| Polymer 21 | B-5 (0.33) | E-1 (0.18) | E-9 (0.48) | Z-1 (0.01) | — |
| Polymer 22 | B-5 (0.25) | E-1 (0.20) | E-6 (0.44) | Z-1 (0.01) | F-1 (0.10) |
| Polymer 23 | B-5 (0.25) | E-1 (0.20) | E-6 (0.44) | Z-1 (0.01) | F-2 (0.10) |
| Polymer 24 | B-5 (0.25) | E-1 (0.20) | E-6 (0.44) | Z-1 (0.01) | F-3 (0.10) |
| Polymer 25 | B-5 (0.25) | E-1 (0.20) | E-6 (0.44) | Z-1 (0.01) | F-4 (0.10) |
| Polymer 26 | B-5 (0.25) | E-1 (0.20) | E-6 (0.44) | Z-1 (0.01) | F-5 (0.10) |
| Polymer 27 | A-1 (0.45) | B-1 (0.38) | D-2 (0.12) | Z-1 (0.05) | — |
| Polymer 28 | A-2 (0.50) | B-1 (0.30) | D-2 (0.15) | Z-1 (0.05) | — |
| Polymer 29 | B-5 (0.28) | E-1 (0.18) | E-6 (0.49) | Z-1 (0.05) | — |
| Polymer 30 | A-1 (0.45) | B-1 (0.32) | D-2 (0.13) | Z-1 (0.10) | — |
| Polymer 31 | A-2 (0.50) | B-1 (0.30) | D-2 (0.10) | Z-1 (0.10) | — |
| Polymer 32 | A-1 (0.45) | B-2 (0.32) | D-2 (0.13) | Z-1 (0.10) | — |
| Polymer 33 | A-2 (0.50) | B-2 (0.30) | D-2 (0.10) | Z-1 (0.10) | — |
| Polymer 34 | A-2 (0.60) | C-2 (0.20) | D-2 (0.10) | Z-1 (0.10) | — |
| Polymer 35 | A-2 (0.65) | C-3 (0.15) | D-2 (0.10) | Z-1 (0.10) | — |
| Polymer 36 | B-5 (0.28) | E-1 (0.15) | E-6 (0.47) | Z-1 (0.10) | — |
| Polymer 37 | A-1 (0.80) | Z-1 (0.20) | — | — | — |
| Polymer 38 | A-2 (0.80) | Z-1 (0.20) | — | — | — |
| Polymer 39 | A-1 (0.60) | Z-1 (0.40) | — | — | — |
| Polymer 40 | A-2 (0.60) | Z-1 (0.40) | — | — | — |
| Polymer 41 | E-1 (0.80) | Z-1 (0.20) | — | — | — |
| Polymer 42 | E-1 (0.60) | Z-1 (0.40) | — | — | — |

TABLE 2

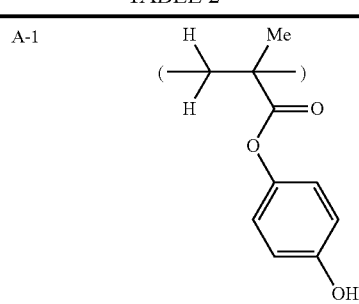

A-1

TABLE 2-continued
A-2 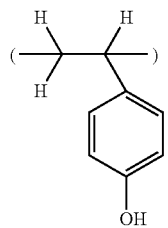
A-3 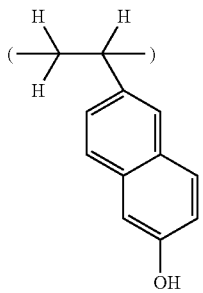
TABLE 3
B-1 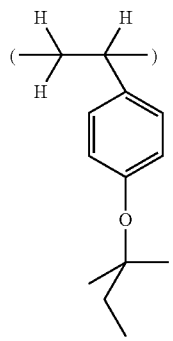
B-2 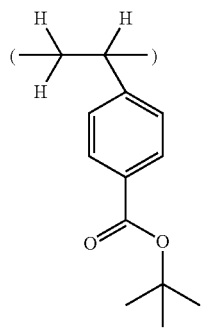
B-3 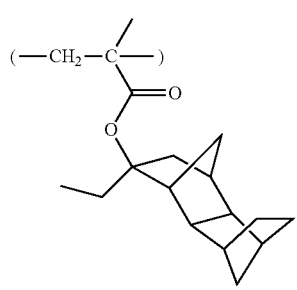
TABLE 3-continued
B-4 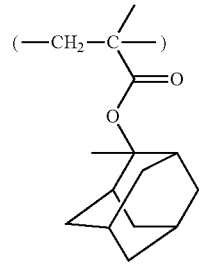
B-5 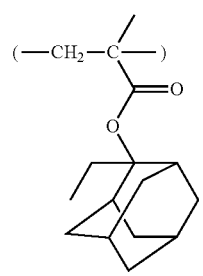
B-6 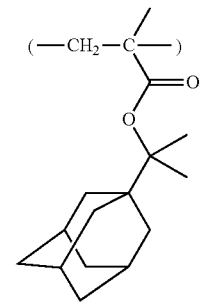
B-7 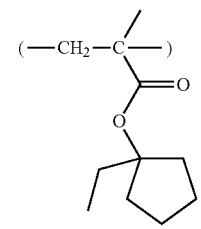
B-8 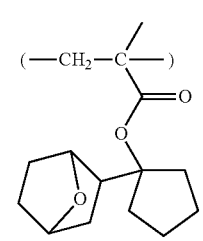

TABLE 4
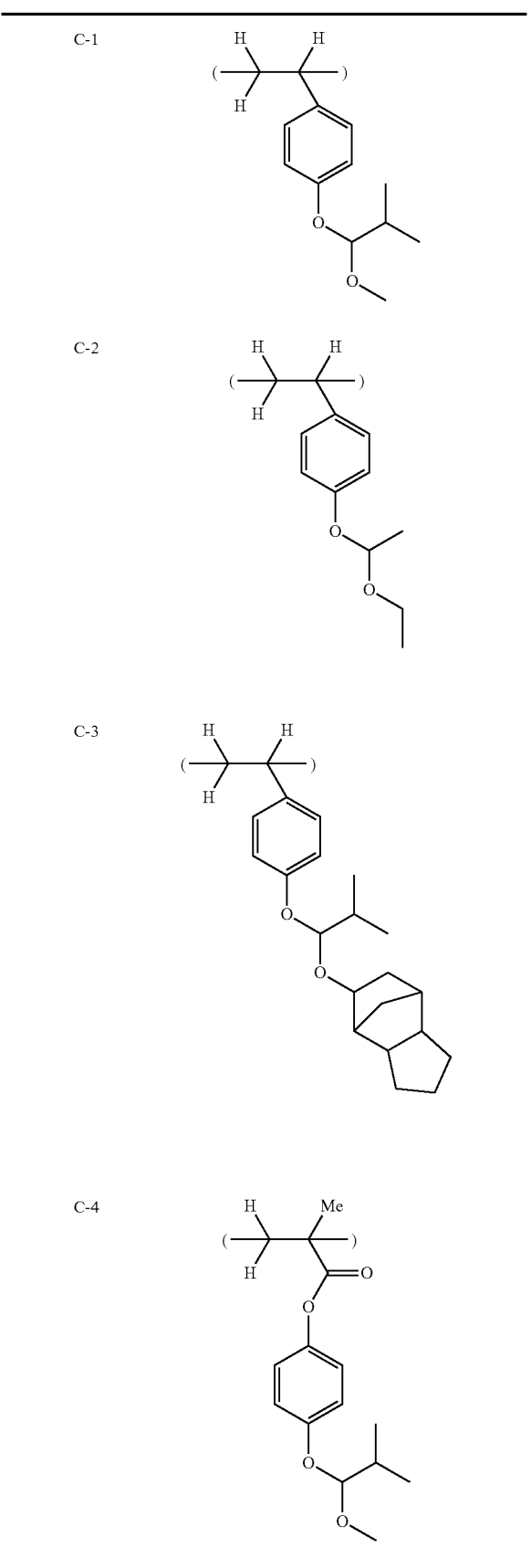
TABLE 4-continued
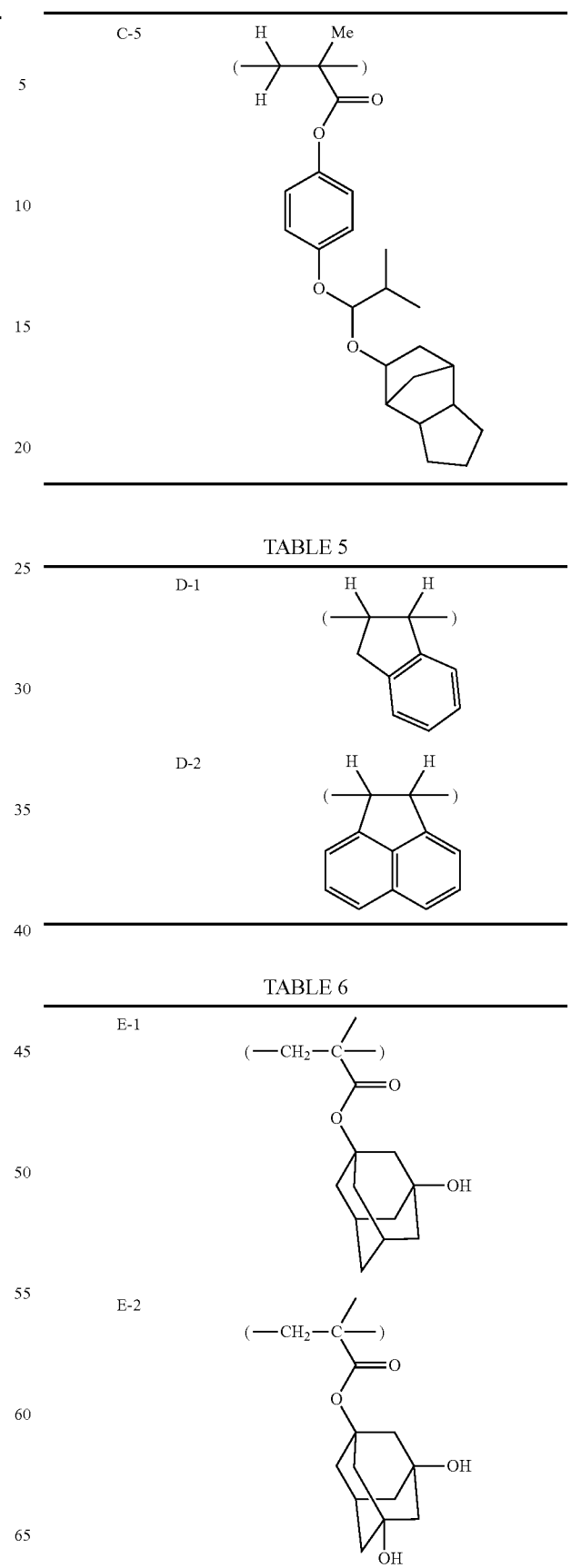
TABLE 5
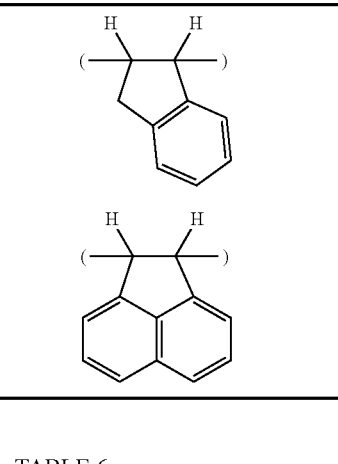
TABLE 6
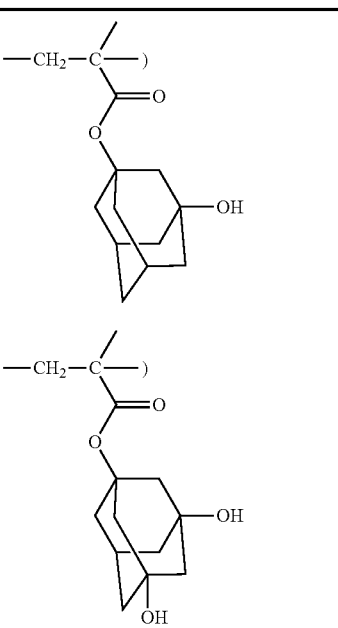

TABLE 6-continued
E-3 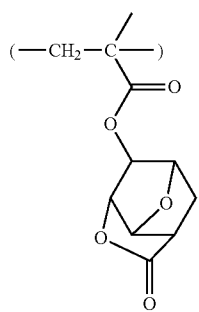
E-4 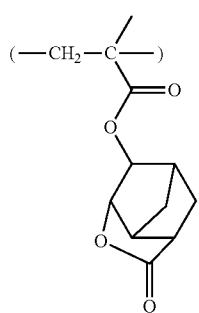
E-5 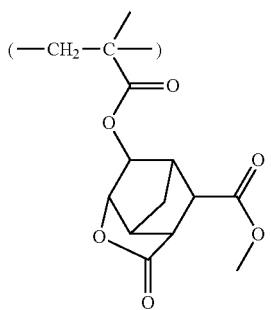
E-6 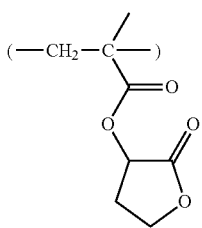
E-7 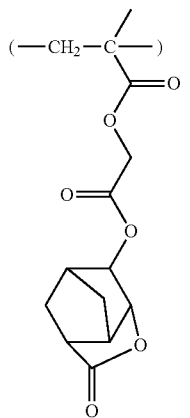
TABLE 6-continued
E-8 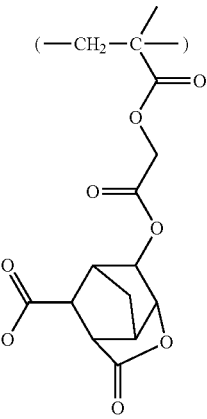
E-9 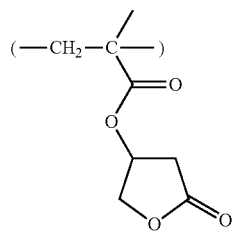
TABLE 7
F-1 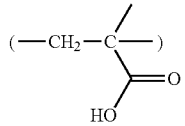
F-2 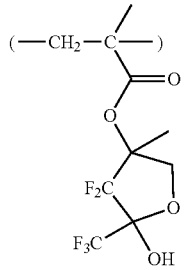
F-3 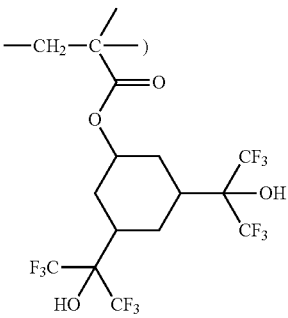

TABLE 7-continued

F-4

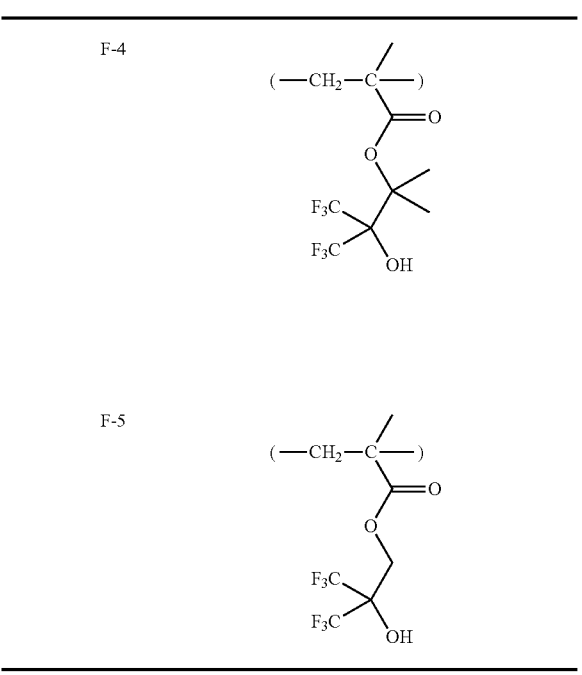

F-5

Examples 1 to 50 & Comparative Examples 1 to 3

Preparation of Positive Resist Compositions

Resist compositions were prepared by using the synthesized polymers (Polymers 1 to 42) and other polymers (Polymers K, M, N, P, Q, R, and S as identified below), and dissolving the polymers, an acid generator (PAG-A), and a basic compound (Base-1) in an organic solvent mixture in accordance with the recipe shown in Tables 8 and 9. These compositions were each filtered through a nylon or UPE filter having a pore size of 0.02 μm, thereby giving positive resist composition solutions.

Polymer K

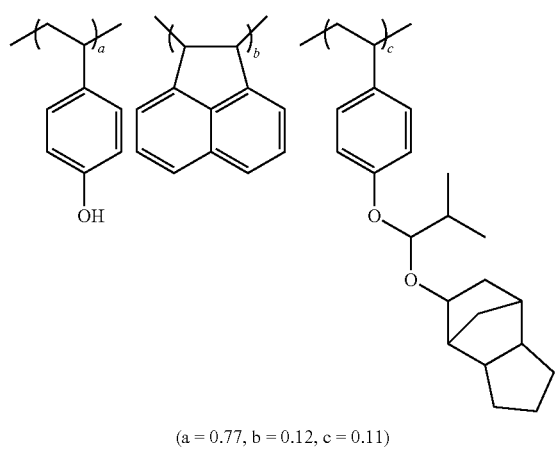

(a = 0.77, b = 0.12, c = 0.11)

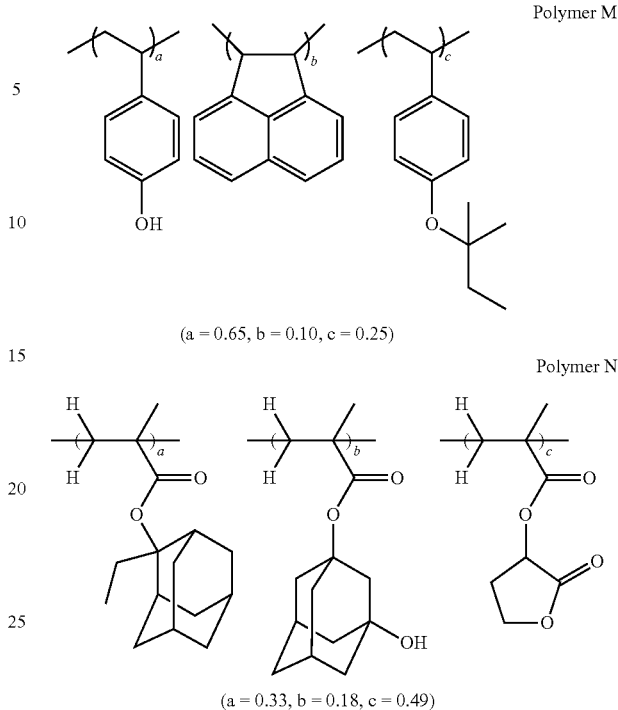

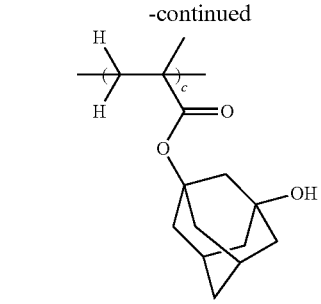

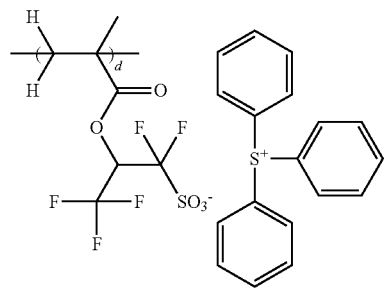

(a = 0.30, b = 0.18, c = 0.47, d = 0.05)

Polymer R

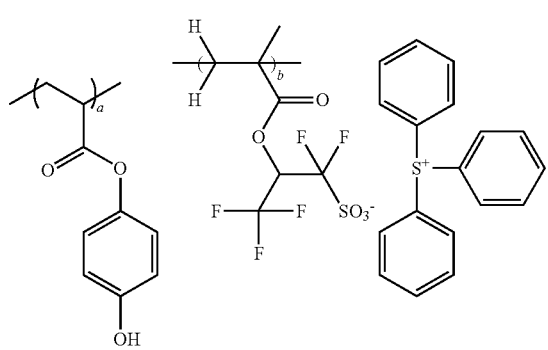

(a = 0.60, b = 0.40)

Polymer S

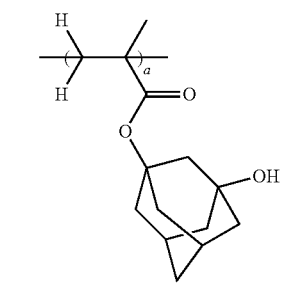

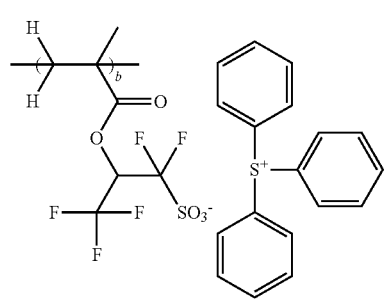

(a = 0.60, b = 0.40)

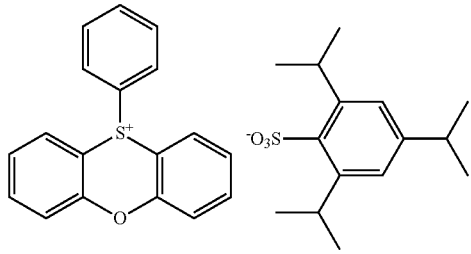

PAG-A

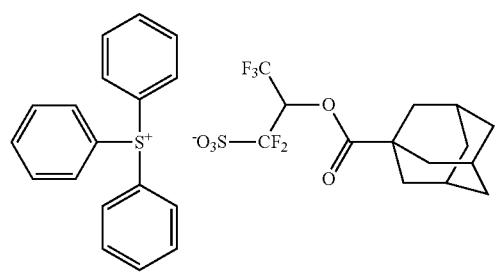

PAG-B

Base 1: 2-morpholinoethyl dodecanoate

Base 2: tris(2-(methoxymethoxy)ethyl)amine-N-oxide

The organic solvents in Tables 8 and 9 were propylene glycol monomethyl ether acetate (PGMEA), ethyl lactate (EL), propylene glycol monomethyl ether (PGME), and cyclohexanone (CyHO). Each composition further contained 0.1 part by weight of a surfactant per 100 parts by weight of the polymer. The surfactant is 3-methyl-3-(2,2,2-trifluoro-ethoxymethyl)oxetane/tetrahydrofuran/2,2-dimethyl-1,3-propane diol copolymer having the following structural formula, commercially available from Omnova Solutions, Inc.

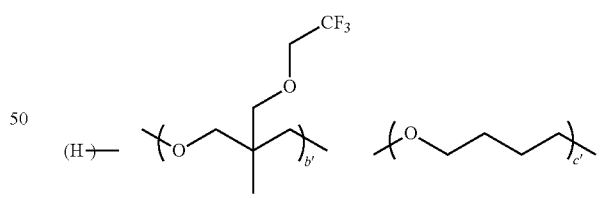

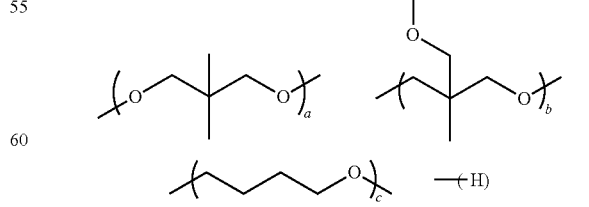

a : (b + b') : (c + c') = 1 : 4-7 : 0.01-1 (molar ratio)
Mw = 1,500

TABLE 8

|  |  | Resin (pbw) | Acid generator 1 (pbw) | Acid generator 2 (pbw) | Additive (pbw) | Solvent 1 (pbw) | Solvent 2 (pbw) | Solvent 3 (pbw) |
|---|---|---|---|---|---|---|---|---|
| Example | 1 | Polymer 1 (80) | PAG-A (8) | — | — | PGMEA (1,584) | EL (1,584) | PGME (2,112) |
|  | 2 | Polymer 1 (80) | PAG-A (8) | — | Base-1 (0.2) | PGMEA (1,584) | EL (1,584) | PGME (2,112) |
|  | 3 | Polymer 2 (80) | PAG-A (8) | — | — | PGMEA (1,584) | EL (1,584) | PGME (2,112) |
|  | 4 | Polymer 3 (80) | PAG-A (8) | — | — | PGMEA (1,584) | EL (1,584) | PGME (2,112) |
|  | 5 | Polymer 4 (80) | PAG-A (8) | — | — | PGMEA (1,584) | EL (1,584) | PGME (2,112) |
|  | 6 | Polymer 5 (80) | PAG-A (8) | — | — | PGMEA (1,584) | EL (1,584) | PGME (2,112) |
|  | 7 | Polymer 6 (80) | PAG-A (8) | — | — | PGMEA (1,584) | EL (1,584) | PGME (2,112) |
|  | 8 | Polymer 7 (80) | PAG-A (8) | — | — | PGMEA (1,584) | EL (1,584) | PGME (2,112) |
|  | 9 | Polymer 8 (80) | PAG-A (8) | — | — | PGMEA (1,584) | EL (1,584) | PGME (2,112) |
|  | 10 | Polymer 9 (80) | PAG-A (8) | — | — | PGMEA (1,584) | EL (1,584) | PGME (2,112) |
|  | 11 | Polymer 10 (80) | PAG-A (8) | — | — | PGMEA (1,584) | EL (1,584) | PGME (2,112) |
|  | 12 | Polymer 11 (80) | PAG-A (8) | — | — | PGMEA (1,584) | EL (1,584) | PGME (2,112) |
|  | 13 | Polymer K (80) | PAG-A (8) | Polymer 27 (15) | — | PGMEA (1,584) | EL (1,584) | PGME (2,112) |
|  | 14 | Polymer M (80) | PAG-A (8) | Polymer 27 (15) | — | PGMEA (1,584) | EL (1,584) | PGME (2,112) |
|  | 15 | Polymer K (80) | PAG-A (8) | Polymer 28 (15) | — | PGMEA (1,584) | EL (1,584) | PGME (2,112) |
|  | 16 | Polymer M (80) | PAG-A (8) | Polymer 28 (15) | — | PGMEA (1,584) | EL (1,584) | PGME (2,112) |
|  | 17 | Polymer M (80) | PAG-A (8) | Polymer 30 (7) | — | PGMEA (1,584) | EL (1,584) | PGME (2,112) |
|  | 18 | Polymer M (80) | PAG-A (8) | Polymer 31 (7) | — | PGMEA (1,584) | EL (1,584) | PGME (2,112) |
|  | 19 | Polymer M (80) | PAG-A (8) | Polymer 32 (7) | — | PGMEA (1,584) | EL (1,584) | PGME (2,112) |
|  | 20 | Polymer M (80) | PAG-A (8) | Polymer 33 (7) | — | PGMEA (1,584) | EL (1,584) | PGME (2,112) |
|  | 21 | Polymer M (80) | PAG-A (8) | Polymer 34 (7) | — | PGMEA (1,584) | EL (1,584) | PGME (2,112) |
|  | 22 | Polymer M (80) | PAG-A (8) | Polymer 35 (7) | — | PGMEA (1,584) | EL (1,584) | PGME (2,112) |
|  | 23 | Polymer M (80) | PAG-A (8) | Polymer 37 (3) | — | PGMEA (1,584) | EL (1,584) | PGME (2,112) |
|  | 24 | Polymer M (80) | PAG-A (8) | Polymer 38 (3) | — | PGMEA (1,584) | EL (1,584) | PGME (2,112) |
|  | 25 | Polymer M (80) | PAG-A (8) | Polymer 39 (1.1) | — | PGMEA (1,584) | EL (1,584) | PGME (2,112) |
|  | 26 | Polymer M (80) | PAG-A (8) | Polymer 40 (1.1) | — | PGMEA (1,584) | EL (1,584) | PGME (2,112) |
|  | 27 | Polymer P (80) | — | Polymer 39 (1.1) | — | PGMEA (1,584) | EL (1,584) | PGME (2,112) |
|  | 28 | Polymer M (80) | Polymer R (7) | Polymer 39 (1.1) | — | PGMEA (1,584) | EL (1,584) | PGME (2,112) |
| Comparative Example | 1 | Polymer K (80) | PAG-A (8) | — | Base-1 (0.7) | PGMEA (1,584) | EL (1,584) | PGME (2,112) |
|  | 2 | Polymer M (80) | PAG-A (8) | — | Base-1 (0.7) | PGMEA (1,584) | EL (1,584) | PGME (2,112) |

*pbw: parts by weight

TABLE 9

|  |  | Resin (pbw) | Acid generator 1 (pbw) | Acid generator 2 (pbw) | Additive (pbw) | Solvent 1 (pbw) | Solvent 2 (pbw) | Solvent 3 (pbw) |
|---|---|---|---|---|---|---|---|---|
| Example | 29 | Polymer 12 (80) | PAG-B (9.5) | — | — | PGMEA (1,400) | CyHO (600) | — |
|  | 30 | Polymer 12 (80) | PAG-B (9.5) | — | Base-2 (0.2) | PGMEA (1,400) | CyHO (600) | — |

TABLE 9-continued

|  |  | Resin (pbw) | Acid generator 1 (pbw) | Acid generator 2 (pbw) | Additive (pbw) | Solvent 1 (pbw) | Solvent 2 (pbw) | Solvent 3 (pbw) |
|---|---|---|---|---|---|---|---|---|
|  | 31 | Polymer 13 (80) | PAG-B (9.5) | — | — | PGMEA (1,400) | CyHO (600) | — |
|  | 32 | Polymer 14 (80) | PAG-B (9.5) | — | — | PGMEA (1,400) | CyHO (600) | — |
|  | 33 | Polymer 15 (80) | PAG-B (9.5) | — | — | PGMEA (1,400) | CyHO (600) | — |
|  | 34 | Polymer 16 (80) | PAG-B (9.5) | — | — | PGMEA (1,400) | CyHO (600) | — |
|  | 35 | Polymer 17 (80) | PAG-B (9.5) | — | — | PGMEA (1,400) | CyHO (600) | — |
|  | 36 | Polymer 18 (80) | PAG-B (9.5) | — | — | PGMEA (1,400) | CyHO (600) | — |
|  | 37 | Polymer 19 (80) | PAG-B (9.5) | — | — | PGMEA (1,400) | CyHO (600) | — |
|  | 38 | Polymer 20 (80) | PAG-B (9.5) | — | — | PGMEA (1,400) | CyHO (600) | — |
|  | 39 | Polymer 21 (80) | PAG-B (9.5) | — | — | PGMEA (1,400) | CyHO (600) | — |
|  | 40 | Polymer 22 (80) | PAG-B (9.5) | — | — | PGMEA (1,400) | CyHO (600) | — |
|  | 41 | Polymer 23 (80) | PAG-B (9.5) | — | — | PGMEA (1,400) | CyHO (600) | — |
|  | 42 | Polymer 24 (80) | PAG-B (9.5) | — | — | PGMEA (1,400) | CyHO (600) | — |
|  | 43 | Polymer 25 (80) | PAG-B (9.5) | — | — | PGMEA (1,400) | CyHO (600) | — |
|  | 44 | Polymer 26 (80) | PAG-B (9.5) | — | — | PGMEA (1,400) | CyHO (600) | — |
|  | 45 | Polymer N (80) | PAG-B (9.5) | Polymer 29 (15) | — | PGMEA (1,400) | CyHO (600) | — |
|  | 46 | Polymer N (80) | PAG-B (9.5) | Polymer 36 (7) | — | PGMEA (1,400) | CyHO (600) | — |
|  | 47 | Polymer N (80) | PAG-B (9.5) | Polymer 41 (3) | — | PGMEA (1,400) | CyHO (600) | — |
|  | 48 | Polymer N (80) | PAG-B (9.5) | Polymer 42 (1.1) | — | PGMEA (1,400) | CyHO (600) | — |
|  | 49 | Polymer Q (80) | — | Polymer 42 (1.1) | — | PGMEA (1,400) | CyHO (600) | — |
|  | 50 | Polymer N (80) | Polymer Q (8) | Polymer 42 (1.1) | — | PGMEA (1,400) | CyHO (600) | — |
| Comparative Example | 3 | Polymer N (80) | PAG-B (9.5) | — | Base-2 (1.5) | PGMEA (1,400) | CyHO (600) | — |

*pbw: parts by weight

Evaluation of Resolution, Exposure Latitude, and LER on ArF Lithography

On a silicon substrate, an antireflective coating solution (ARC-29A, Nissan Chemical Co., Ltd.) was coated and baked at 200° C. for 60 seconds to form an ARC of 78 nm thick. Each of inventive resist compositions (Examples 29 to 50) and comparative resist composition (Comparative Example 3) was spin coated on the silicon substrate and baked on a hot plate for 60 seconds, forming a resist film of 100 nm thick. The wafer was exposed by means of an ArF excimer laser scanner (NSR-S307E by Nikon Corp., NA 0.85, 4/5 annular illumination, 6% halftone phase shift mask), baked (PEB) at 100° C. for 60 seconds, and developed with a 2.38 wt % tetramethylammonium hydroxide aqueous solution for 60 seconds, forming a pattern.

For resist evaluation, the optimum exposure (Eop) was defined as the exposure dose (mJ/cm$^2$) which provided a 1:1 resolution at the top and bottom of a 80-nm grouped line-and-space pattern. The maximum resolution of the resist was defined as the minimum line width (nm) of a line-and-space pattern that was resolved and separated at the optimum exposure. For the evaluation of exposure latitude, an exposure dose tolerance which provided a pattern size of 80 nm±10% when the exposure dose was changed from the optimum was determined, and the tolerance value was divided by the optimum dose and expressed in percent. A greater value indicates a smaller performance change with a change of exposure dose, that is, better exposure latitude. The line edge roughness (LER) of a 80-nm line-and-space pattern was measured using measurement SEM (S-9380 by Hitachi Hitechnologies, Ltd.). The test results of the resist compositions are shown in Table 10.

TABLE 10

|  |  | Eop (mJ/cm$^2$) | Maximum resolution (nm) | Exposure latitude (%) | LER (nm) |
|---|---|---|---|---|---|
| Example | 29 | 30 | 70 | 16 | 5.0 |
|  | 30 | 31 | 75 | 15 | 4.8 |
|  | 31 | 30 | 70 | 15 | 5.1 |
|  | 32 | 31 | 70 | 16 | 4.9 |
|  | 33 | 31 | 70 | 17 | 4.8 |
|  | 34 | 28 | 75 | 18 | 5.1 |
|  | 35 | 30 | 70 | 15 | 5.2 |
|  | 36 | 29 | 75 | 14 | 4.8 |
|  | 37 | 28 | 70 | 16 | 5.1 |
|  | 38 | 31 | 70 | 16 | 4.9 |
|  | 39 | 31 | 75 | 15 | 4.8 |
|  | 40 | 32 | 70 | 17 | 5.0 |
|  | 41 | 31 | 75 | 17 | 4.6 |
|  | 42 | 29 | 70 | 17 | 5.1 |

TABLE 10-continued

|  | | Eop (mJ/cm$^2$) | Maximum resolution (nm) | Exposure latitude (%) | LER (nm) |
|---|---|---|---|---|---|
| | 43 | 28 | 75 | 17 | 4.9 |
| | 44 | 30 | 70 | 16 | 4.7 |
| | 45 | 30 | 70 | 17 | 4.7 |
| | 46 | 30 | 75 | 17 | 5.1 |
| | 47 | 29 | 70 | 15 | 4.9 |
| | 48 | 28 | 70 | 15 | 4.8 |
| | 49 | 31 | 75 | 14 | 4.9 |
| | 50 | 31 | 70 | 14 | 4.8 |
| Comparative Example | 3 | 30 | 80 | 5 | 6.7 |

The data of Examples in Table 10 demonstrate that the inventive resist compositions exhibit good resolution performance, good exposure latitude and low LER values when processed by ArF excimer laser lithography.

Evaluation of Resolution, Exposure Latitude, and LER on EB Image Writing

Using a coater/developer system Clean Track ACT-M (Tokyo Electron Ltd.), each of the resist compositions (Examples 1 to 28) and comparative resist compositions (Comparative Examples 1 and 2) was spin-coated onto a 152-mm square mask blank having a chromium oxynitride film at the outermost surface and pre-baked on a hot plate at 110° C. for 600 seconds to form a resist film of 60 nm thick. The thickness of the resist film was measured by an optical film thickness measurement system Nanospec (Nanometrics Inc.). Measurement was made at 81 points in the plane of the blank substrate excluding a peripheral band extending 10 mm inward from the blank periphery, and an average film thickness and a film thickness range were computed therefrom.

The coated mask blanks were exposed to electron beam using an EB writer system EBM-5000Plus (NuFlare Technology Inc., accelerating voltage 50 keV), then baked (PEB) at 110° C. for 600 seconds, and developed with a 2.38 wt % tetramethylammonium hydroxide aqueous solution, thereby yielding positive patterns.

The patterned wafer was observed under a top-down scanning electron microscope (TDSEM). The optimum exposure (Eop) was defined as the exposure dose (μC/cm$^2$) which provided a 1:1 resolution at the top and bottom of a 200-nm 1:1 line-and-space pattern. The maximum resolution of the resist was defined as the minimum line width of a line-and-space pattern that could be resolved and separated at the optimum exposure. The LER of a 100-nm line-and-space pattern was measured under SEM. On observation in cross section of the resist pattern under SEM, it was visually judged whether or not the pattern profile was rectangular. Table 11 tabulates the test results of the inventive and comparative resist compositions on EB image writing.

TABLE 11

|  | | Eop (μC/cm$^2$) | Maximum resolution (nm) | LER (nm) | Pattern profile |
|---|---|---|---|---|---|
| Example | 1 | 24 | 40 | 4.5 | rectangular |
| | 2 | 24 | 40 | 4.5 | rectangular |
| | 3 | 24 | 45 | 4.7 | rectangular |
| | 4 | 25 | 40 | 4.2 | rectangular |
| | 5 | 24 | 40 | 4.6 | rectangular |
| | 6 | 26 | 40 | 4.7 | rectangular |
| | 7 | 23 | 35 | 4.9 | rectangular |
| | 8 | 24 | 40 | 4.2 | rectangular |
| | 9 | 23 | 40 | 4.2 | rectangular |
| | 10 | 24 | 40 | 4.2 | rectangular |
| | 11 | 23 | 35 | 4.8 | rectangular |
| | 12 | 22 | 40 | 4.6 | rectangular |
| | 13 | 25 | 35 | 4.4 | rectangular |
| | 14 | 23 | 40 | 4.7 | rectangular |
| | 15 | 24 | 40 | 4.9 | rectangular |
| | 16 | 26 | 45 | 4.7 | rectangular |
| | 17 | 25 | 40 | 4.6 | rectangular |
| | 18 | 23 | 40 | 4.4 | rectangular |
| | 19 | 25 | 40 | 4.6 | rectangular |
| | 20 | 25 | 45 | 4.7 | rectangular |
| | 21 | 22 | 40 | 4.5 | rectangular |
| | 22 | 23 | 40 | 4.7 | rectangular |
| | 23 | 24 | 40 | 4.8 | rectangular |
| | 24 | 23 | 45 | 4.6 | rectangular |
| | 25 | 23 | 45 | 4.5 | rectangular |
| | 26 | 23 | 40 | 4.8 | rectangular |
| | 27 | 26 | 45 | 4.9 | rectangular |
| | 28 | 24 | 40 | 4.6 | rectangular |
| Comparative Example | 1 | 25 | 55 | 6.7 | rounded top |
| | 2 | 25 | 55 | 6.6 | rounded top + reverse taper |

It is evident from Table 11 that the resist compositions of Examples are improved in resolution and LER over those of Comparative Examples 1 and 2 when processed by EB lithography. The chemically amplified positive resist composition of the invention is suited as ultrafine pattern-forming material for VLSI fabrication and mask pattern-forming material by EB lithography.

Japanese Patent Application No. 2010-041480 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer comprising recurring units of a fluorinated carboxylic acid onium salt having the general formula (1):

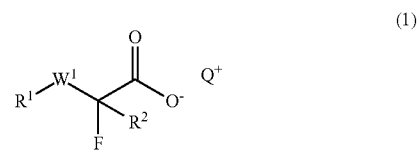

(1)

wherein $R^1$ is a structure derived from a basis skeleton capable of providing the polymerization activity of a polymerizable monomer, represented by any one of the formulae:

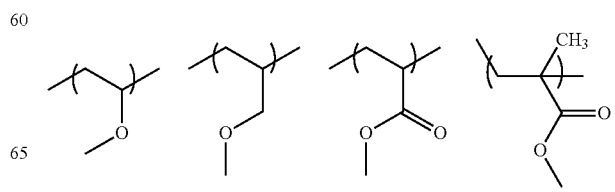

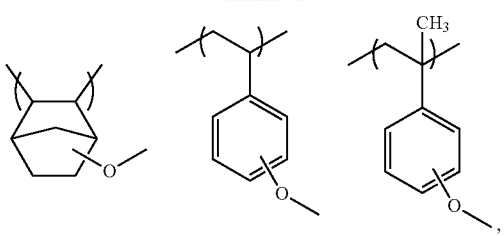

wherein the valence bond extending from the oxygen atom in the structure designates a bond to $W^1$, $R^2$ is fluorine or a fluoroalkyl group, $W^1$ is a divalent organic group, and $Q^+$ is a sulfonium cation of the general formula (a) or (b) or a iodonium cation selected from bis(4-methylphenyl) iodonium, bis(4-ethylphenyl) iodonium, bis(4-tert-butylphenyl) iodonium, bis(4-(1,1-dimethylpropyl)phenyl)iodonium, (4-methoxyphenyl) phenyliodonium, (4-tert-butoxyphenyl)phenyliodonium, (4-acryloyloxyphenyl) phenyliodonium, and (4-methacryloyloxyphenyl)phenyliodonium:

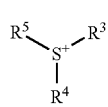 (a)

wherein $R^3$, $R^4$ and $R^5$ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^3$, $R^4$ and $R^5$ may bond together to form a ring with the sulfur atom,

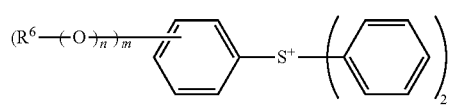 (b)

wherein $R^6$ is a substituted or unsubstituted, straight, branched or cyclic $C_1$-$C_{20}$ alkyl or alkenyl group or a substituted or unsubstituted $C_6$-$C_{14}$ aryl group, m is an integer of 1 to 5, n is 0 or 1, $R^6$ may have a carbonyl group, hydroxyl group, ester structure, lactone structure, amino group, amide group or ether-bonding oxygen atom substituted thereon

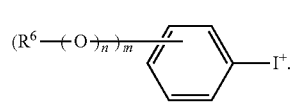 (c)

2. The polymer of claim 1 wherein the recurring units of a fluorinated carboxylic acid onium salt having the general formula (1) are recurring units of a fluorinated carboxylic acid onium salt having the general formula (2):

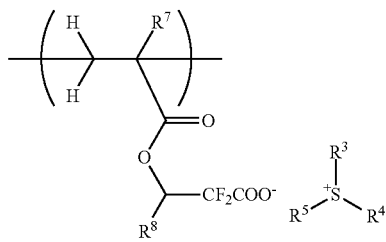 (2)

wherein $R^7$ is hydrogen or methyl, $R^8$ is hydrogen or $C_1$-$C_6$ alkyl, $R^3$, $R^4$ and $R^5$ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^3$, $R^4$ and $R^5$ may bond together to form a ring with the sulfur atom, the polymer having a weight average molecular weight of 1,000 to 50,000.

3. The polymer of claim 2 wherein the fluorinated carboxylic acid onium salt having the general formula (2) is triphenylsulfonium 2,2-difluoro-3-methacryloyloxypentanoate having the following formula:

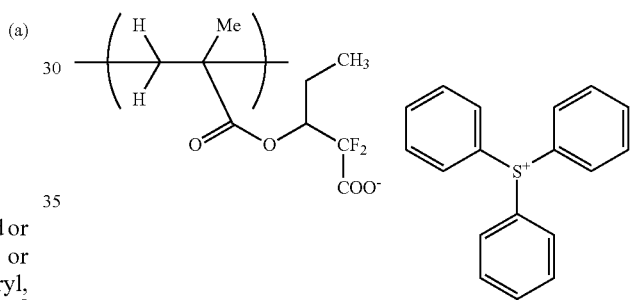

wherein Me stands for methyl.

4. The polymer of claim 1, further comprising units of at least one type having a sufficient polarity to impart adhesive property to the polymer, selected from the general formulae (3) to (7):

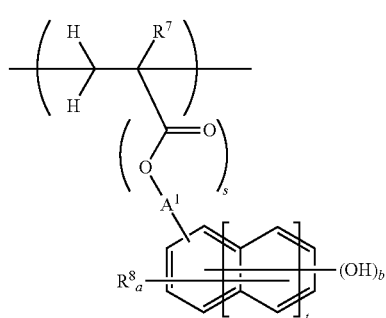 (3)

wherein $R^7$ is hydrogen or methyl, $A^1$ is a single bond or a $C_1$-$C_{10}$ alkylene group which may be separated by an ether bond, $R^8$ is each independently hydrogen or $C_1$-$C_6$ alkyl, a is an integer of 0 to 4, b is an integer of 1 to 5, s is 0 or 1, and t is an integer of 0 to 2;

(4)

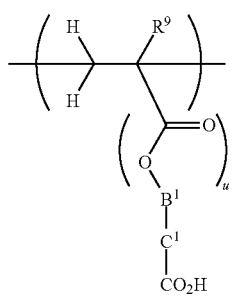

wherein $R^9$ is hydrogen, methyl or carboxymethyl, $B^1$ is a single bond or an alkylene group which may be separated by an ether bond, $C^1$ is a single bond or a $C_1$-$C_{14}$ divalent aromatic ring or divalent alicyclic structure, u is 0 or 1, with the proviso that $B^1$ and $C^1$ are not single bonds at the same time when u is 1 and that $C^1$ is a single bond or a divalent aromatic ring when u is 0 and $B^1$ is a single bond, (5)

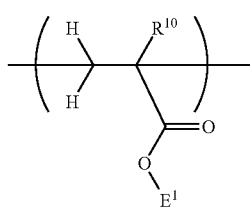

wherein $R^{10}$ is hydrogen or methyl, and $E^1$ is a $C_1$-$C_{15}$ fluoroalcohol-containing substituent group;

(6)

(7)

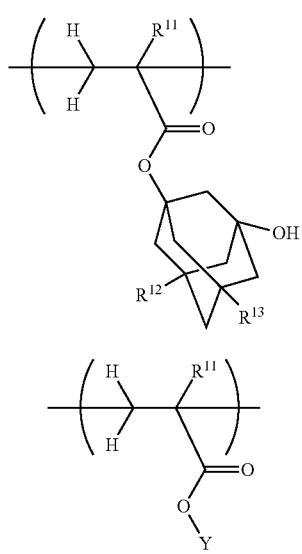

wherein $R^{11}$ is hydrogen or methyl, $R^{12}$ and $R^{13}$ are hydrogen or hydroxyl, and Y is a lactone-containing substituent group.

5. The polymer of claim 1, further comprising recurring units having an acidic functional group so that the polymer may be soluble in an aqueous alkaline developer.

6. The polymer of claim 1, further comprising recurring units having an acidic functional group protected with a protective group which may be deprotected with an acid catalyst, the polymer being insoluble in an aqueous alkaline developer, but turning soluble therein when the protective group is deprotected with an acid catalyst.

7. The polymer of claim 6 wherein said recurring units having an acidic functional group protected with a protective group which may be deprotected with an acid catalyst have the general formula (8):

(8)

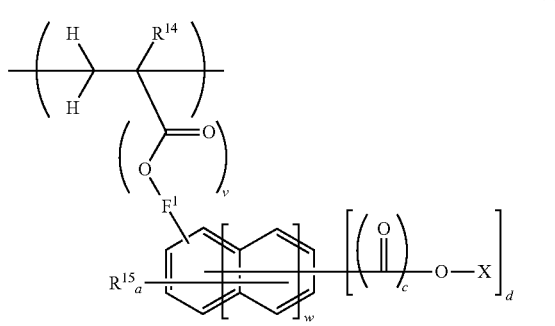

wherein $F^1$ is a single bond or a $C_1$-$C_{10}$ alkylene group which may contain an ethereal oxygen atom, $R^{14}$ is hydrogen or methyl, $R^{15}$ is each independently hydrogen or $C_1$-$C_6$ alkyl, X is an acid labile group when d is 1, X is hydrogen or an acid labile group, at least one X being an acid labile group, when d is 2 or 3, a is an integer of 0 to 4, c is 0 or 1, d is an integer of 1 to 3, v is 0 or 1, and w is an integer of 0 to 2.

8. The polymer of claim 6 wherein said recurring units having an acidic functional group protected with a protective group which may be deprotected with an acid catalyst have the general formula (12):

(12)

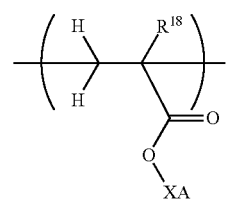

wherein $R^{18}$ is hydrogen, fluorine, methyl or trifluoromethyl, and XA is an acid labile group.

9. A chemically amplified positive resist composition comprising the polymer of claim 5.

10. The composition of claim 9, further comprising an acid generator capable of generating a sulfonic acid compound upon exposure to high-energy radiation.

11. A process for forming a pattern, comprising the steps of applying the chemically amplified positive resist composition of claim 9 onto a processable substrate to form a resist film, exposing the resist film to a pattern of high-energy radiation, and developing the exposed resist film with an alkaline developer to form a resist pattern.

12. The process of claim 11 wherein the processable substrate is a photomask blank.

* * * * *